US012652849B2

(12) United States Patent
Xie et al.

(10) Patent No.: US 12,652,849 B2
(45) Date of Patent: Jun. 9, 2026

(54) BACKSIDE CONTACTS FOR STACKED TRANSISTOR STRUCTURES WITH SHIFTED CHANNELS

(71) Applicant: International Business Machines Corporation, Armonk, NY (US)

(72) Inventors: Ruilong Xie, Niskayuna, NY (US); Shay Reboh, Guilderland, NY (US); Tenko Yamashita, Schenectady, NY (US); Kisik Choi, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 403 days.

(21) Appl. No.: 18/391,890

(22) Filed: Dec. 21, 2023

(65) Prior Publication Data
US 2025/0212483 A1     Jun. 26, 2025

(51) Int. Cl.
H10D 64/23          (2025.01)
H10D 30/43          (2025.01)
          (Continued)

(52) U.S. Cl.
CPC ........... H10D 64/254 (2025.01); H10D 30/43 (2025.01); H10D 30/6735 (2025.01);
          (Continued)

(58) Field of Classification Search
CPC .. H10D 64/254; H10D 30/43; H10D 30/6735; H10D 30/6757; H10D 62/121;
          (Continued)

(56) References Cited

U.S. PATENT DOCUMENTS

| 10,192,819 B1 | 1/2019 | Chanemougame et al. |
| 10,192,867 B1 | 1/2019 | Frougier et al. |
| (Continued) | | |

FOREIGN PATENT DOCUMENTS

| CN | 116435306 A | 7/2023 |
| WO | 2025/133722 A1 | 6/2025 |
| WO | 2025/133723 A1 | 6/2025 |

OTHER PUBLICATIONS

International Searching Authority, "Notification of Transmittal of the International Search Report and the Written Opinion of the International Searching Authority, or Declaration," Patent Cooperation Treaty, Jan. 2, 2025, 19 pages, International Application No. PCT/IB2024/057080.

(Continued)

*Primary Examiner* — Wasiul Haider
(74) *Attorney, Agent, or Firm* — Kristofer Haggerty; Ryan, Mason & Lewis, LLP

(57)          ABSTRACT

A semiconductor structure includes a first transistor including a first set of one or more channels, a second transistor vertically stacked over the first transistor, the second transistor including a second set of one or more channels, the second set of channels of the second transistor being horizontally offset from the first set of channels of the first transistor. The semiconductor structure also includes a power plane at a first side of the semiconductor structure, and a contact extending from the first side of the semiconductor structure, through the power plane, to a source/drain region of the second transistor.

25 Claims, 41 Drawing Sheets

(51) Int. Cl.
H10D 30/67 (2025.01)
H10D 62/10 (2025.01)
H10D 84/85 (2025.01)

(52) U.S. Cl.
CPC ....... H10D 30/6757 (2025.01); H10D 62/121 (2025.01); H10D 84/85 (2025.01)

(58) Field of Classification Search
CPC ...... H10D 30/014; H10D 84/85; H10D 84/83; H10D 84/8311; H10D 88/00; H10D 84/0149; H10D 84/0151; H10D 88/01; H10D 84/038
See application file for complete search history.

(56) References Cited

U.S. PATENT DOCUMENTS

| | | | |
|---|---|---|---|
| 10,510,622 B1 | 12/2019 | Frougier et al. | |
| 10,868,193 B2 | 12/2020 | Sengupta et al. | |
| 2018/0061766 A1 | 3/2018 | Goktepeli | |
| 2020/0294998 A1 | 9/2020 | Lilak et al. | |
| 2022/0115372 A1 | 4/2022 | Lilak et al. | |
| 2023/0037833 A1 | 2/2023 | Hong et al. | |
| 2023/0116288 A1 | 4/2023 | Kim | |
| 2023/0170352 A1 | 6/2023 | Bao et al. | |
| 2023/0178619 A1 | 6/2023 | Chu et al. | |
| 2023/0369217 A1 | 11/2023 | Xie et al. | |
| 2024/0355879 A1* | 10/2024 | Song | H10D 62/121 |
| 2024/0429102 A1* | 12/2024 | Loh | H10D 30/43 |
| 2025/0212508 A1 | 6/2025 | Reboh et al. | |

OTHER PUBLICATIONS

International Searching Authority, "Notification of Transmittal of the International Search Report and the Written Opinion of the International Searching Authority, or Declaration," Patent Cooperation Treaty, Jan. 7, 2025, 20 pages, International Application No. PCT/IB2024/057081.

J. Ryckaert et al., "The Complementary FET (CFET) for CMOS Scaling Beyond N3," Symposium on VLSI Technology, Jun. 2018, pp. 141-142.

P. Schuddinck et al., "PPAC of Sheet-Based CFET Configurations for 4 Track Design with 16nm Metal Pitch," Symposium on VLSI Technology & Circuits Digest of Technical Papers, Jun. 2022, pp. 365-366.

D. Draper, "Breakthroughs in 3D Stacked FinFETS and 3D Sequential Integration," https://www.3dincites.com/2019/01/breakthroughs-in-3d-stacked-finfets-and-3d-sequential-integration/, Jan. 28, 2019, 7 pages.

T. Song, "Many-Tier Vertical Gaafet (V-FET) for Ultra-Miniaturized Standard Cell Designs Beyond 5 nm," IEEE Access, Aug. 10, 2020, pp. 149984-149998, vol. 8.

P. Alcorn, "Imec Reveals Sub-1nm Transistor Roadmap, 3D-Stacked CMOS 2.0 Plans," https://www.tomshardware.com/news/imec-reveals-sub-1nm-transistor-roadmap-3d-stacked-cmos-20-plans, May 26, 2023, 5 pages.

S. Ye et al., "Ultimate Vertical Gate-all-around metal-oxide-semiconductor Field-effect Transistor and its Three-dimensional Integrated Circuits," Materials Science in Semiconductor Processing, Nov. 2021, 10 pages, vol. 134.

N.Horiguchi et al., "Imec Puts Complementary FET (CFET) on the Logic Technology Roadmap," https://www.imec-int.com/en/articles/imec-puts-complementary-fet-cfet-logic-technology-roadmap, Jun. 16, 2022, 16 pages.

List of IBM Patents or Patent Applications Treated as Related.

* cited by examiner

INTEGRATED CIRCUIT
2100

STACKED TRANSISTOR
STRUCTURES WITH SHIFTED
CHANNELS AND BACKSIDE
CONTACTS
2110

BACKSIDE CONTACTS FOR STACKED TRANSISTOR STRUCTURES WITH SHIFTED CHANNELS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

A field-effect transistor (FET) is a three-terminal device having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the area of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm node and beyond. A general process flow for formation of a nanosheet stack involves removing sacrificial layers, which may be formed of Silicon Germanium (SiGe), between sheets of channel material, which may be formed of Silicon (Si).

For continued scaling and area improvement, stacked transistor structures may be used. A stacked transistor structure may include multiple transistors stacked over one another vertically. With stacked transistor structures, for example, vias which extend between the frontside and the backside may have a high aspect ratio. The formation of high aspect ratio vias, however, presents various process challenges.

SUMMARY

Embodiments of the invention provide techniques for forming backside contacts for stacked transistor structures where channels for top and bottom transistor devices in the stacked transistor structures are shifted relative to one another within cell boundaries.

In one embodiment, a semiconductor structure comprises a first transistor comprising a first set of one or more channels, a second transistor vertically stacked over the first transistor, the second transistor comprising a second set of one or more channels, the second set of channels of the second transistor being horizontally offset from the first set of channels of the first transistor, a power plane at a first side of the semiconductor structure, and a contact extending from the first side of the semiconductor structure, through the power plane, to a source/drain region of the second transistor.

The semiconductor structure advantageously enables improved contact formation for the first and second transistors, reducing the risk of electrical shorting of contacts to source/drain regions, gates and between power rails.

In another exemplary embodiment, as may be combined with the preceding paragraphs, the power plane is disposed in an interlayer dielectric layer at the first side of the semiconductor structure, the contact extending through the interlayer dielectric layer. The contact may further extend through shallow trench isolation regions, another interlayer dielectric layer surrounding source/drain regions for the first transistor, and a bonding oxide disposed between the first transistor and the second transistor.

In another exemplary embodiment, as may be combined with the preceding paragraphs, the semiconductor structure also includes a dielectric liner on at least a portion of sidewalls of the contact, the dielectric liner isolating the contact from the power plane.

In another exemplary embodiment, as may be combined with the preceding paragraphs, the contact at least partially wraps around the source/drain region of the second transistor.

In another exemplary embodiment, as may be combined with the preceding paragraphs, the contact abuts an additional contact to a source/drain region of the first transistor, and the semiconductor structure further includes a dielectric liner isolating the contact from the additional contact. The semiconductor structure may further include a first silicide liner disposed between the contact and the source/drain region of the second transistor and a second silicide liner disposed between the additional contact and the source/drain region of the first transistor, the second silicide liner comprising a different silicide material than the first silicide liner.

In another exemplary embodiment, as may be combined with the preceding paragraphs, the semiconductor structure further comprises a gate isolation layer surrounding a gate stack of the first transistor, the gate isolation layer comprising a different dielectric material than a gate spacer for the gate stack of the first transistor and an interlayer dielectric layer surrounding source/drain regions of the first transistor.

In another embodiment, a semiconductor structure comprises a first transistor comprising a first set of one or more channels, a second transistor vertically stacked over the first transistor, the second transistor comprising a second set of one or more channels, the second set of channels of the second transistor being horizontally offset from the first set of channels of the first transistor, a first backside contact to a source/drain region of the first transistor, a second backside contact to a source/drain region of the second transistor, and a dielectric liner separating the second backside contact from the first backside contact and the source/drain region of the first transistor.

The semiconductor structure advantageously enables improved contact formation for the first and second transistors, reducing the risk of electrical shorting between the first and second backside contacts, as well as reducing the risk of electrical shorting to gates and between power rails.

In another exemplary embodiment, as may be combined with the preceding paragraphs, the second backside contact extends through a backside power plane connected to the first backside contact, the source/drain region of the first transistor, an interlayer dielectric layer surrounding the source/drain region of the first transistor, and a bonding oxide disposed between the first transistor and the second transistor.

In another exemplary embodiment, as may be combined with the preceding paragraphs, the semiconductor structure further comprises a first silicide liner disposed between the first backside contact and the source/drain region of the first transistor and a second silicide liner disposed between the second backside contact and the source/drain region of the second transistor, the second silicide liner being a different silicide material than the first silicide liner.

In another exemplary embodiment, as may be combined with the preceding paragraphs, the second backside contact at least partially wraps around the source/drain region of the second transistor.

In another exemplary embodiment, as may be combined with the preceding paragraphs, the semiconductor structure further comprises a gate isolation layer surrounding a gate stack of the first transistor, the gate isolation layer comprising a different dielectric material than a gate spacer for the gate stack of the first transistor and an interlayer dielectric layer surrounding the source/drain region of the first transistor.

In another embodiment, a stacked transistor structure comprises a first transistor comprising a first set of one or more channels, a second transistor vertically stacked over the first transistor, the second transistor comprising a second set of one or more channels, the second set of channels of the second transistor being horizontally offset from the first set of channels of the first transistor, a first backside contact to a source/drain region of the first transistor, and a second backside contact to a source/drain region of the second transistor, the second backside contact being self-aligned to the first backside contact and the source/drain region of the first transistor.

The stacked transistor structure advantageously enables improved contact formation for the first and second transistors, reducing the risk of electrical shorting between the first and second backside contacts, as well as reducing the risk of electrical shorting to gates and between power rails.

In another exemplary embodiment, as may be combined with the preceding paragraphs, the second backside contact is further self-aligned to a gate region shared by the first transistor and the second transistor.

In another exemplary embodiment, as may be combined with the preceding paragraphs, the second backside contact at least partially wraps around the source/drain region of the second transistor.

In another exemplary embodiment, as may be combined with the preceding paragraphs, the second backside contact is disposed through a backside interlayer dielectric layer, a backside power plane connected to the first backside contact disposed in the backside interlayer dielectric layer, another interlayer dielectric layer surrounding the source/drain region of the first transistor, and a bonding oxide disposed between the first transistor and the second transistor.

In another embodiment, a complementary field-effect transistor structure comprises a complementary field-effect transistor cell comprising a first transistor and a second transistor stacked vertically over the first transistor, wherein a first set of one or more channels of the first transistor are horizontally offset, within the complementary field-effect transistor cell, from a second set of one or more channels of the second transistor, a first backside contact to a source/drain region of the first transistor, and a second backside contact to a source/drain region of the second transistor, the second backside contact being self-aligned to the first backside contact and the source/drain region of the first transistor.

The complementary field-effect transistor structure advantageously enables improved contact formation for the first and second transistors, reducing the risk of electrical shorting between the first and second backside contacts, as well as reducing the risk of electrical shorting to gates and between power rails.

In another exemplary embodiment, as may be combined with the preceding paragraphs, the second backside contact is further self-aligned to a gate region shared by the first transistor and the second transistor.

In another exemplary embodiment, as may be combined with the preceding paragraphs, the second backside contact at least partially wraps around the source/drain region of the second transistor.

In another exemplary embodiment, as may be combined with the preceding paragraphs, the second backside contact is disposed through a backside interlayer dielectric layer, a backside power plane connected to the first backside contact disposed in the backside interlayer dielectric layer, another interlayer dielectric layer surrounding the source/drain region of the first transistor, and a bonding oxide disposed between the first transistor and the second transistor.

In another embodiment, an integrated circuit comprises a stacked transistor structure comprising a first transistor comprising a first set of one or more channels, a second transistor vertically stacked over the first transistor, the second transistor comprising a second set of one or more channels, the second set of channels of the second transistor being horizontally offset from the first set of channels of the first transistor, a first backside contact to a source/drain region of the first transistor, and a second backside contact to a source/drain region of the second transistor, the second backside contact being self-aligned to the first backside contact and the source/drain region of the first transistor.

The integrated circuit advantageously enables improved contact formation for the first and second transistors in the stacked transistor structure, reducing the risk of electrical shorting between the first and second backside contacts, as well as reducing the risk of electrical shorting to gates and between power rails.

In another exemplary embodiment, as may be combined with the preceding paragraphs, the second backside contact is further self-aligned to a gate region shared by the first transistor and the second transistor.

In another exemplary embodiment, as may be combined with the preceding paragraphs, the second backside contact at least partially wraps around the source/drain region of the second transistor.

In another exemplary embodiment, as may be combined with the preceding paragraphs, the second backside contact is disposed through a backside interlayer dielectric layer, a backside power plane connected to the first backside contact disposed in the backside interlayer dielectric layer, another interlayer dielectric layer surrounding the source/drain region of the first transistor, and a bonding oxide disposed between the first transistor and the second transistor.

Figure 18B:
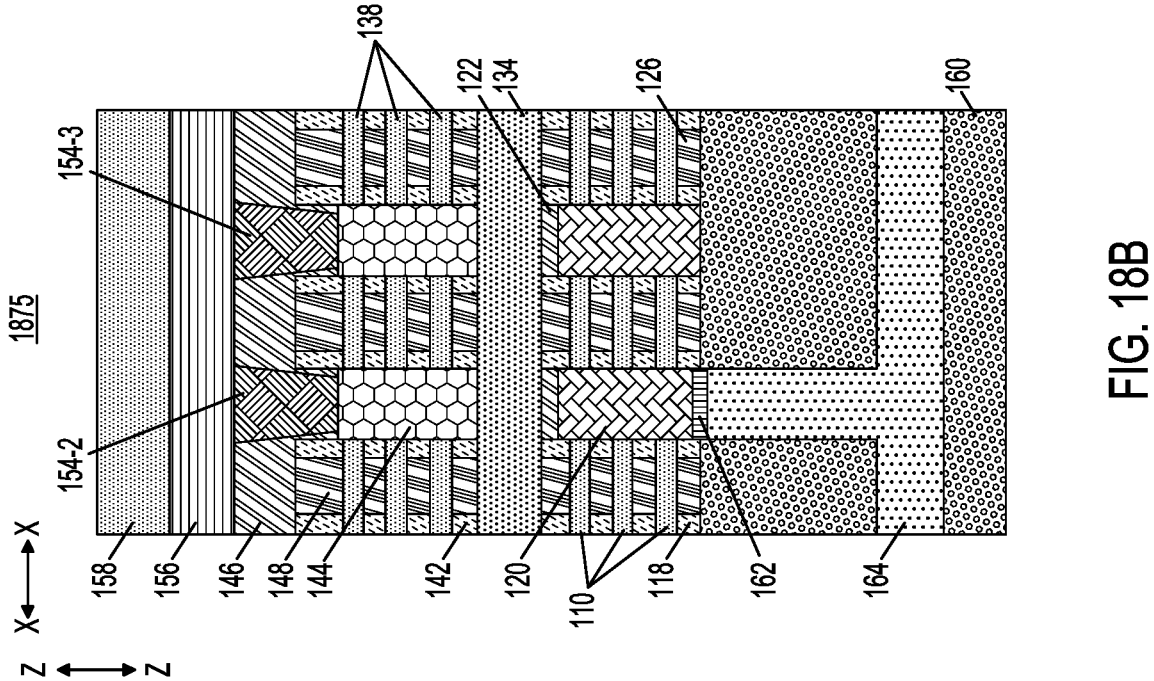
FIG. 18B depicts a second cross-sectional view of the structure of FIGS. 17A-17D following the formation of the inner spacers on the sidewalls of the vias through the backside interlayer dielectric layer, the removal of the exposed backside contact placeholder layers, and the etching through the bonding oxide layer to expose the bottom surfaces of source/drain regions of the top transistors of the stacked transistor structure, according to an embodiment of the invention.
Figure 18A:
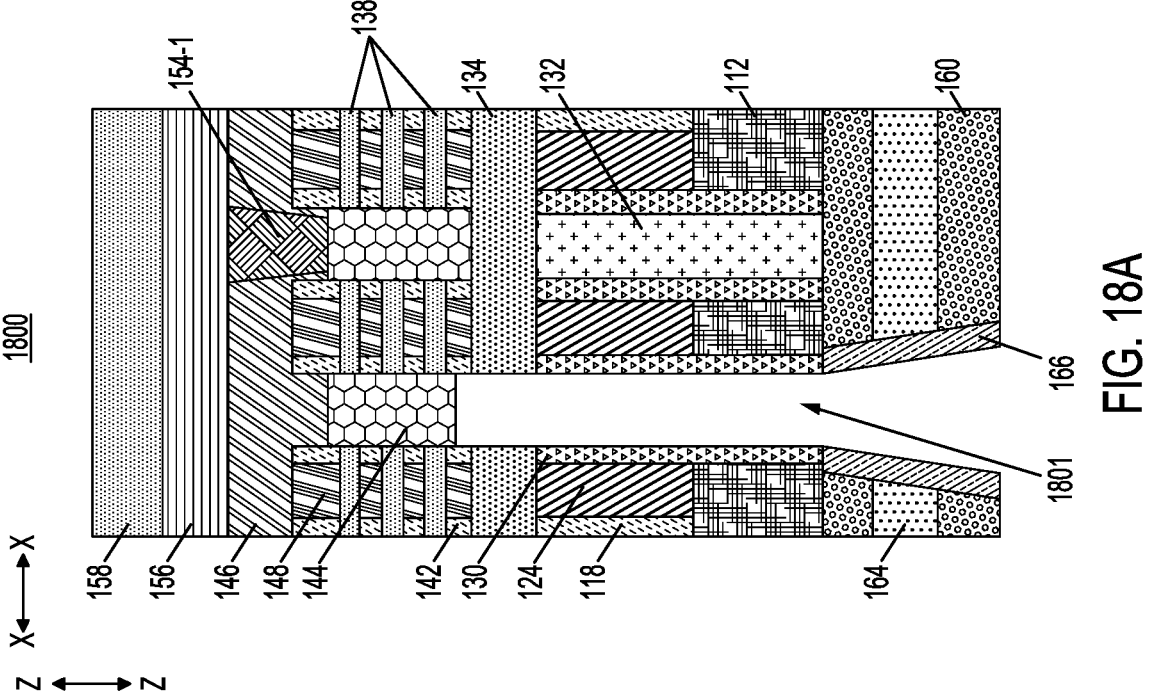
FIG. 18A depicts a first cross-sectional view of the structure of FIGS. 17A-17D following formation of inner spacers on sidewalls of the vias through the backside interlayer dielectric layer, removal of the exposed backside contact placeholder layers, and etching through the bonding oxide layer to expose bottom surfaces of source/drain regions of the top transistors of the stacked transistor structure, according to an embodiment of the invention.
Figure 18D:
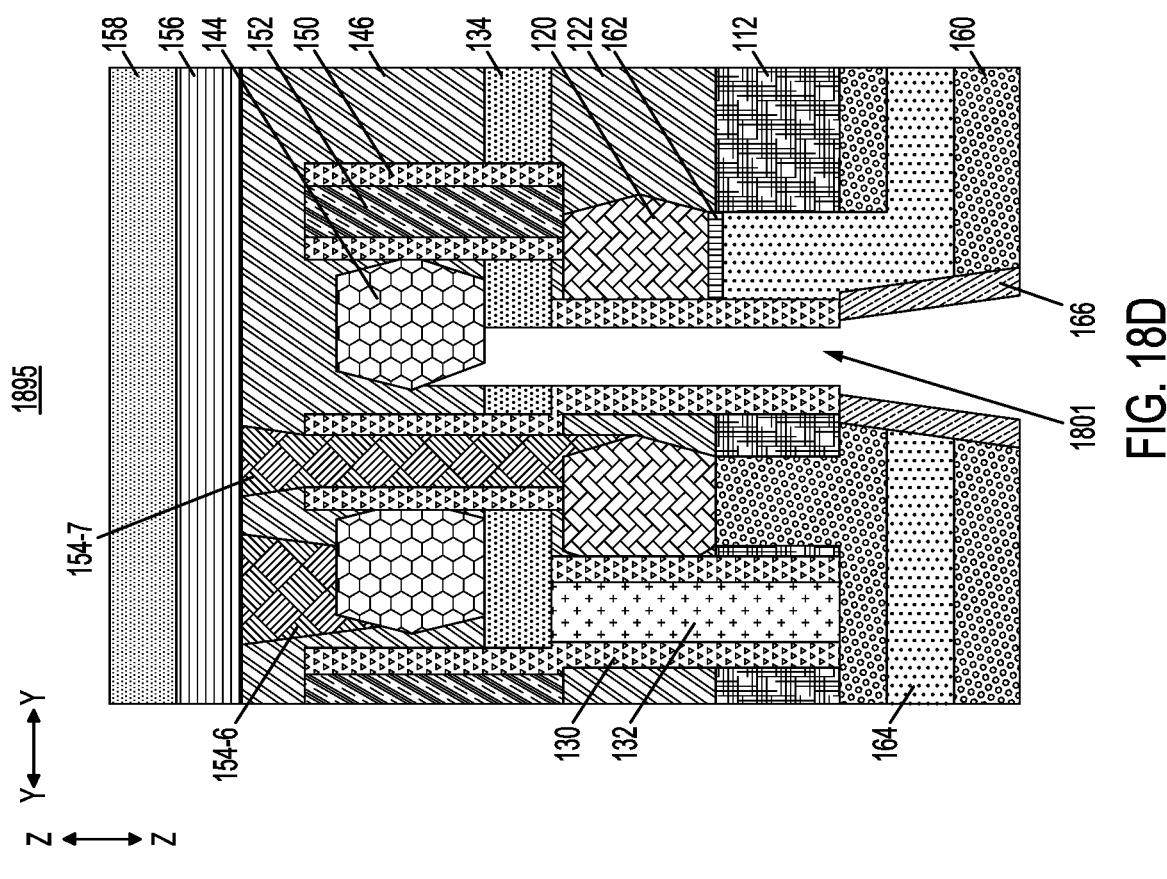
FIG. 18D depicts a fourth cross-sectional view of the structure of FIGS. 17A-17D following the formation of the inner spacers on the sidewalls of the vias through the backside interlayer dielectric layer, the removal of the exposed backside contact placeholder layers, and the etching through the bonding oxide layer to expose the bottom surfaces of source/drain regions of the top transistors of the stacked transistor structure, according to an embodiment of the invention.
Figure 18C:
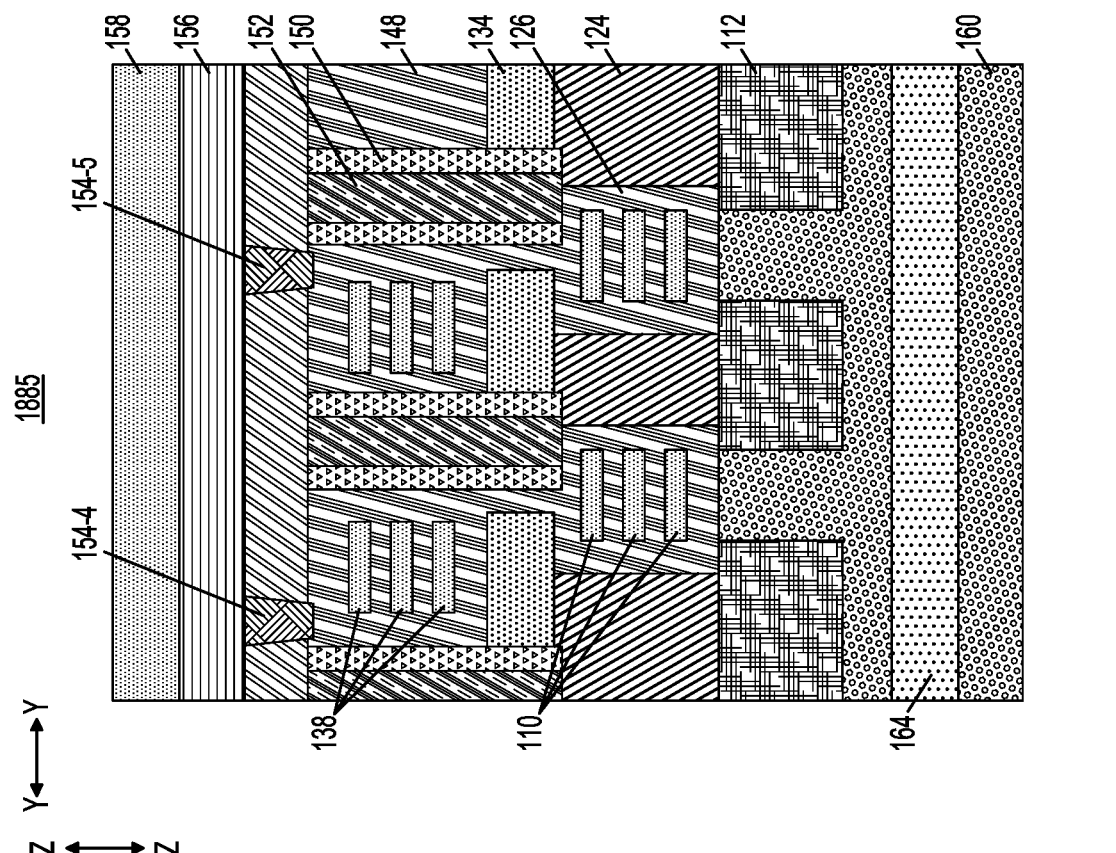
FIG. 18C depicts a third cross-sectional view of the structure of FIGS. 17A-17D following the formation of the inner spacers on the sidewalls of the vias through the backside interlayer dielectric layer, the removal of the exposed backside contact placeholder layers, and the etching through the bonding oxide layer to expose the bottom surfaces of source/drain regions of the top transistors of the stacked transistor structure, according to an embodiment of the invention.
Figure 19B:
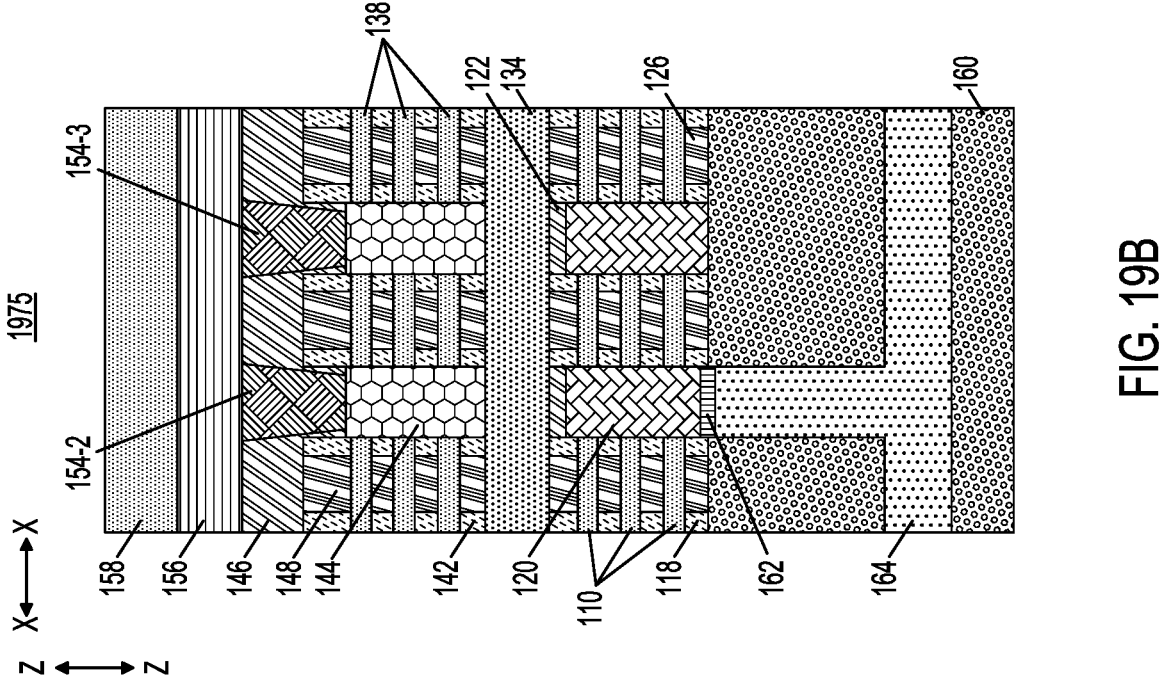
FIG. 19B depicts a second cross-sectional view of the structure of FIGS. 18A-18D following the formation of the silicide liner on the exposed bottom surfaces of the source/ drain regions of the top transistors of the stacked transistor structure and following the formation of the backside contacts to the source/drain regions of the top transistors of the stacked transistor structure, according to an embodiment of the invention.
Figure 19A:
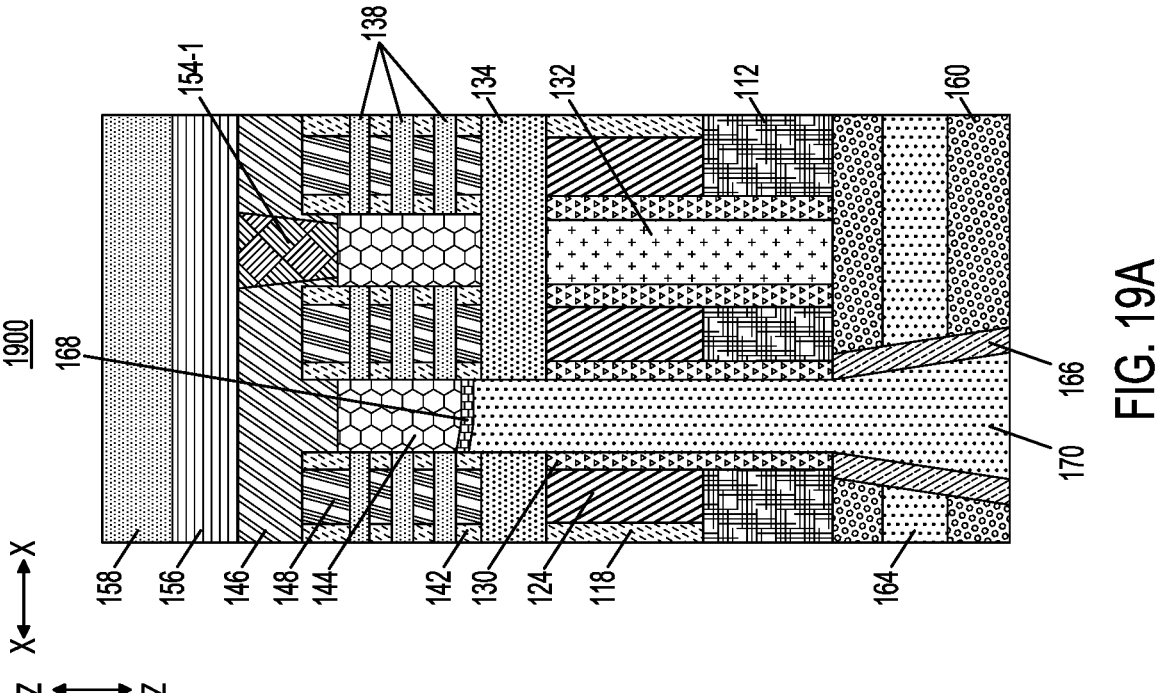
FIG. 19A depicts a first cross-sectional view of the structure of FIGS. 18A-18D following formation of a silicide liner on the exposed bottom surfaces of the source/drain regions of the top transistors of the stacked transistor structure and following formation of backside contacts to the source/drain regions of the top transistors of the stacked transistor structure, according to an embodiment of the invention.
Figure 19D:
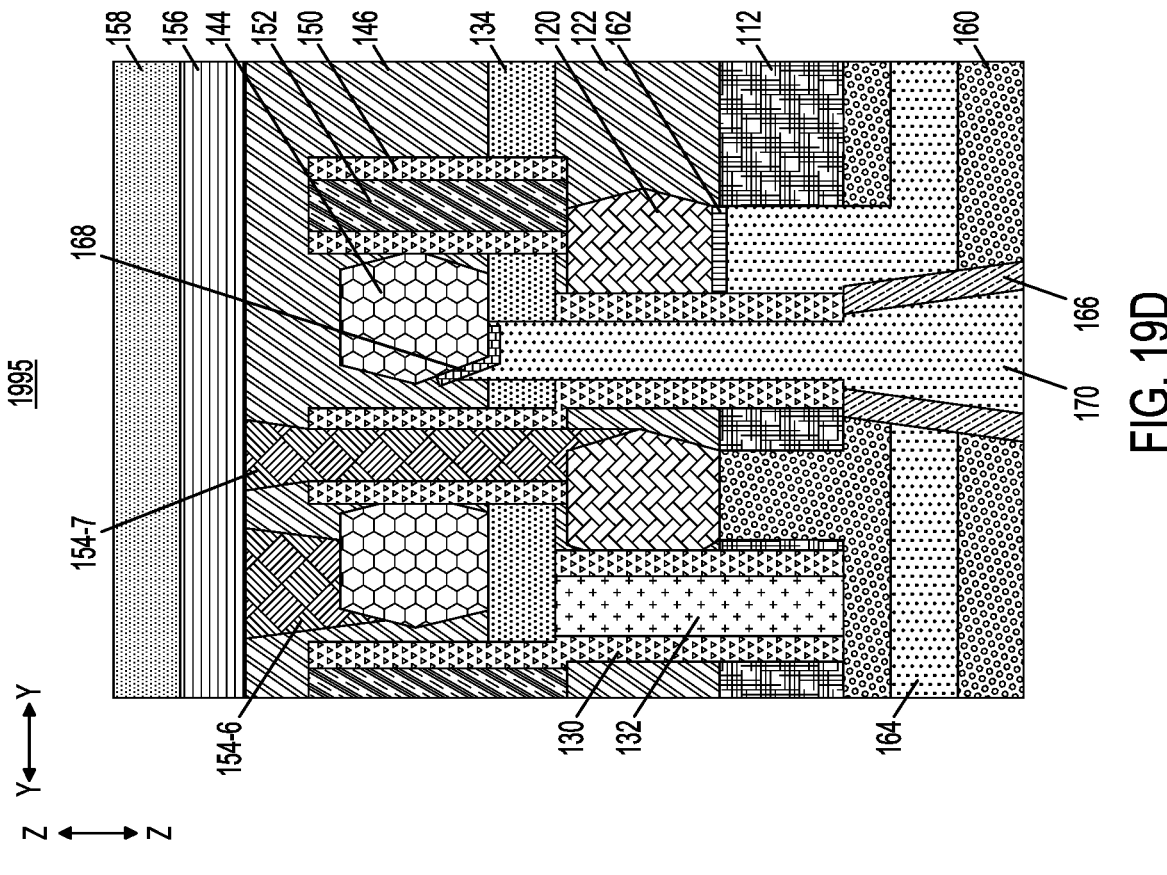
Figure 19C:
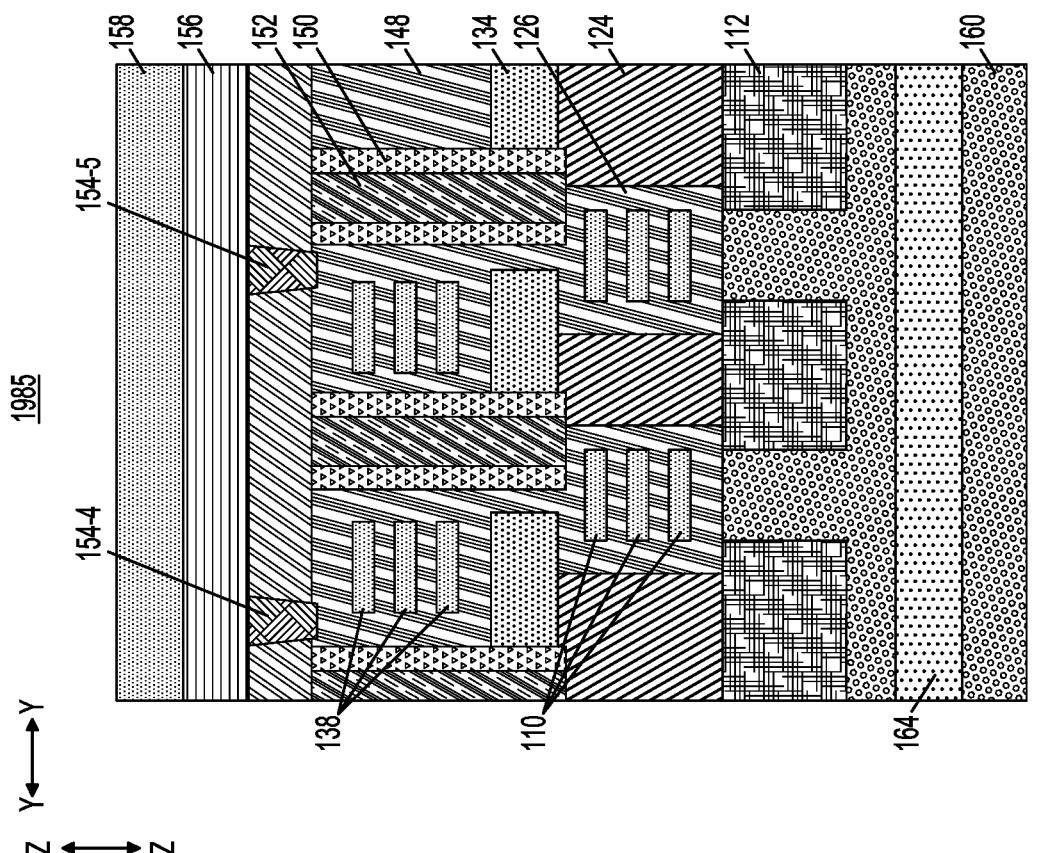

FIG. 19C depicts a third cross-sectional view of the structure of FIGS. 18A-18D following the formation of the silicide liner on the exposed bottom surfaces of the source/drain regions of the top transistors of the stacked transistor structure and following the formation of the backside contacts to the source/drain regions of the top transistors of the stacked transistor structure, according to an embodiment of the invention.

FIG. 19D depicts a fourth cross-sectional view of the structure of FIGS. 18A-18D following the formation of the silicide liner on the exposed bottom surfaces of the source/drain regions of the top transistors of the stacked transistor structure and following the formation of the backside contacts to the source/drain regions of the top transistors of the stacked transistor structure, according to an embodiment of the invention.

Figure 20B:
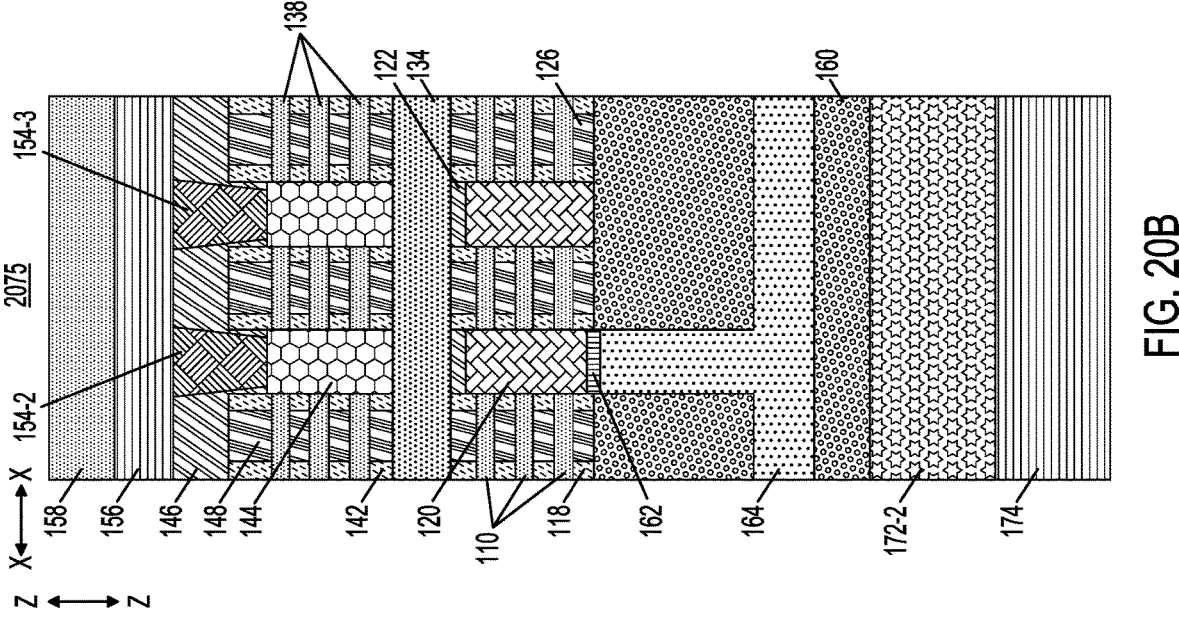
Figure 20A:
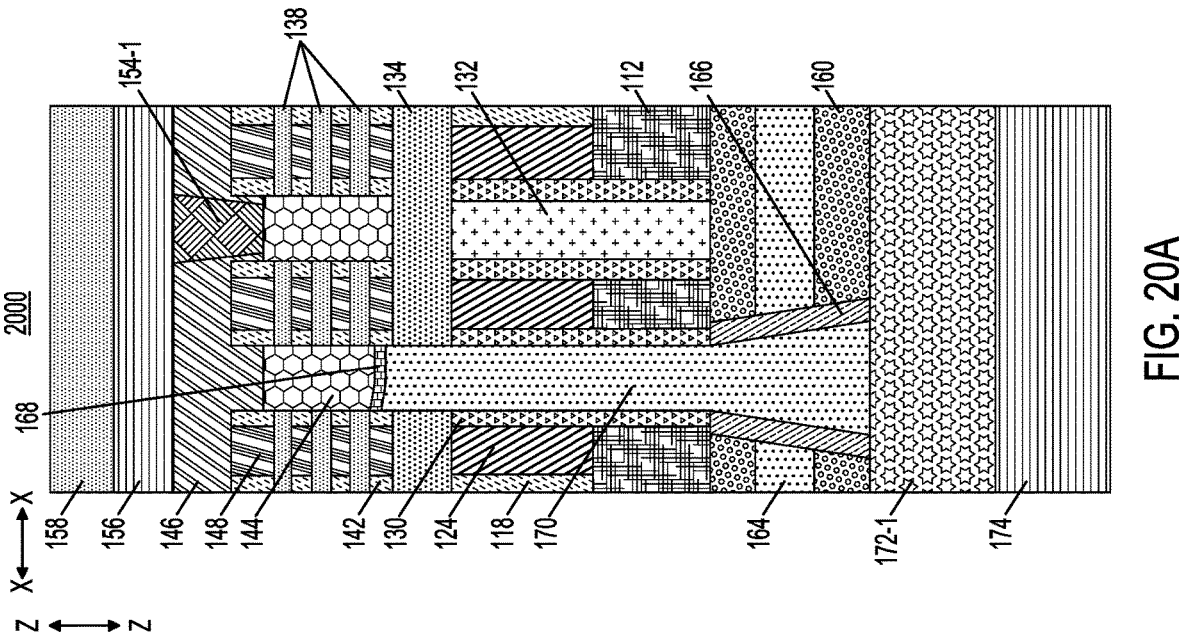

FIG. 20A depicts a first cross-sectional view of the structure of FIGS. 19A-19D following formation of a backside power delivery network and backside interconnects, according to an embodiment of the invention.

FIG. 20B depicts a second cross-sectional view of the structure of FIGS. 19A-19D following the formation of the backside power delivery network and the backside interconnects, according to an embodiment of the invention.

Figures 20C, 20D:
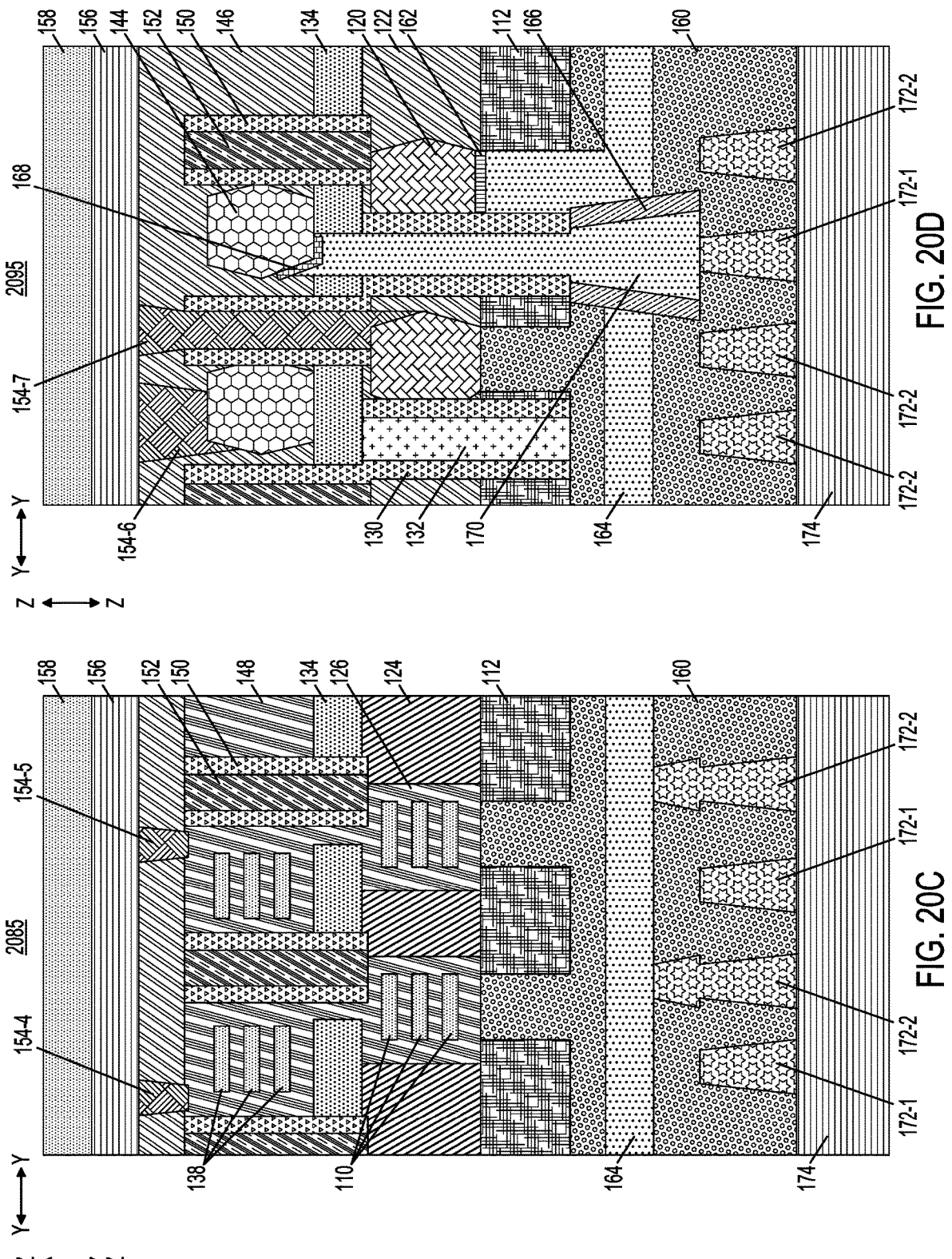

FIG. 20C depicts a third cross-sectional view of the structure of FIGS. 19A-19D following the formation of the backside power delivery network and the backside interconnects, according to an embodiment of the invention.

FIG. 20D depicts a fourth cross-sectional view of the structure of FIGS. 19A-19D following the formation of the backside power delivery network and the backside interconnects, according to an embodiment of the invention.

Figure 21:
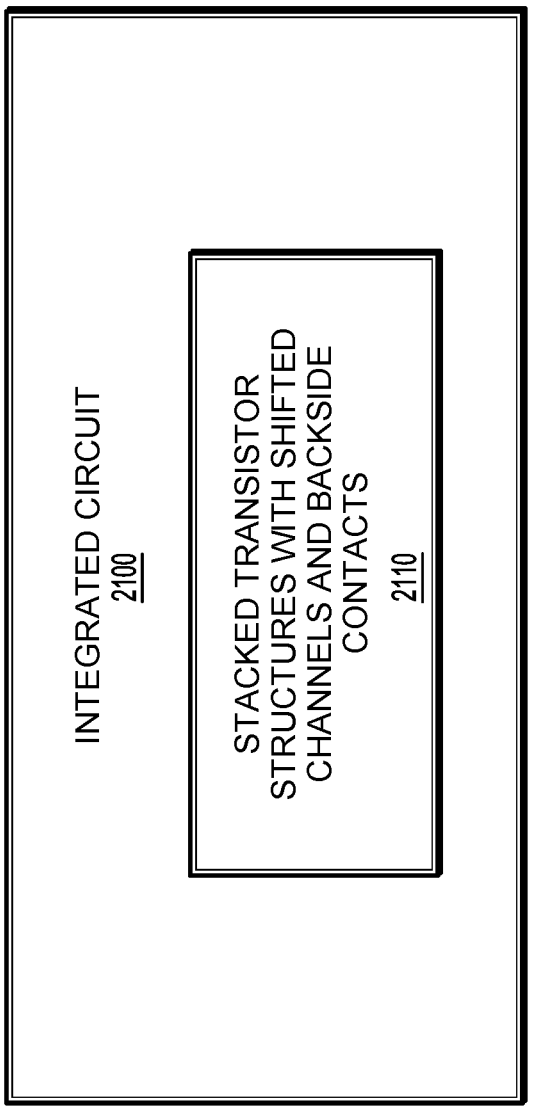

FIG. 21 shows an integrated circuit comprising backside contacts for one or more stacked transistor structures with shifted channels, according to an embodiment of the invention.

DETAILED DESCRIPTION

Illustrative embodiments of the invention may be described herein in the context of illustrative methods for forming backside contacts for stacked transistor structures with shifted channels, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

As discussed above, stacked transistor structures provide an opportunity for continued scaling and area improvement. Stacked transistor structures may utilize sequential integration fabrication processes. Sequential integration includes forming "bottom" (also referred to as "lower") transistors of a stacked transistor structure, followed by wafer bonding and formation of "top" (also referred to as "upper") transistors of the stacked transistor structure. The bottom and top transistors of the stacked transistor structure may also be referred to as being different "tiers" or "levels" of the stacked transistor structure (e.g., where the bottom transistors are a first tier or level of the stacked transistor structure and the top transistors are a second tier or level of the stacked transistor structure). Sequential integration fabrication processes provide various advantages relative to monolithic fabrication processes. For example, sequential integration allows for: an increased effective width (Weff) with the same device footprint; increasing the number of channels (e.g., nanosheet channels); and further critical dimension (CD) scaling. Since the top and bottom tiers are integrated separately, sequential integration allows for unique transistor architectures (e.g., shifted, staggered, etc.), split gate schemes, multiple threshold voltage (multi-Vt) replacement metal gate (RMG) learning from nanosheets, channel engineering for the top and bottom tiers (e.g., mobility), and reduced process complexity.

Stacked transistor structures may use different transistor architectures, such as a "stepped" architecture (e.g., where nanosheet channels for the top transistors of a stacked transistor structure are narrower than nanosheet channels for the bottom transistors of the stacked transistor structure) and an "aligned" architecture (e.g., where nanosheet channels for the top and bottom transistors of a stacked transistor structure have the same size and are aligned with one another). Wafer bonding approaches used in sequential integration fabrication processes further allow for a "shifted" architecture (e.g., where the active regions or nanosheet channels for the top and bottom transistors of the stacked transistor structure are offset from one another) and a "staggered" architecture (e.g., where cell or device boundaries for the top and bottom transistors of the stacked transistor structure are offset from one another). Both the shifted and staggered architectures provide for lower aspect ratio (AR) for middle-of-line (MOL) contact formation, and also provide a Weff benefit with respect to the aligned active regions.

In some illustrative embodiments, a stacked transistor structure includes top and bottom transistors with aligned cell boundaries (e.g., within lithography tolerance), where the top and bottom transistors in the stacked transistor structure have gate-all-around (GAA) channels (e.g., nanosheet channels) which are horizontally shifted relative to one another along the gate axis.

Contact formation for such stacked transistor structures provides various technical challenges, including that backside contacts to the source/drain regions for the top and bottom transistors can easily short to one another and/or gate regions. Further backside power rails in a backside power delivery network (BSPDN) may be crowded, such that the backside power rails can short with each other.

A method of forming a stacked transistor structure in some embodiments includes forming bottom transistors with self-aligned gate isolation layers formed of a first dielectric material, forming backside contact placeholder trenches (e.g., for backside contacts to top transistors) through a bottom interlayer dielectric (ILD) layer, a bottom gate spacer, and shallow trench isolation (STI) regions, followed by filling the backside contact placeholder trenches with a dielectric liner and placeholder material. The structure is then bonded to channel layers for the top transistors, followed by formation of top transistors, interconnects for the top transistors, and bonding to a carrier wafer. The wafer is then flipped and the substrate is removed. Backside contacts and a power plane are then formed for the source/drain regions of the bottom transistors. Vias are then formed through the power plane, where the vias have inner spacers on sidewalls thereof. The vias expose the backside contact placeholders (e.g., for the backside contacts to the top transistors). The backside contact placeholders are then removed, and a further etching through a bonding oxide is performed to expose the source/drain regions of the top transistors. Backside contacts to the source/drain regions of the top transistors are then formed, followed by formation of a BSPDN and backside interconnects.

In some embodiments, a semiconductor structure includes a first transistor and at least a second transistor stacked over the first transistor, where an active region of the second transistor is shifted with respect to the active region of the first transistor. The semiconductor structure also includes a self-aligned backside contact which connects to source/drain regions of the second transistor. The self-aligned backside contact is formed through a backside power plane and another backside contact (e.g., to source/drain regions of the first transistor), the source/drain regions of the first transistor, and a bonding oxide between the first transistor and the second transistor.

The semiconductor structure may include a self-aligned gate isolation layer formed of a dielectric material different than that of ILD layers and gate spacers used for the semiconductor structure. In some embodiments, a backside contact placeholder (e.g., for the self-aligned backside contact) is formed in the self-aligned gate isolation layer. The backside contact placeholder includes a dielectric liner and an inner core. The backside contact placeholder may cut through at least a portion of the source/drain regions for the bottom transistors. The self-aligned backside contact may be formed through the inner core of the backside contact placeholder, and may partially wrap around the source/drain regions of the top transistors. In some embodiments, the self-aligned backside contact includes a first silicide liner on the surface of the source/drain regions for the top transistor which is different than a second silicide liner on the surface of the source/drain regions for the bottom transistor.

The backside contact formation processes described herein provide for novel backside contact structures for stacked transistor structures with shifted channels which advantageously solves critical issues related to forming connections for stacked transistor structures (e.g., preventing shorts between backside contacts for source/drain regions and gates of top and bottom transistors, and preventing shorts between power rails of a BSPDN).

FIGS. 1A-20D show a process flow for forming backside contacts for stacked transistor structures with shifted channels.

Figures 1A, 1B, 1C:
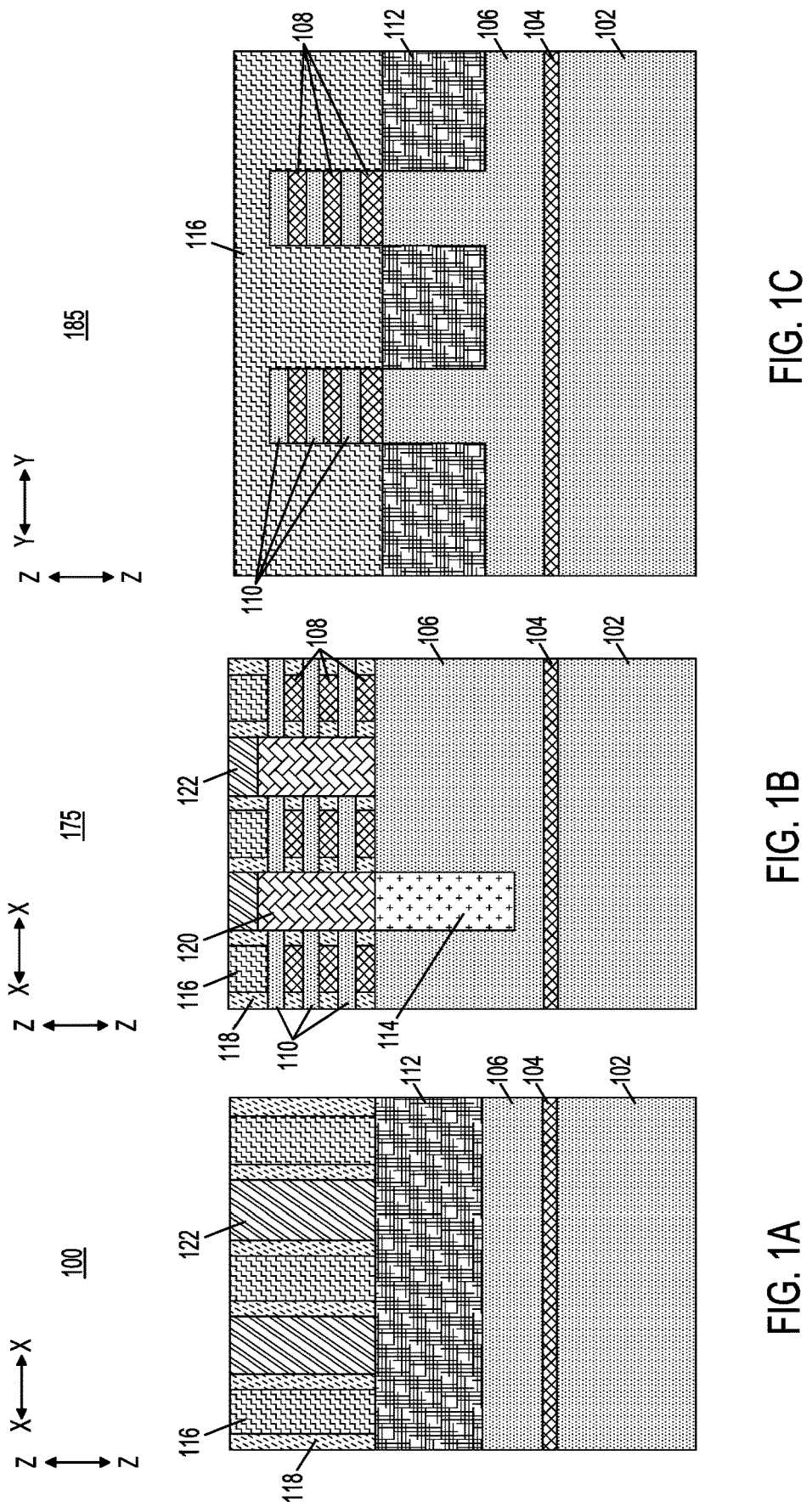
FIG. 1A depicts a first cross-sectional view of a semiconductor structure following formation of a bottom dummy gate layer for bottom transistors of a stacked transistor structure, formation of inner spacers, formation of a backside contact placeholder layer, and formation of source/drain regions for the bottom transistors of the stacked transistor structure, according to an embodiment of the invention.
FIG. 1B depicts a second cross-sectional view of the semiconductor structure following the formation of the bottom dummy gate layer for the bottom transistors of the stacked transistor structure, the formation of the inner spacers, the formation of the backside contact placeholder layer, and the formation of the source/drain regions for the bottom transistors of the stacked transistor structure, according to an embodiment of the invention.
FIG. 1C depicts a third cross-sectional view of the semiconductor structure following the formation of the bottom dummy gate layer for the bottom transistors of the stacked transistor structure, the formation of the inner spacers, the formation of the backside contact placeholder layer, and the formation of the source/drain regions for the bottom transistors of the stacked transistor structure, according to an embodiment of the invention.
Figure 1E:
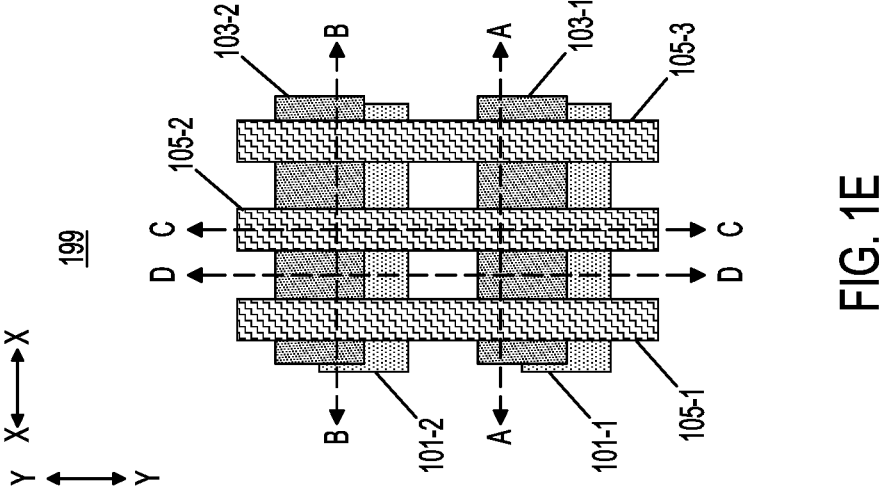
FIG. 1E depicts a top-down view illustrating where the first, second, third and fourth cross-sectional views of FIGS. 1A-1D are taken, according to an embodiment of the invention.
Figure 1D:
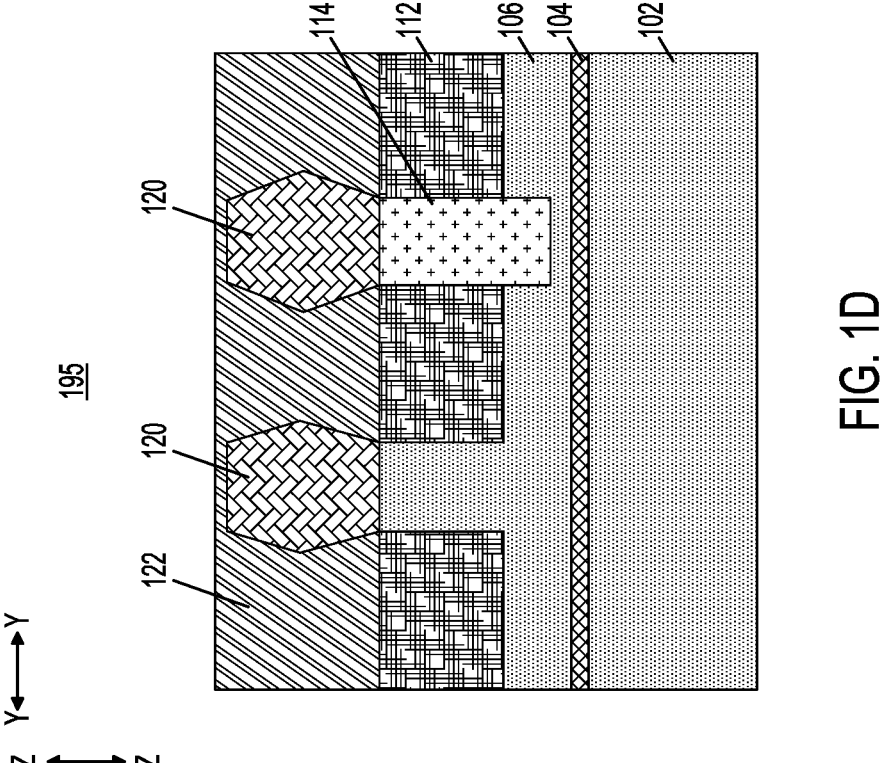
FIG. 1D depicts a fourth cross-sectional view of the semiconductor structure following the formation of the bottom dummy gate layer for the bottom transistors of the stacked transistor structure, the formation of the inner spacers, the formation of the backside contact placeholder layer, and the formation of the source/drain regions for the bottom transistors of the stacked transistor structure, according to an embodiment of the invention.

FIGS. 1A-1E show different views of a semiconductor structure. FIGS. 1A-1D show cross-sectional views 100, 175, 185 and 195, and FIG. 1E shows a top-down view 199 illustrating where the cross-sectional views 100, 175, 185 and 195 of FIGS. 1A-1D are taken. FIG. 1E shows active (e.g., channel) regions 101-1 and 101-2 for bottom transistors of a stacked transistor structure, active (e.g., channel) regions 103-1 and 103-2 for top transistors of the stacked transistor structure, and gate regions 105-1, 105-2 and 105-3. The cross-sectional view 100 of FIG. 1A is taken along the line A-A shown in the top-down view 199 of FIG. 1E (e.g., across the gate regions 105-1, 105-2 and 105-3 and along the active region 103-1). The cross-sectional view 175 of FIG. 1B is taken along the line B-B shown in the top-down view 199 of FIG. 1E (e.g., across the gate regions 105-1, 105-2 and 105-3 and along the active regions 101-2 and 103-2). The cross-sectional view 185 of FIG. 1C is taken along the line C-C shown in the top-down view 199 of FIG. 1E (e.g., across the active regions 101-1, 101-2, 103-1 and 103-2 and along the gate region 105-2). The cross-sectional view 195 of FIG. 1D is taken along the line D-D shown in the top-down view 199 of FIG. 1E (e.g., across the active regions 101-1, 101-2, 103-1 and 103-2 and between gate regions 105-1 and 105-2).

The semiconductor structure shown in FIGS. 1A-1D includes a substrate 102, an etch stop layer 104, a substrate 106, a nanosheet stack comprising alternating sacrificial layers 108 and nanosheet channel layers 110, shallow trench isolation (STI) regions 112, a backside contact placeholder layer 114, a bottom dummy gate layer 116 for bottom transistors of a stacked transistor structure, a spacer layer 118, source/drain regions 120 for the bottom transistors of the stacked transistor structure, and an interlayer dielectric (ILD) layer 122.

The substrates 102 and 106 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. The substrates 102 and 106 may have respective heights (in direction Z) and widths (in directions X/Y) which vary as needed based on the type of structures to be formed.

The etch stop layer 104 may comprise a buried oxide (BOX) layer formed of silicon germanium (SiGe), silicon dioxide ($SiO_2$), or another suitable material such as a III-V semiconductor epitaxial layer. The etch stop layer 104 may have a height (in direction Z) in the range of 10 to 50 nm.

The sacrificial layers 108 may be formed of SiGe. Each of the sacrificial layers 108 may have a thickness (in direction Z) in the range of 5-15 nm.

In some embodiments, both the etch stop layer 104 and the sacrificial layers 108 are formed of SiGe, with a germanium (Ge) concentration in the range of 20-40%. It should be noted, however, that this is not a requirement, and that the etch stop layer 104 and the sacrificial layers 108 may be formed of different materials, or may both be formed of SiGe but with different percentages of Ge.

The nanosheet channel layers 110 will provide channels for the bottom transistors (e.g., nanosheet transistors) of the stacked transistor structure. The nanosheet channel layers 110 may be formed of Si or another suitable material (e.g., a material similar to that used for the substrates 102 and 106. Each of the nanosheet channel layers 110 may have a thickness (in direction Z) in the range of 5-15 nm.

The STI regions 112 may be formed of a dielectric material such as silicon dioxide ($SiO_2$), silicon oxycarbide (SiOC), silicon oxynitride (SiON), etc. The STI regions 112 may have a height (in direction Z) in the range of 10 to 200 nm.

The backside contact placeholder layer 114 may be formed of SiGe or another suitable material such as aluminum oxide ($AlO_x$), titanium oxide ($TiO_x$), aluminum nitride (AlN$_x$), etc. The backside contact placeholder layer 114 may have a width (in directions X and Y) in the range of 10 to 100 nm and a height (in direction Z) in the range of 10 to 30 nm deeper than the STI regions 112.

The bottom dummy gate layer 116 may be formed of amorphous silicon (a-Si), amorphous silicon germanium (a-SiGe) over a thin SiO$_2$ or titanium nitride (TiN) layer, or another suitable material.

The spacer layer 118 may be formed of silicon boron carbide nitride (SiBCN) or another suitable material such as SiN, SiOC, silicon oxycarbonitride (SiOCN), etc. The spacer layer 118 may have a thickness in the range of 4 to 10 nm. The portions of the spacer layer 118 on sidewalls of the bottom dummy gate layer 116 provide gate spacers, while the portions of the spacer layer 118 on sidewalls of the sacrificial layers 108 provide inner spacers.

The source/drain regions 120 may be formed using an epitaxial growth process. The source/drain regions 120 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride (BF$_2$), gallium (Ga), indium (In), and thallium (TI). In some embodiments, the epitaxy process used to form the source/drain regions 120 comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1 \times 10^{19}$ cm$^{-3}$ to $3 \times 10^{21}$ cm$^{-3}$, or preferably between $2 \times 10^{20}$ cm$^{-3}$ to $3 \times 10^{21}$ cm$^{-3}$. The source/drain regions 120 may have widths (in direction Y) in the range of 10 to 100 nm, and may have heights (in direction Z) in the range of 20 to 100 nm.

The ILD layer 122 material may be formed of any suitable isolating material, such as SiO$_2$, SiOC, SiON, etc. The ILD layer 122 may have a height (in direction Z) matching that of the bottom dummy gate layer 116.

The semiconductor structure shown in FIGS. 1A-1D may be formed by depositing the nanosheet stack (e.g., the sacrificial layers 108 and the nanosheet channel layers 110) over the substrate 106. The nanosheet stack may then be patterned (e.g., using lithographic processing), followed by fill with material of the STI regions 112 and recess of the material of the STI regions 112 below the bottommost one of the sacrificial layers 108. The bottom dummy gate layer 116 is then patterned using a hard mask (not shown), followed by nanosheet recess and formation of the spacer layer 118 and nanosheet recess. An indent etch may be used to indent the sacrificial layers 108. After that, a backside contact placeholder cavity is patterned followed by formation of the backside contact placeholder layer 114. The source/drain regions 120 are then epitaxially grown, followed by deposition and planarization of the ILD layer 122.

Figure 2B:
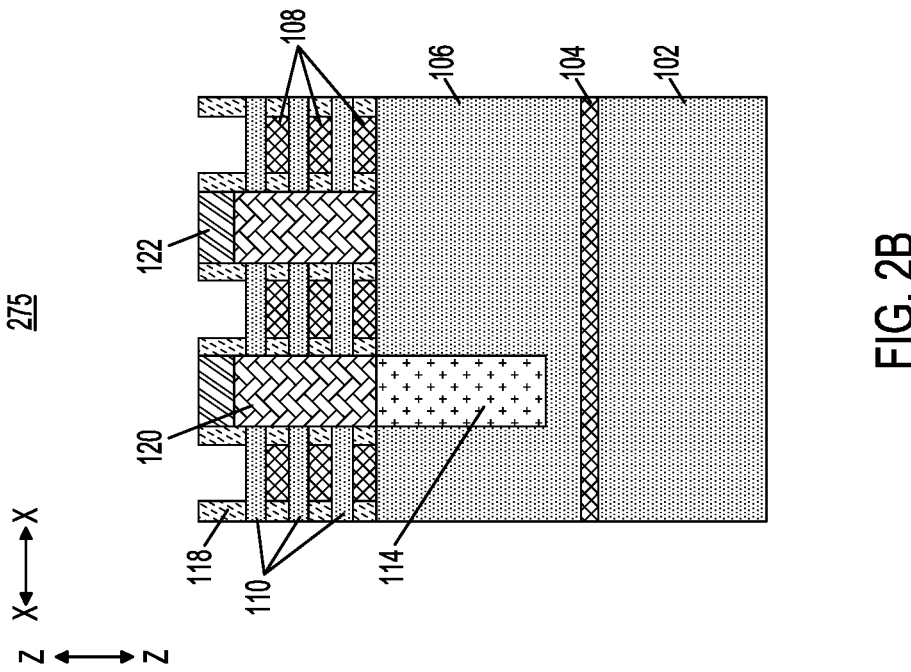
FIG. 2B depicts a second cross-sectional view of the structure of FIGS. 1A-1D following the removal of the bottom dummy gate layer, according to an embodiment of the invention.
Figure 2A:
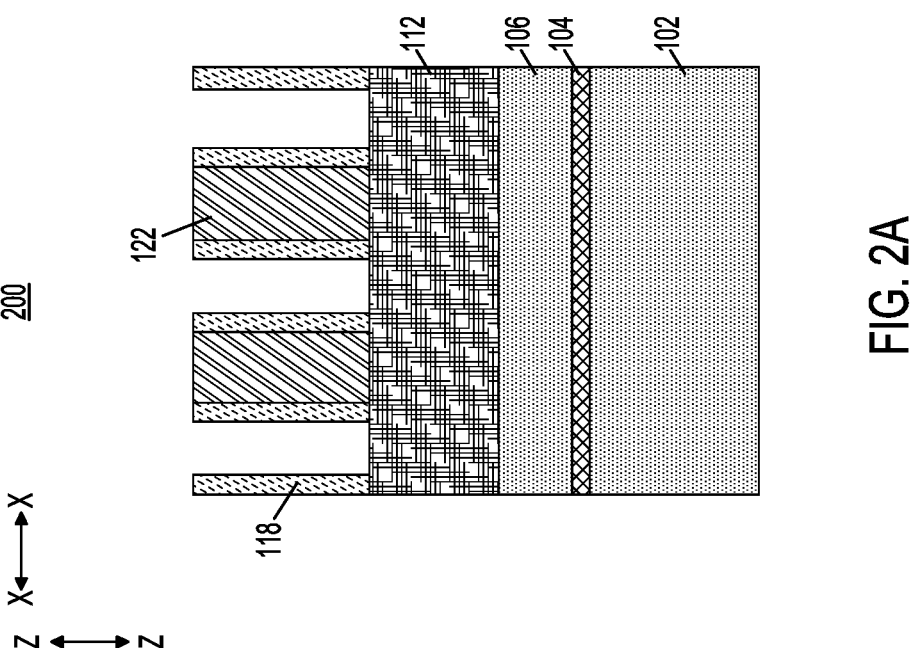
FIG. 2A depicts a first cross-sectional view of the structure of FIGS. 1A-1D following removal of the bottom dummy gate layer, according to an embodiment of the invention.
Figures 2C, 2D:
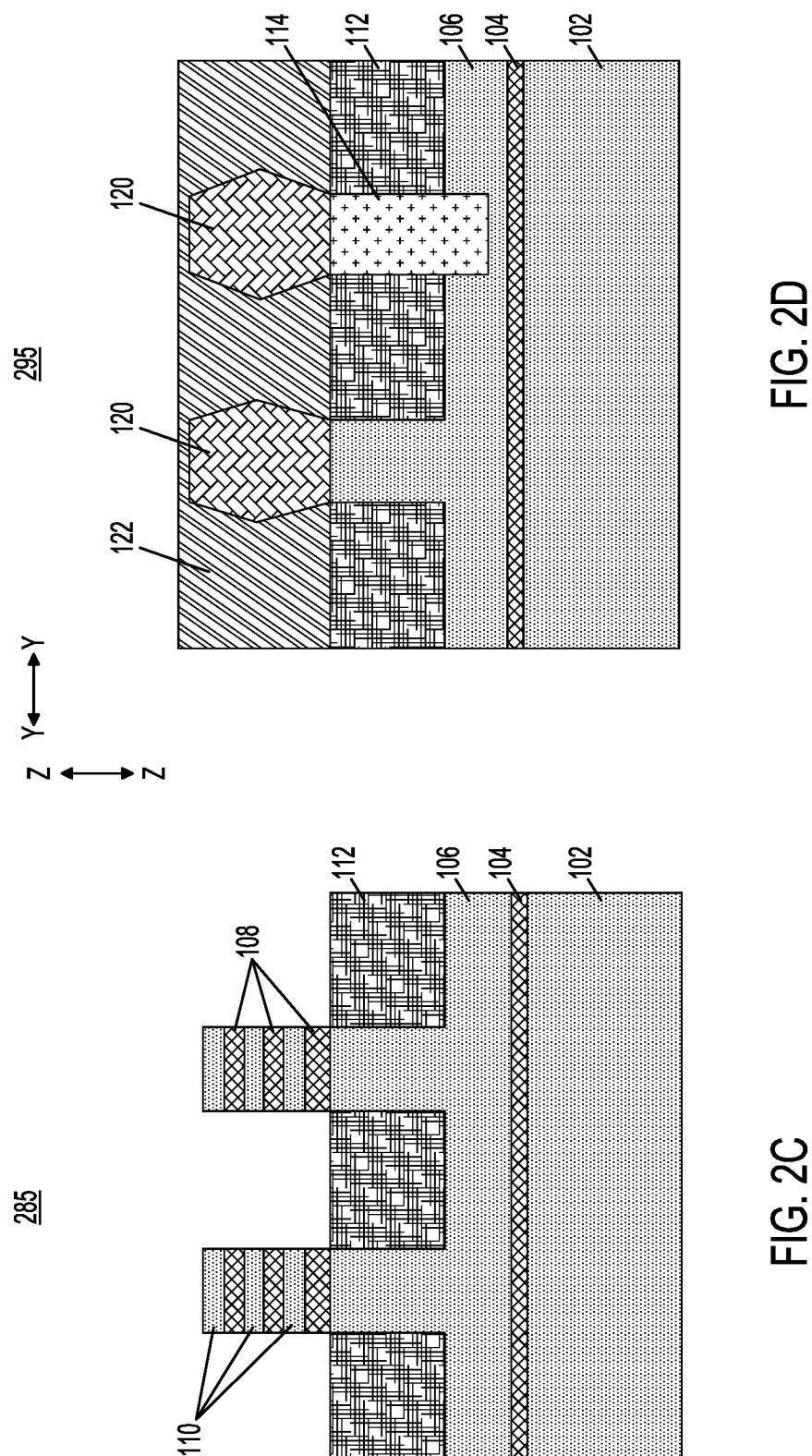
FIG. 2C depicts a third cross-sectional view of the structure of FIGS. 1A-1D following the removal of the bottom dummy gate layer, according to an embodiment of the invention.
FIG. 2D depicts a fourth cross-sectional view of the structure of FIGS. 1A-1D following the removal of the bottom dummy gate layer, according to an embodiment of the invention.

FIGS. 2A-2D show different views of the structure of FIGS. 1A-1D following removal of the bottom dummy gate layer 116. The cross-sectional view 200 of FIG. 2A is taken along the line A-A shown in the top-down view 199 of FIG. 1E. The cross-sectional view 275 of FIG. 2B is taken along the line B-B shown in the top-down view 199 of FIG. 1E. The cross-sectional view 285 of FIG. 2C is taken along the line C-C shown in the top-down view 199 of FIG. 1E. The cross-sectional view 295 of FIG. 2D is taken along the line D-D shown in the top-down view 199 of FIG. 1E. The bottom dummy gate layer 116 may be removed using any suitable etch processing.

Figure 3B:
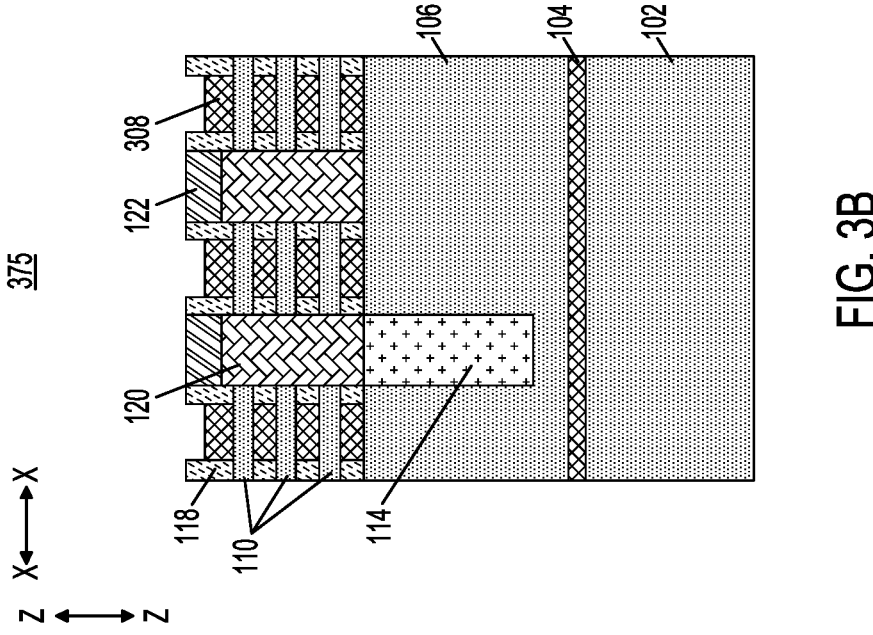
FIG. 3B depicts a second cross-sectional view of the structure of FIGS. 2A-2D following the growth of the conformal epitaxial layer to define the gate extension for the bottom transistors of the stacked transistor structure, according to an embodiment of the invention.
Figure 3A:
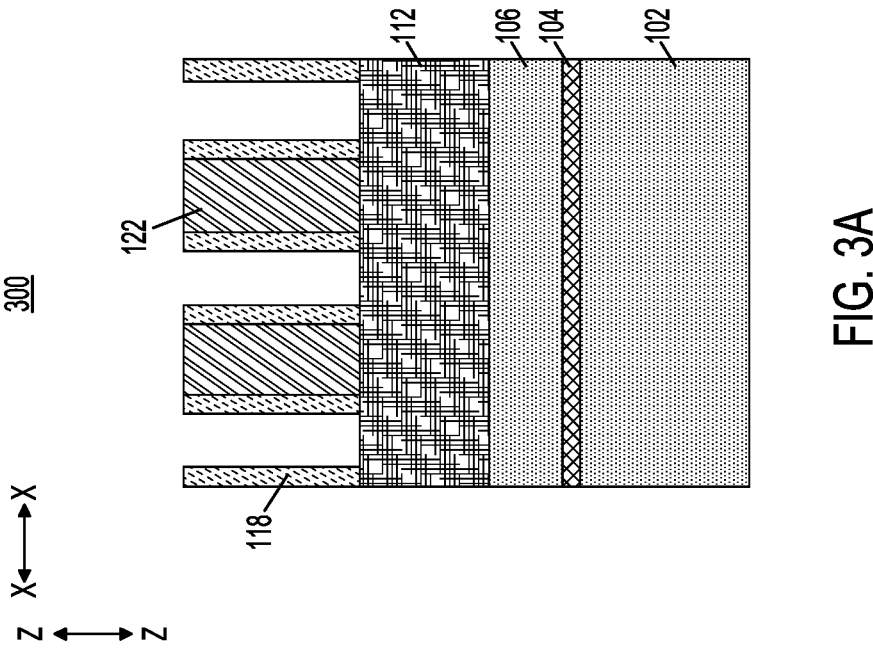
FIG. 3A depicts a first cross-sectional view of the structure of FIGS. 2A-2D following growth of a conformal epitaxial layer to define a gate extension for the bottom transistors of the stacked transistor structure, according to an embodiment of the invention.
Figures 3C, 3D:
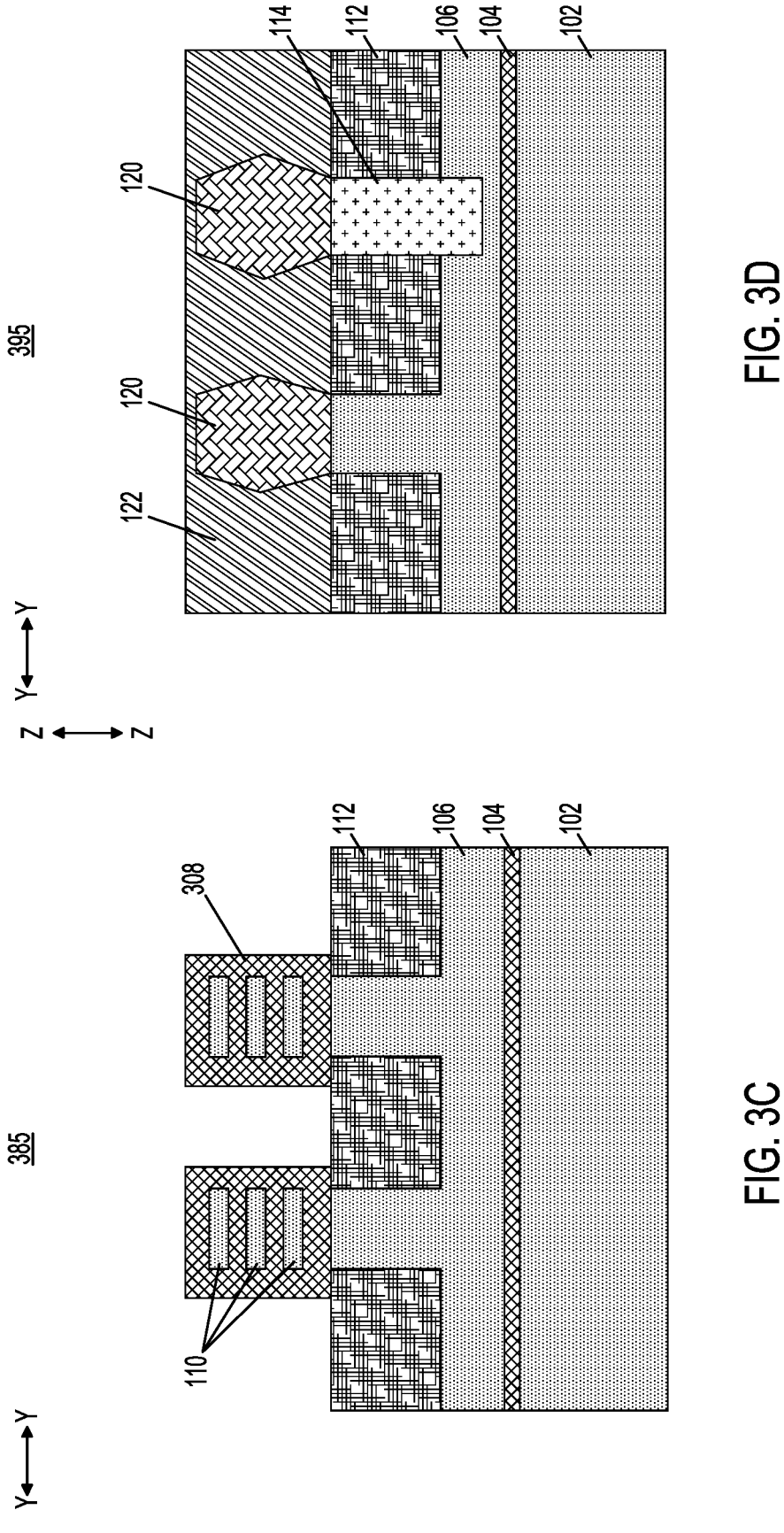
FIG. 3C depicts a third cross-sectional view of the structure of FIGS. 2A-2D following the growth of the conformal epitaxial layer to define the gate extension for the bottom transistors of the stacked transistor structure, according to an embodiment of the invention.
FIG. 3D depicts a fourth cross-sectional view of the structure of FIGS. 2A-2D following the growth of the conformal epitaxial layer to define the gate extension for the bottom transistors of the stacked transistor structure, according to an embodiment of the invention.

FIGS. 3A-3D show different views of the structure of FIGS. 2A-2D following growth of a conformal epitaxial layer 308 on the sacrificial layers 108 defining a gate extension region for the bottom transistors of the stacked transistor structure. The cross-sectional view 300 of FIG. 3A is taken along the line A-A shown in the top-down view 199 of FIG. 1E. The cross-sectional view 375 of FIG. 3B is taken along the line B-B shown in the top-down view 199 of FIG. 1E. The cross-sectional view 385 of FIG. 3C is taken along the line C-C shown in the top-down view 199 of FIG. 1E. The cross-sectional view 395 of FIG. 3D is taken along the line D-D shown in the top-down view 199 of FIG. 1E.

The conformal epitaxial layer 308 may be grown on the exposed nanosheet channel layers 110 and the sacrificial layers 108 to define the gate extension of the bottom transistors of the stacked transistor structure. The conformal epitaxial layer 308 may be formed of the same material as the sacrificial layers 108 (e.g., SiGe). The thickness of the gate extension may be in the range of 8 to 20 nm.

Figure 4B:
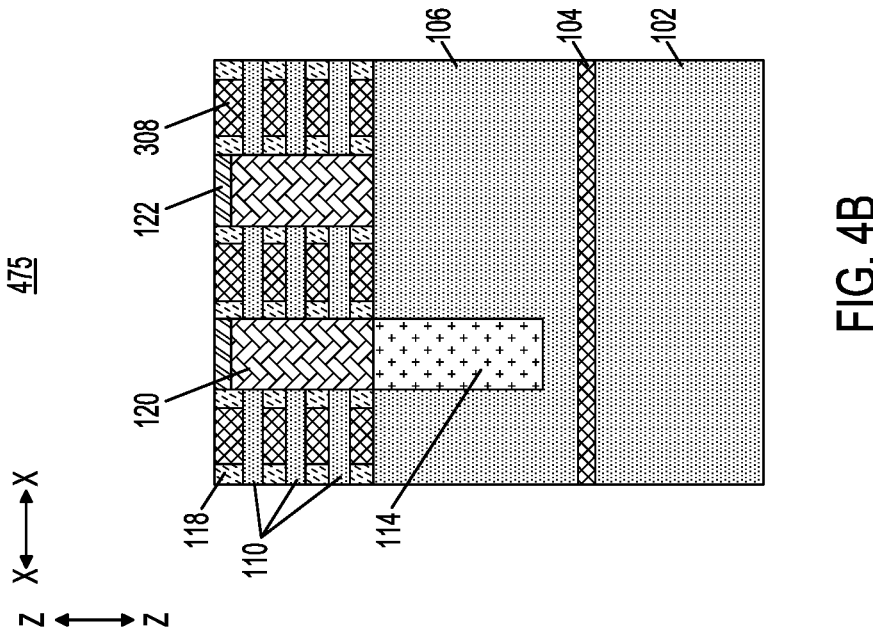
FIG. 4B depicts a second cross-sectional view of the structure of FIGS. 3A-3D following the formation of the self-aligned gate isolation layer, according to an embodiment of the invention.
Figure 4A:
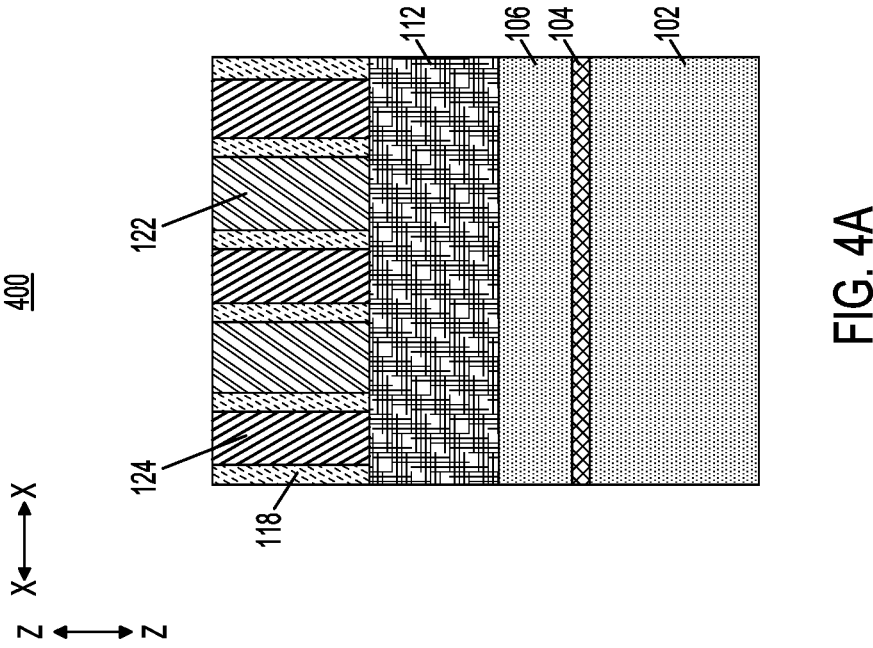
FIG. 4A depicts a first cross-sectional view of the structure of FIGS. 3A-3D following formation of a self-aligned gate isolation layer, according to an embodiment of the invention.
Figures 4C, 4D:
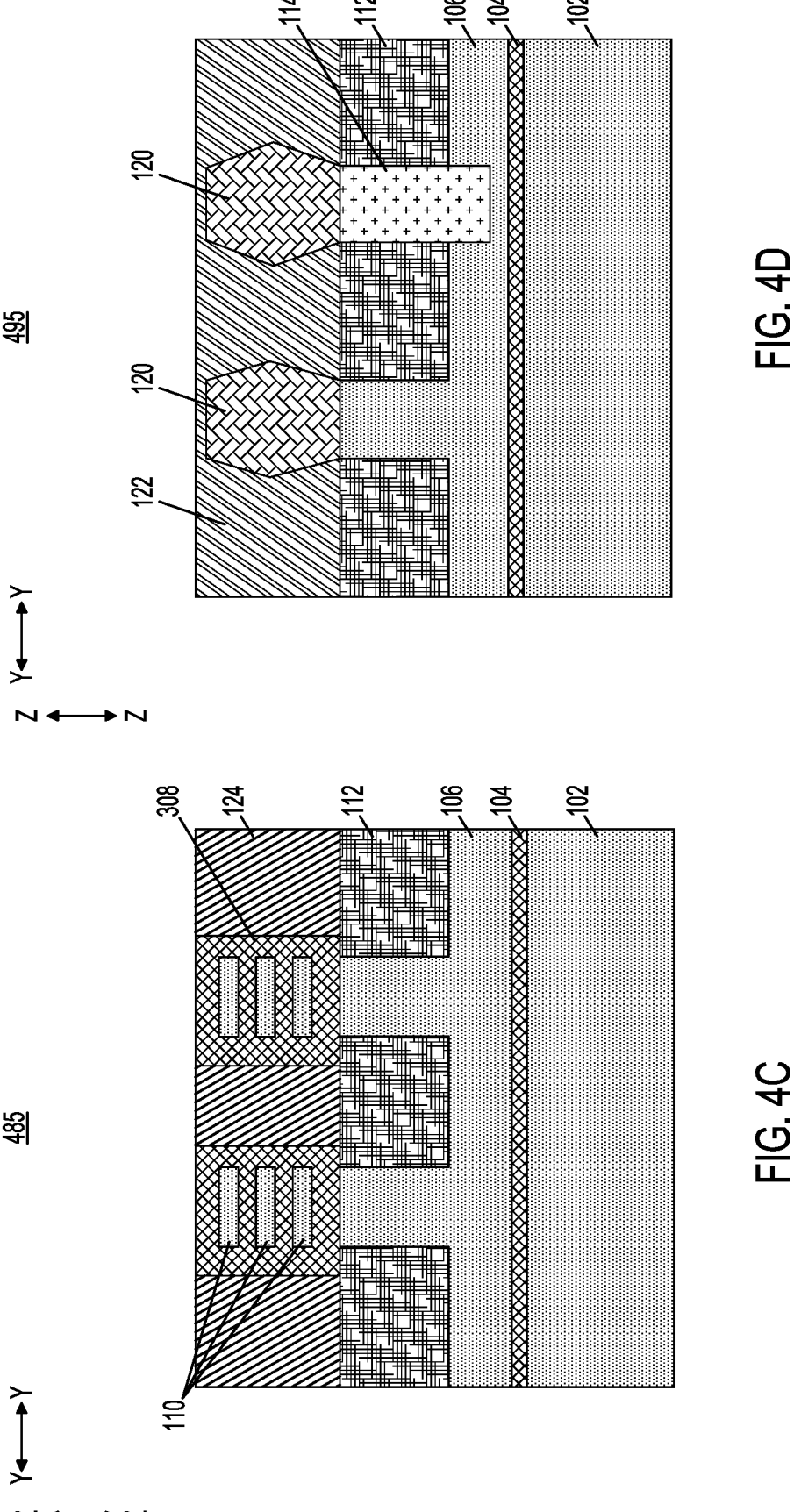
FIG. 4C depicts a third cross-sectional view of the structure of FIGS. 3A-3D following the formation of the self-aligned gate isolation layer, according to an embodiment of the invention.
FIG. 4D depicts a fourth cross-sectional view of the structure of FIGS. 3A-3D following the formation of the self-aligned gate isolation layer, according to an embodiment of the invention.

FIGS. 4A-4D show different views of the structure of FIGS. 3A-3D following formation of a self-aligned gate isolation layer 124. The cross-sectional view 400 of FIG. 4A is taken along the line A-A shown in the top-down view 199 of FIG. 1E. The cross-sectional view 475 of FIG. 4B is taken along the line B-B shown in the top-down view 199 of FIG. 1E. The cross-sectional view 485 of FIG. 4C is taken along the line C-C shown in the top-down view 199 of FIG. 1E. The cross-sectional view 495 of FIG. 4D is taken along the line D-D shown in the top-down view 199 of FIG. 1E.

The self-aligned gate isolation layer 124 may be formed by filling the structure with a dielectric material different than that used for the spacer layer 118 and the ILD layer 122. For example, the self-aligned gate isolation layer 124 may be formed of SiN, SiOCN, SiBCN, SiOC, SiC, AlN$_x$, AlO$_x$, etc. The dielectric material may then be planarized (e.g., using chemical mechanical planarization (CMP) or other suitable processing).

Figure 5B:
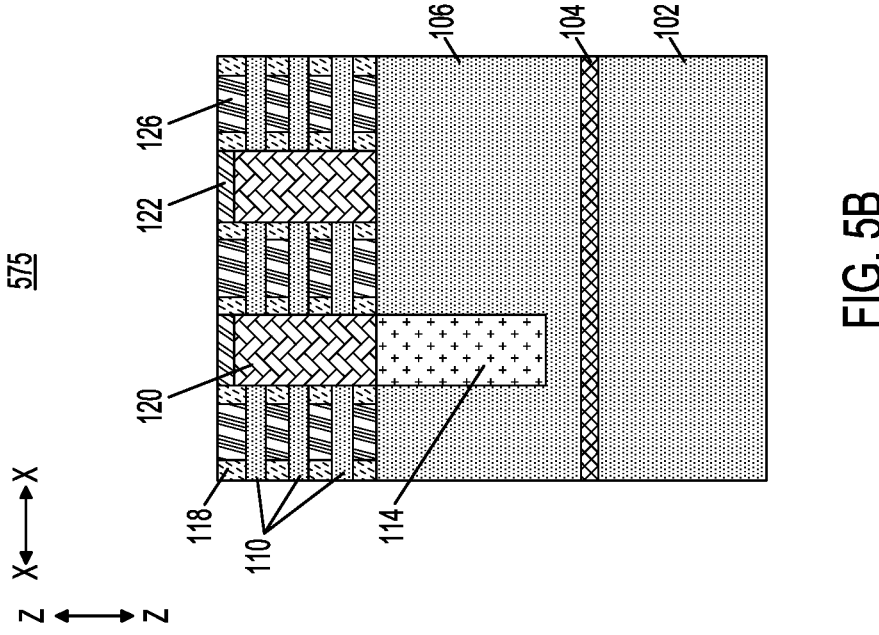
FIG. 5B depicts a second cross-sectional view of the structure of FIGS. 4A-4D following the formation of the gate stack for the bottom transistors of the stacked transistor structure, according to an embodiment of the invention.
Figure 5A:
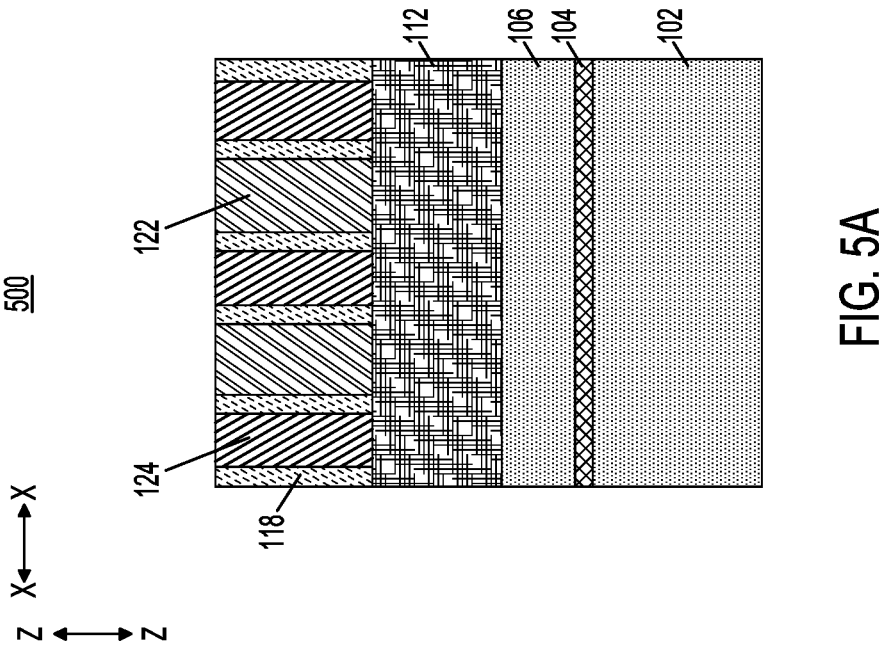
FIG. 5A depicts a first cross-sectional view of the structure of FIGS. 4A-4D following formation of a gate stack for the bottom transistors of the stacked transistor structure, according to an embodiment of the invention.
Figures 5C, 5D:
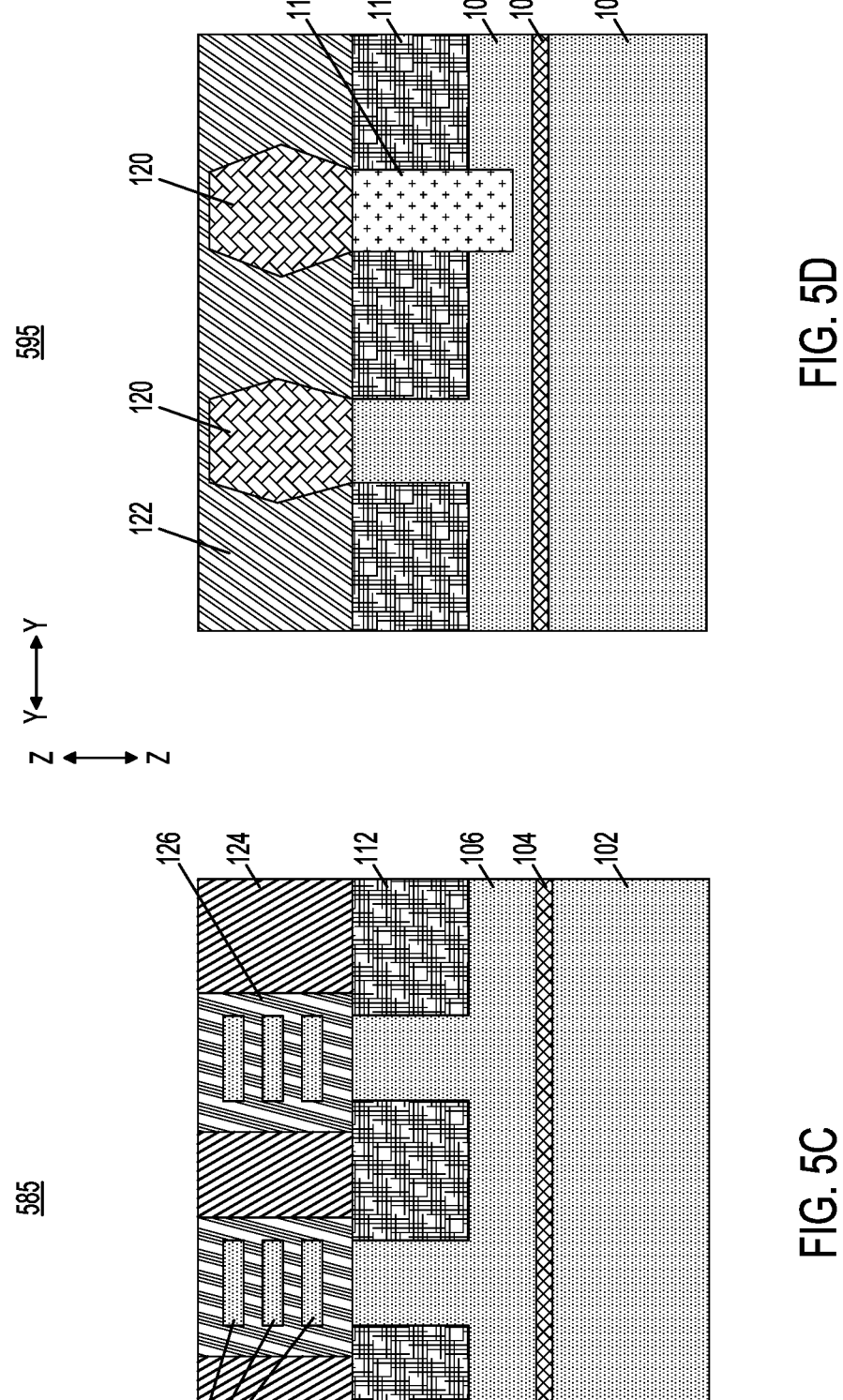
FIG. 5C depicts a third cross-sectional view of the structure of FIGS. 4A-4D following the formation of the gate stack for the bottom transistors of the stacked transistor structure, according to an embodiment of the invention.
FIG. 5D depicts a fourth cross-sectional view of the structure of FIGS. 4A-4D following the formation of the gate stack for the bottom transistors of the stacked transistor structure, according to an embodiment of the invention.

FIGS. 5A-5D show different views of the structure of FIGS. 4A-4D following formation of a gate stack 126 for the bottom transistors of the stacked transistor structure. The cross-sectional view 500 of FIG. 5A is taken along the line A-A shown in the top-down view 199 of FIG. 1E. The cross-sectional view 575 of FIG. 5B is taken along the line B-B shown in the top-down view 199 of FIG. 1E. The cross-sectional view 585 of FIG. 5C is taken along the line C-C shown in the top-down view 199 of FIG. 1E. The cross-sectional view 595 of FIG. 5D is taken along the line D-D shown in the top-down view 199 of FIG. 1E.

The gate stack 126 may be formed using replacement metal gate (RMG) processing, where the conformal epitaxial layer 308 is removed and then materials for the gate stack 126 are deposited. The gate stack 126 may include a gate dielectric and a gate conductor.

The gate dielectric may be conformally deposited in the structure, and may be formed of a high-k material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric may have a uniform thickness in the range of 1 nm to 3 nm.

The gate conductor may include a gate WFM layer and a gate metal layer. The gate WFM layer may be formed of a WFM such as titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. The gate WFM layer may have a uniform thickness in the range of 1 to 10 nm. The gate metal layer may comprise a conductive metal (e.g., tungsten (W)).

Figure 6B:
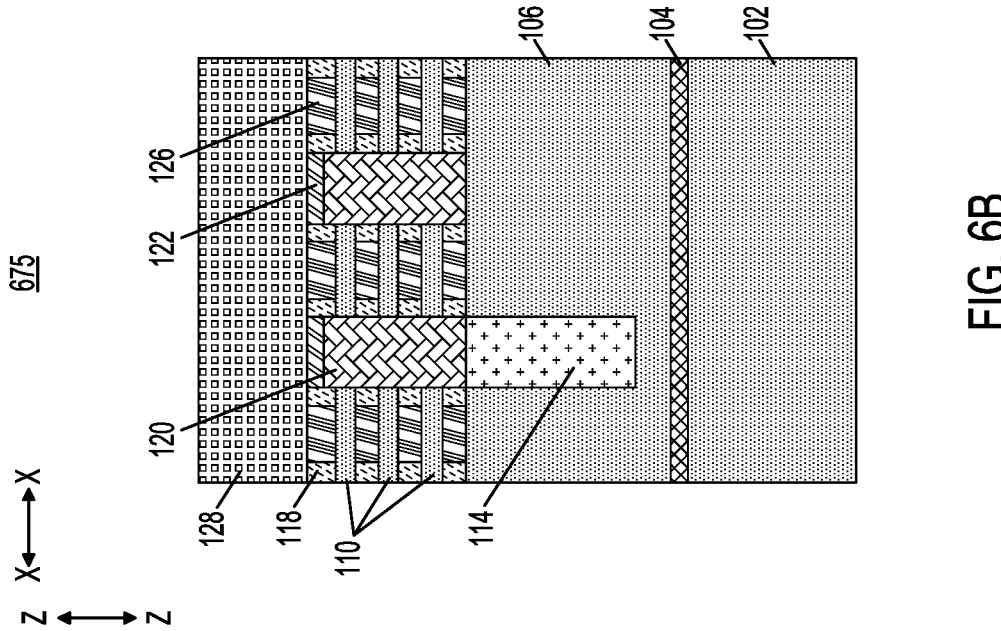
FIG. 6B depicts a second cross-sectional view of the structure of FIGS. 5A-5D following the patterning of the organic planarization layer, according to an embodiment of the invention.
Figure 6A:
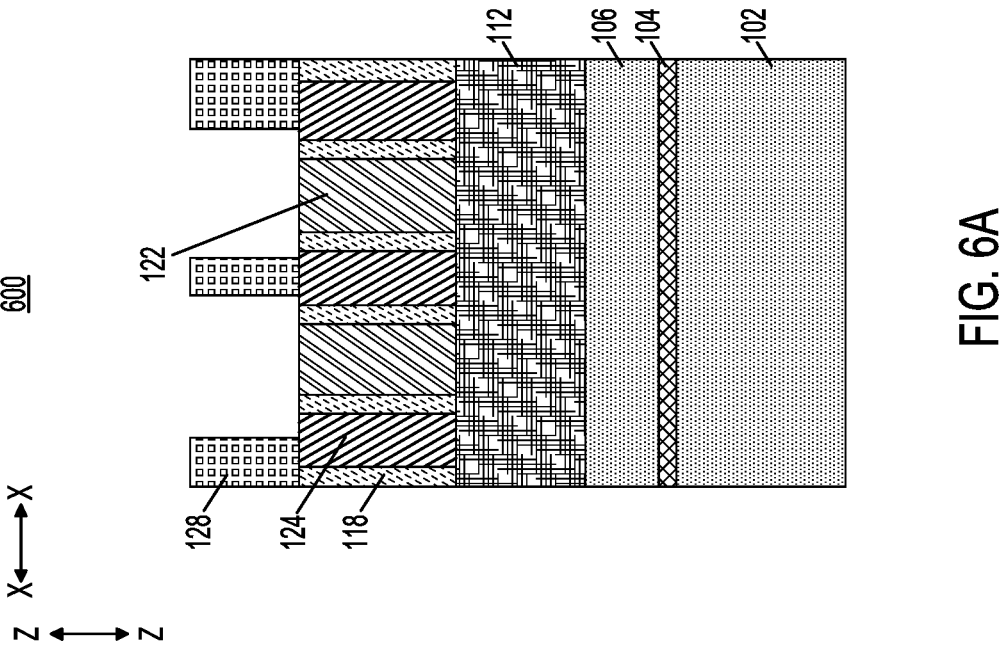
FIG. 6A depicts a first cross-sectional view of the structure of FIGS. 5A-5D following patterning of an organic planarization layer, according to an embodiment of the invention.
Figures 6C, 6D:
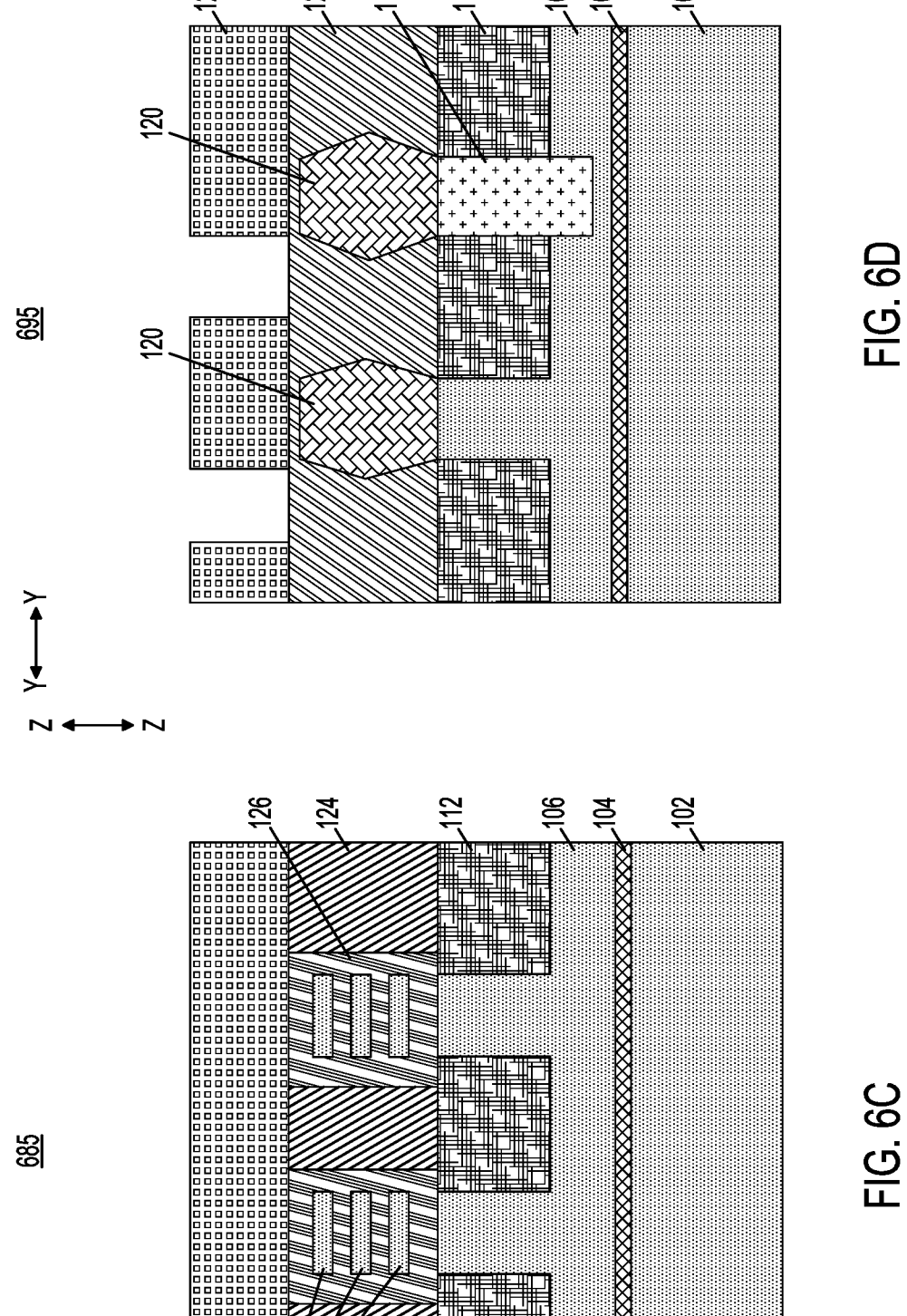
FIG. 6C depicts a third cross-sectional view of the structure of FIGS. 5A-5D following the patterning of the organic planarization layer, according to an embodiment of the invention.
FIG. 6D depicts a fourth cross-sectional view of the structure of FIGS. 5A-5D following the patterning of the organic planarization layer, according to an embodiment of the invention.

FIGS. 6A-6D show different views of the structure of FIGS. 5A-5D following patterning of an organic planarization layer (OPL) 128. The cross-sectional view 600 of FIG. 6A is taken along the line A-A shown in the top-down view 199 of FIG. 1E. The cross-sectional view 675 of FIG. 6B is taken along the line B-B shown in the top-down view 199 of FIG. 1E. The cross-sectional view 685 of FIG. 6C is taken along the line C-C shown in the top-down view 199 of FIG. 1E. The cross-sectional view 695 of FIG. 6D is taken along the line D-D shown in the top-down view 199 of FIG. 1E.

Material for the OPL 128 may be deposited over the structure, and then patterned using lithographic processing using a photoresist layer. The patterned OPL 128 has openings where backside contact placeholders for source/drain regions of top transistors of the stacked transistor structure will be formed.

Figure 7B:
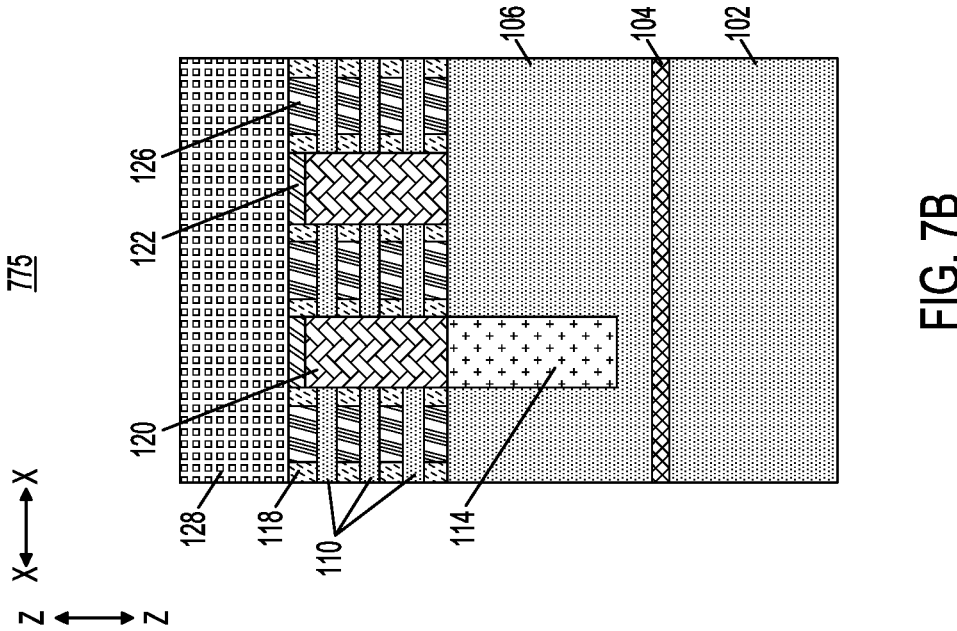
FIG. 7B depicts a second cross-sectional view of the structure of FIGS. 6A-6D following the selective etching of the interlayer dielectric layer and the shallow trench isolation regions, according to an embodiment of the invention.
Figure 7A:
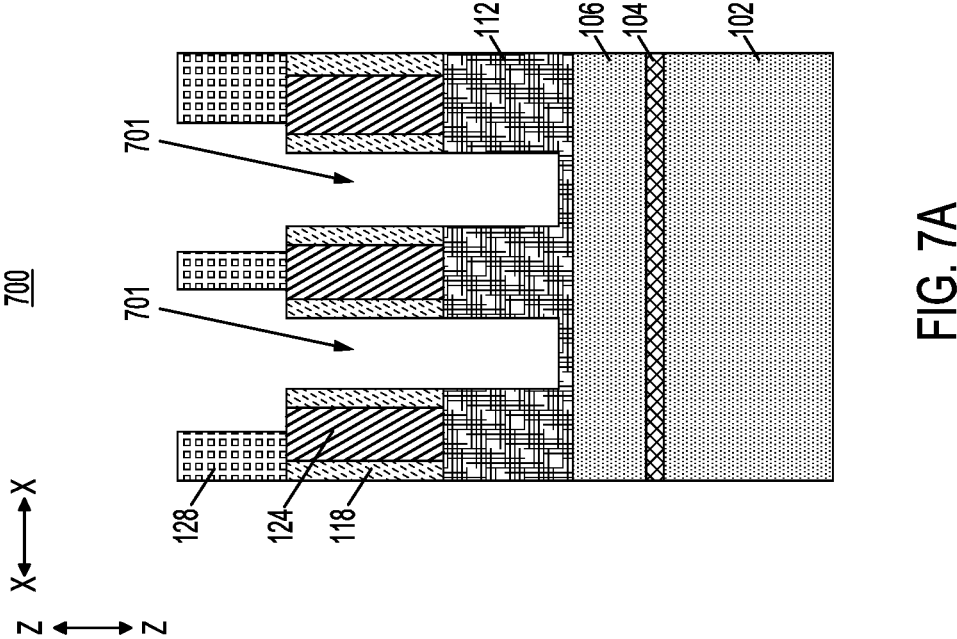
FIG. 7A depicts a first cross-sectional view of the structure of FIGS. 6A-6D following selective etching of the interlayer dielectric layer and the shallow trench isolation regions, according to an embodiment of the invention.
Figures 7C, 7D:
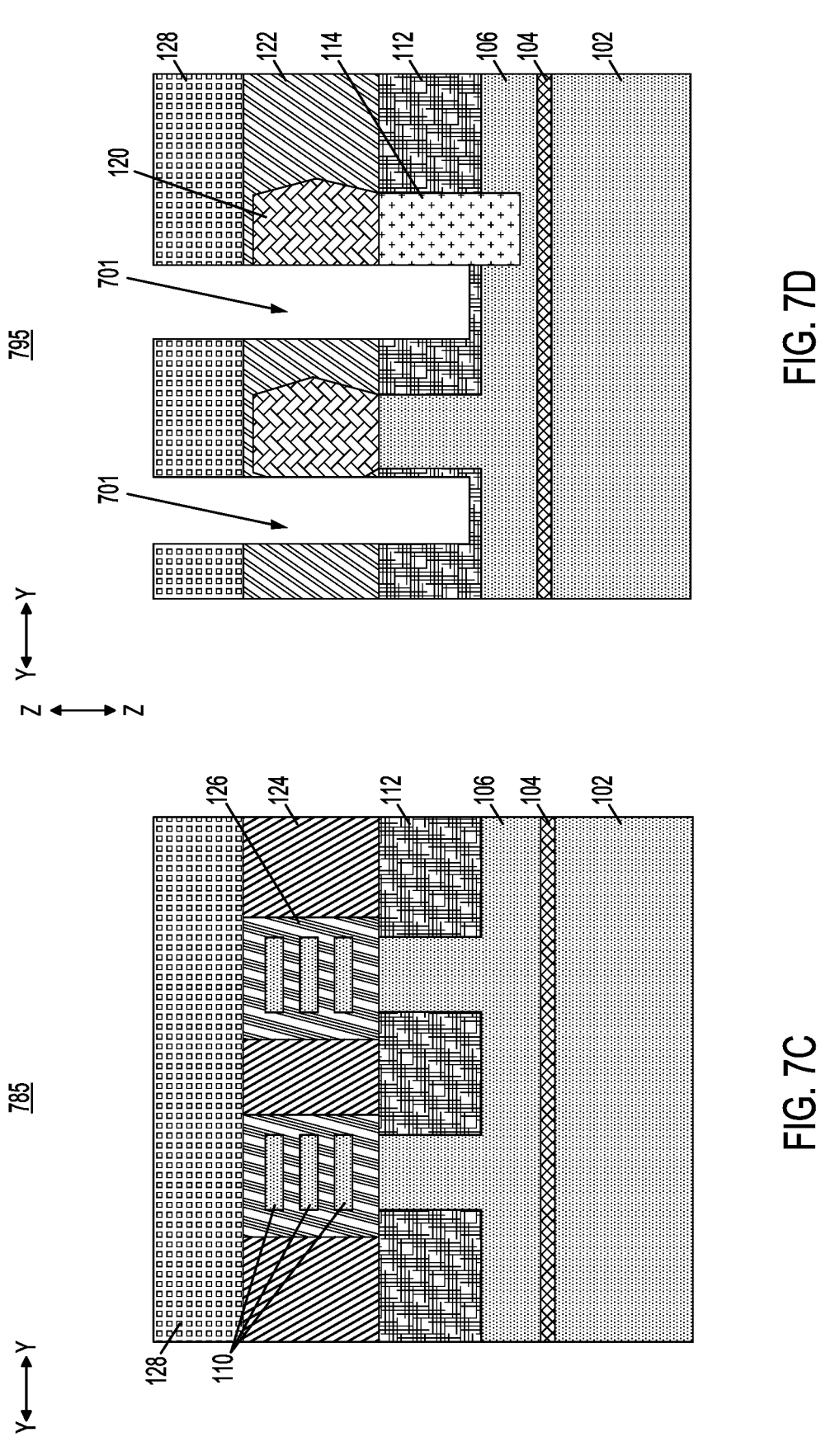
FIG. 7C depicts a third cross-sectional view of the structure of FIGS. 6A-6D following the selective etching of the interlayer dielectric layer and the shallow trench isolation regions, according to an embodiment of the invention.
FIG. 7D depicts a fourth cross-sectional view of the structure of FIGS. 6A-6D following the selective etching of the interlayer dielectric layer and the shallow trench isolation regions, according to an embodiment of the invention.

FIGS. 7A-7D show different views of the structure of FIGS. 6A-6D following selective etching of portions of the ILD layer 122 and the STI regions 112 exposed by the patterned OPL 128. The cross-sectional view 700 of FIG. 7A is taken along the line A-A shown in the top-down view 199 of FIG. 1E. The cross-sectional view 775 of FIG. 7B is taken along the line B-B shown in the top-down view 199 of FIG. 1E. The cross-sectional view 785 of FIG. 7C is taken along the line C-C shown in the top-down view 199 of FIG. 1E. The cross-sectional view 795 of FIG. 7D is taken along the line D-D shown in the top-down view 199 of FIG. 1E.

The exposed portions of the ILD layer 122 and STI regions 112 may be etched selective to the spacer layer 118 and the self-aligned gate isolation layer 124 to form trenches 701. As shown in FIGS. 7A and 7D, this etching does not go completely through the STI regions 112.

Figure 8B:
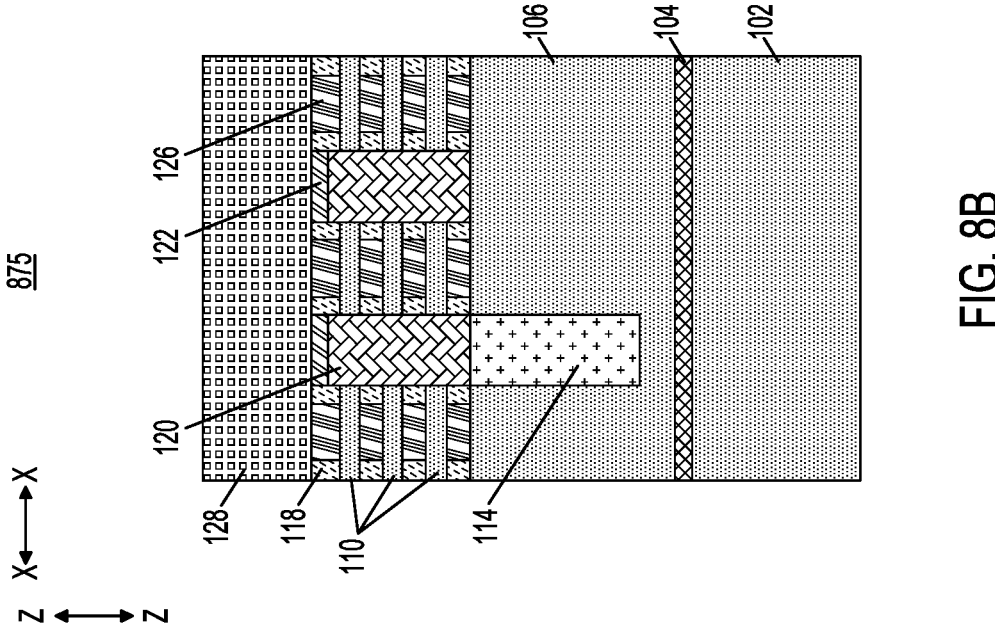
FIG. 8B depicts a second cross-sectional view of the structure of FIGS. 7A-7D following the lateral etching of the spacer layer and the shallow trench isolation regions, according to an embodiment of the invention.
Figure 8A:
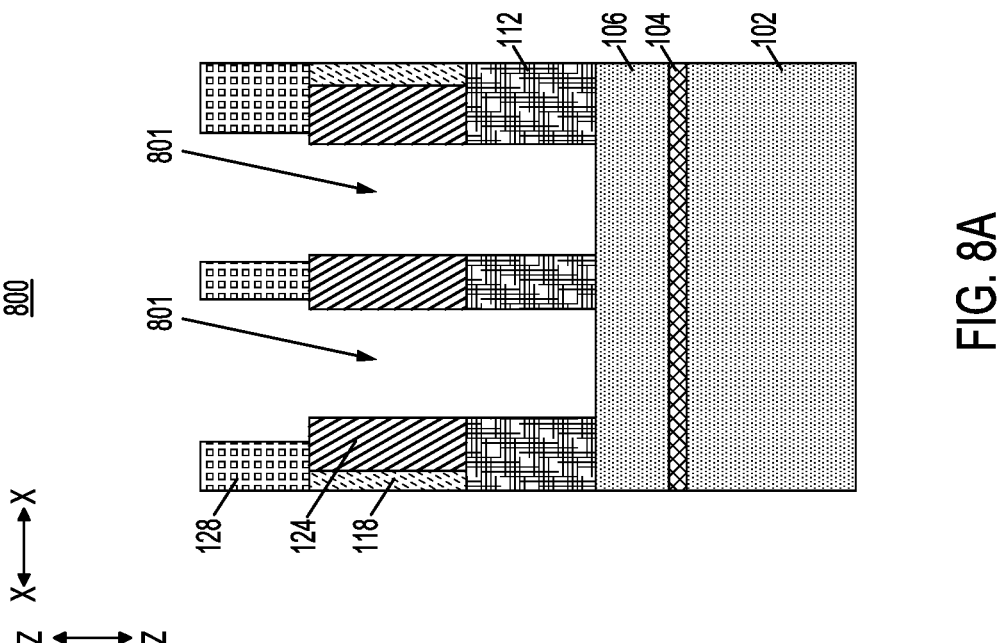
FIG. 8A depicts a first cross-sectional view of the structure of FIGS. 7A-7D following lateral etching of the spacer layer and the shallow trench isolation regions, according to an embodiment of the invention.
Figures 8C, 8D:
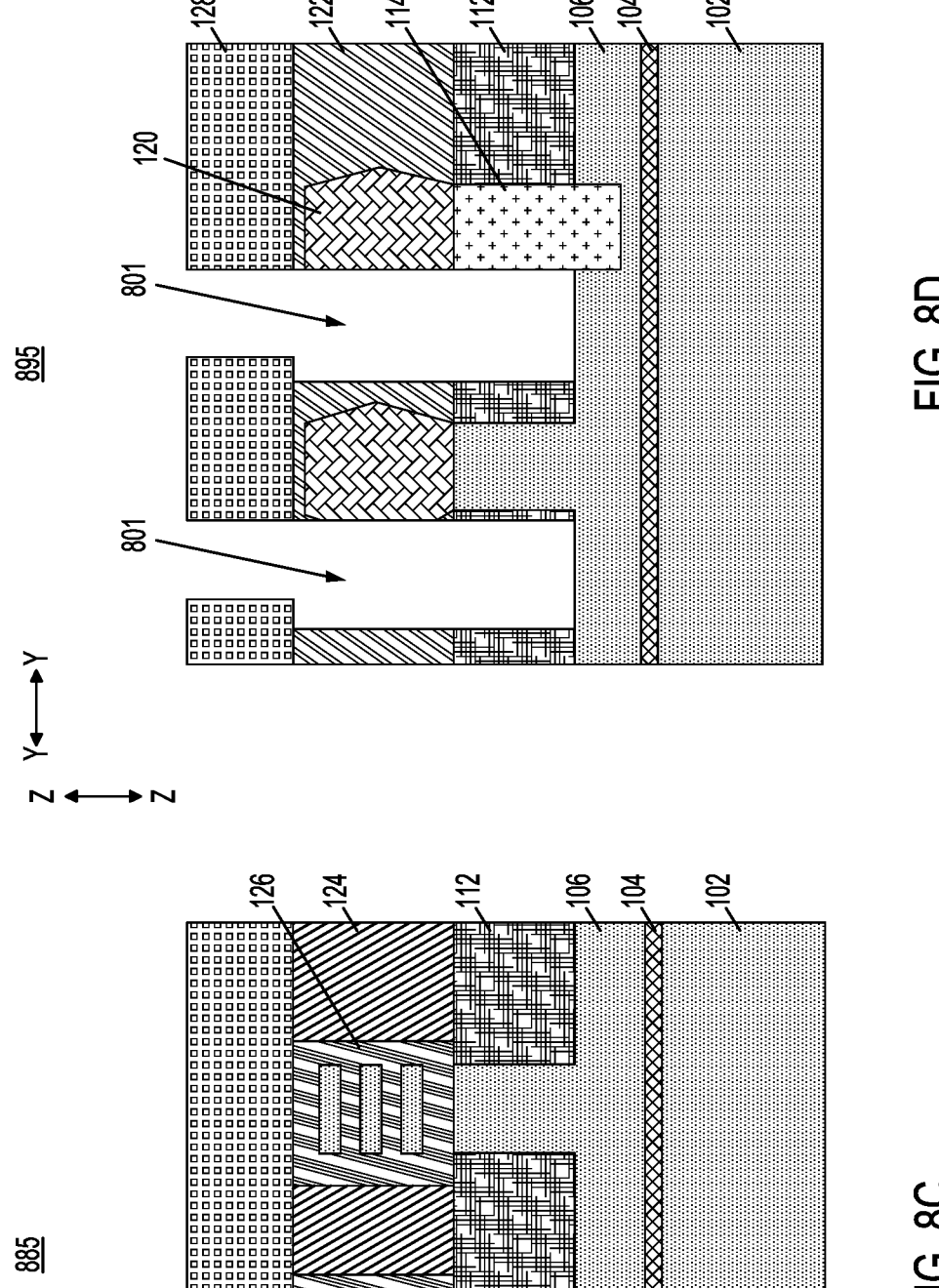
FIG. 8C depicts a third cross-sectional view of the structure of FIGS. 7A-7D following the lateral etching of the spacer layer and the shallow trench isolation regions, according to an embodiment of the invention.
FIG. 8D depicts a fourth cross-sectional view of the structure of FIGS. 7A-7D following the lateral etching of the spacer layer and the shallow trench isolation regions, according to an embodiment of the invention.

FIGS. 8A-8D show different views of the structure of FIGS. 7A-7D following lateral etching of portions of the spacer layer 118 and the STI regions 112. The cross-sectional view 800 of FIG. 8A is taken along the line A-A shown in the top-down view 199 of FIG. 1E. The cross-sectional view 875 of FIG. 8B is taken along the line B-B shown in the top-down view 199 of FIG. 1E. The cross-sectional view 885 of FIG. 8C is taken along the line C-C shown in the top-down view 199 of FIG. 1E. The cross-sectional view 895 of FIG. 8D is taken along the line D-D shown in the top-down view 199 of FIG. 1E.

Exposed portions of the spacer layer 118 and the STI regions 112 are etched laterally utilizing an isotropic dry or wet etch process to form trenches 801. The depth of the lateral etch may be approximately the thickness of the spacer layer 118.

Figure 9B:
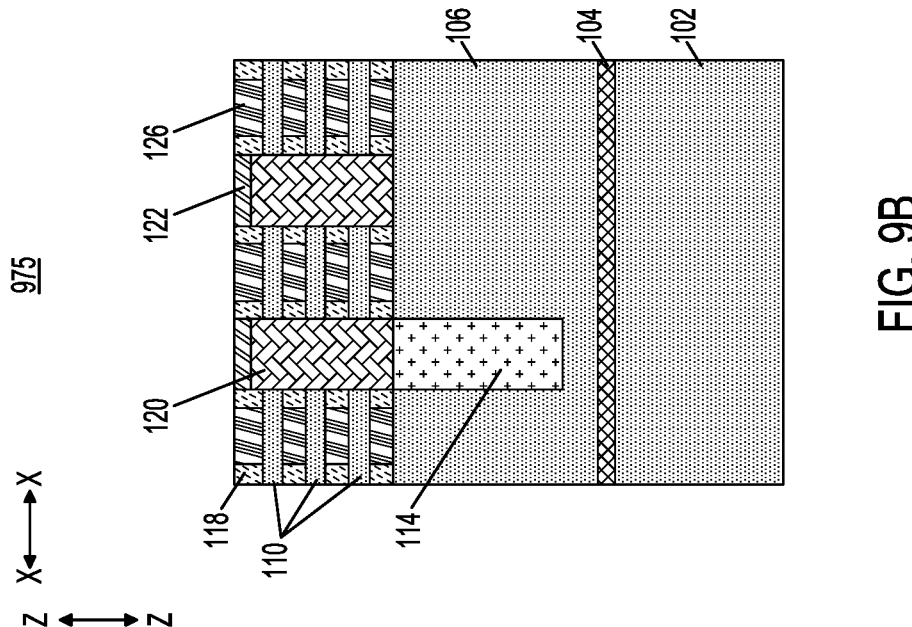
FIG. 9B depicts a second cross-sectional view of the structure of FIGS. 8A-8D following the formation of the dielectric spacer layers and the backside contact placeholder layers, according to an embodiment of the invention.
Figure 9A:
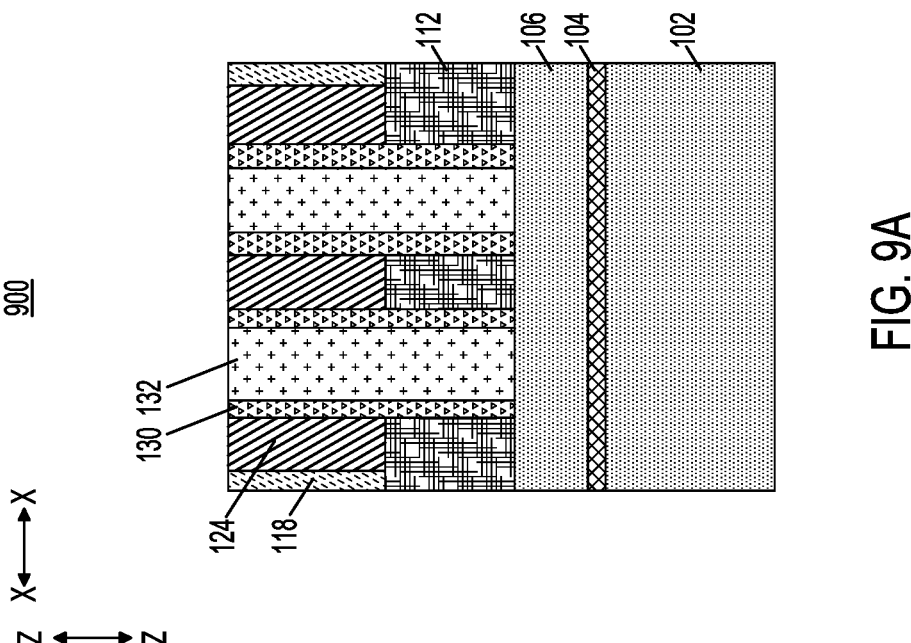
FIG. 9A depicts a first cross-sectional view of the structure of FIGS. 8A-8D following formation of dielectric spacer layers and backside contact placeholder layers, according to an embodiment of the invention.
Figure 9D:
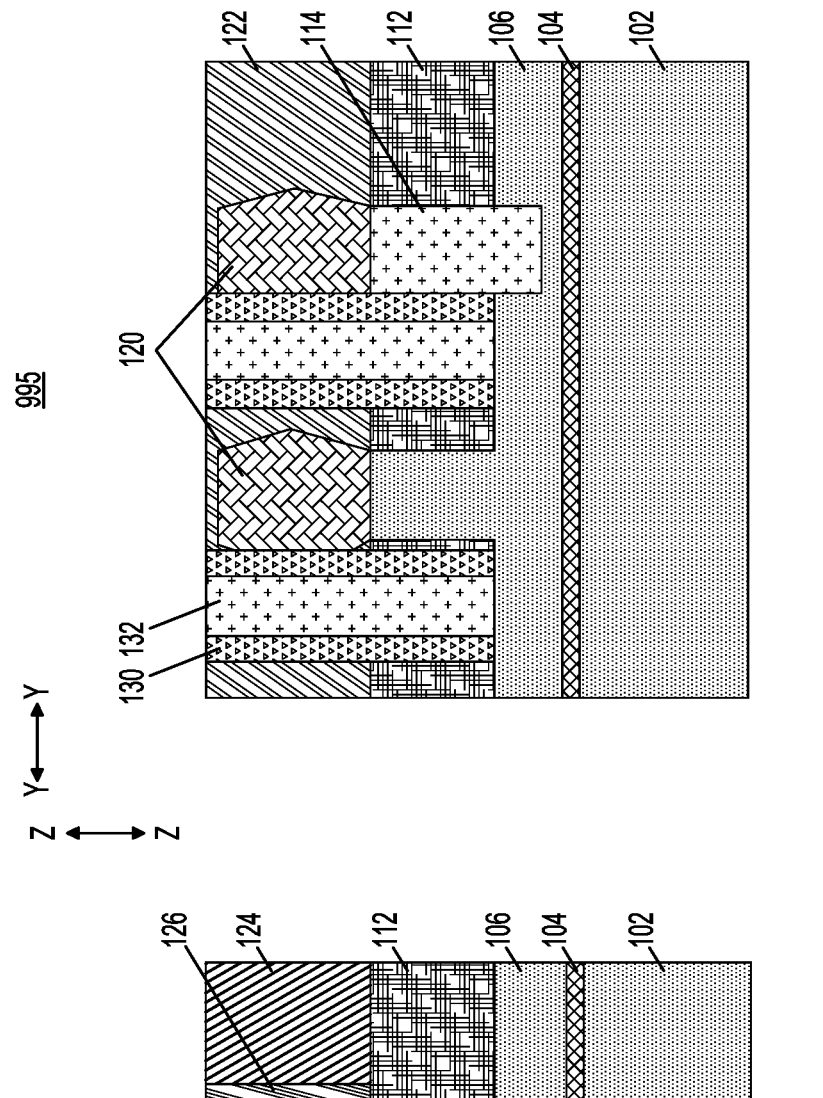
FIG. 9D depicts a fourth cross-sectional view of the structure of FIGS. 8A-8D following the formation of the dielectric spacer layers and the backside contact placeholder layers, according to an embodiment of the invention.
Figure 9C:
FIG. 9C depicts a third cross-sectional view of the structure of FIGS. 8A-8D following the formation of the dielectric spacer layers and the backside contact placeholder layers, according to an embodiment of the invention.

FIGS. 9A-9D show different views of the structure of FIGS. 8A-8D following formation of dielectric spacer layers 130 and backside contact placeholder layers 132. The cross-sectional view 900 of FIG. 9A is taken along the line A-A shown in the top-down view 199 of FIG. 1E. The cross-sectional view 975 of FIG. 9B is taken along the line B-B shown in the top-down view 199 of FIG. 1E. The cross-sectional view 985 of FIG. 9C is taken along the line C-C shown in the top-down view 199 of FIG. 1E. The cross-sectional view 995 of FIG. 9D is taken along the line D-D shown in the top-down view 199 of FIG. 1E.

The OPL 128 is removed, followed by formation of the dielectric spacer layers 130 on sidewalls of the trenches 801. The material for the dielectric spacer layers 130 may be blanket deposited, followed by a directional etch which removes the material for the dielectric spacer layers 130 from the top surface of the structure and the bottom of the trenches 801. The backside contact placeholder layers 132 are then formed to fill the remainder of the trenches 801 (e.g., by overfilling the structure followed by planarization (e.g., using CMP)).

The dielectric spacer layers 130 may be formed of any suitable dielectric material such as SiN, SiBCN, SiOCN, SiOC, $AlO_x$, $AlN_x$, etc. The dielectric spacer layers 130 may have a thickness (in direction X) in the range of 4 to 10 nm.

The backside contact placeholder layers 132 may be formed of similar materials as the backside contact placeholder layer 114.

Figure 10B:
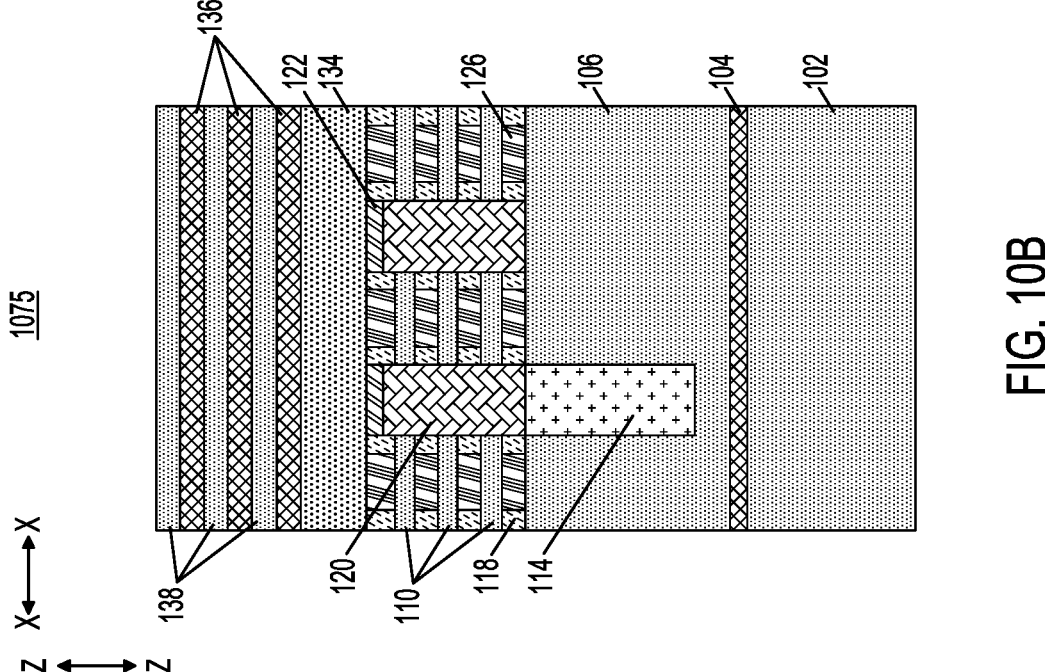
FIG. 10B depicts a second cross-sectional view of the structure of FIGS. 9A-9D following the bonding of the other nanosheet stack including the nanosheet channel layers for the top transistors of the stacked transistor structure, according to an embodiment of the invention.
Figure 10A:
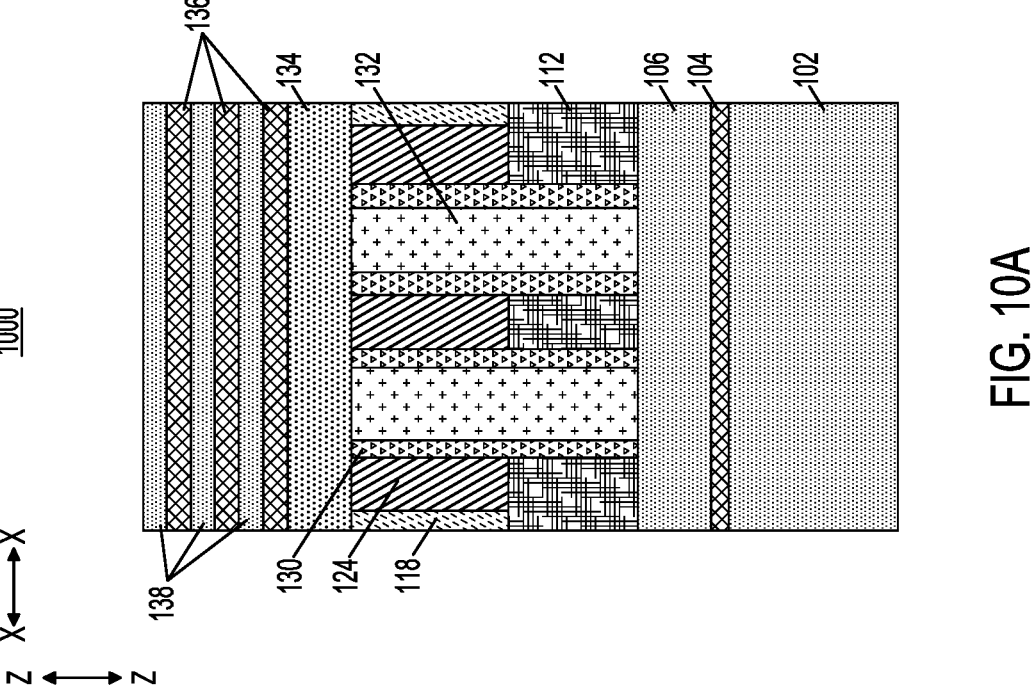
FIG. 10A depicts a first cross-sectional view of the structure of FIGS. 9A-9D following bonding of another nanosheet stack including nanosheet channel layers for top transistors of the stacked transistor structure, according to an embodiment of the invention.
Figures 10C, 10D:
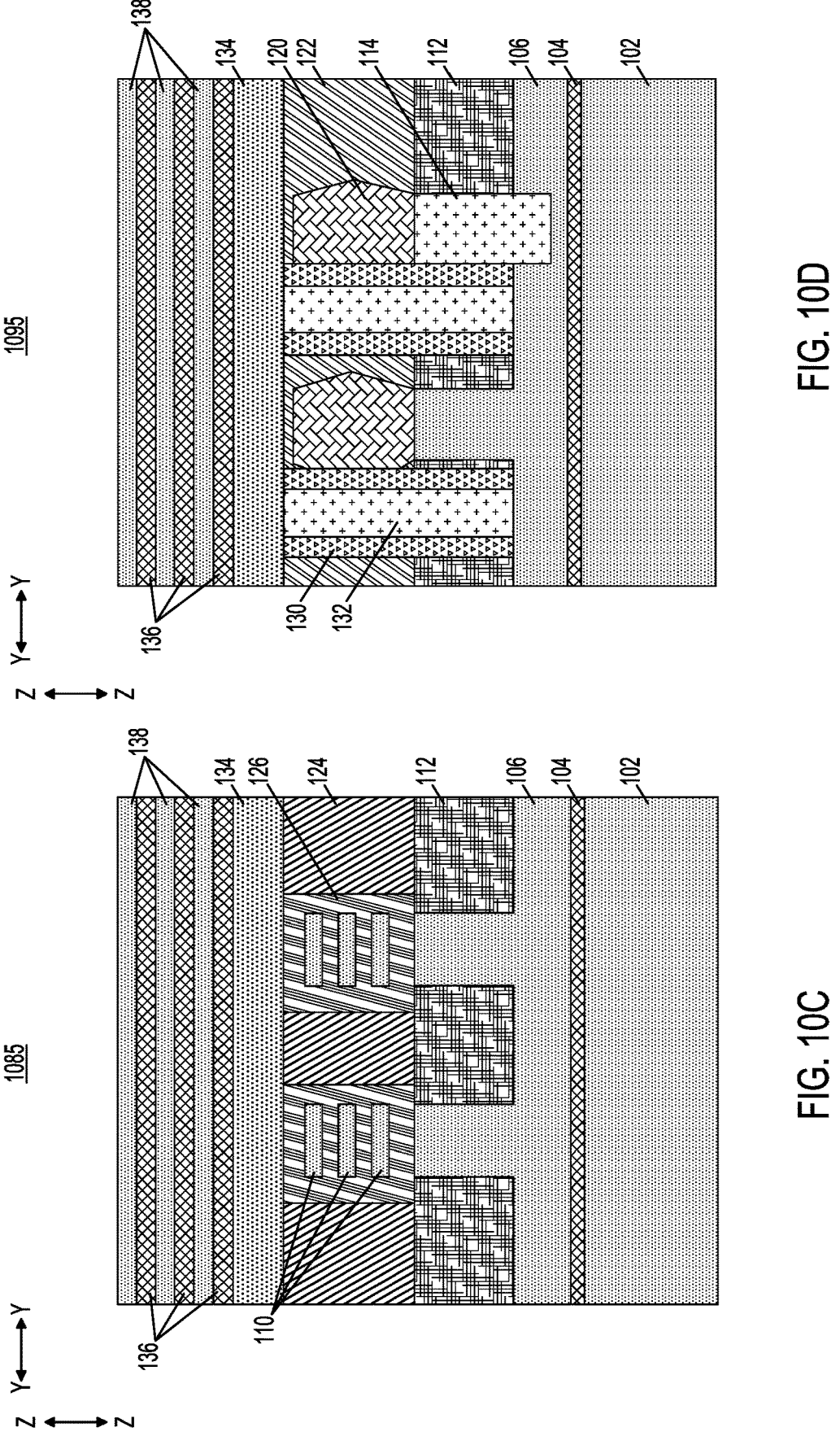
FIG. 10C depicts a third cross-sectional view of the structure of FIGS. 9A-9D following the bonding of the other nanosheet stack including the nanosheet channel layers for the top transistors of the stacked transistor structure, according to an embodiment of the invention.
FIG. 10D depicts a fourth cross-sectional view of the structure of FIGS. 9A-9D following the bonding of the other nanosheet stack including the nanosheet channel layers for the top transistors of the stacked transistor structure, according to an embodiment of the invention.

FIGS. 10A-10D show different views of the structure of FIGS. 9A-9D following bonding, via a bonding oxide 134, to another nanosheet stack for top transistors of the stacked transistor structure, the nanosheet stack including alternating sacrificial layers 136 and nanosheet channel layers 138. The cross-sectional view 1000 of FIG. 10A is taken along the line A-A shown in the top-down view 199 of FIG. 1E. The cross-sectional view 1075 of FIG. 10B is taken along the line B-B shown in the top-down view 199 of FIG. 1E. The cross-sectional view 1085 of FIG. 10C is taken along the line C-C shown in the top-down view 199 of FIG. 1E. The cross-sectional view 1095 of FIG. 10D is taken along the line D-D shown in the top-down view 199 of FIG. 1E.

Another Si wafer has the nanosheet stack of the sacrificial layers 136 and the nanosheet channel layers 138 formed on the top, followed by deposition of the bonding oxide 134 to the nanosheet stack of the sacrificial layers 136 and the nanosheet channel layers 138. The bonding oxide 134 is then bonded to the existing wafer through an oxide-to-oxide bonding process. After the wafer bonding the Si wafer is removed leaving the nanosheet stack of the sacrificial layers 136 and the nanosheet channel layers 138 on the bonding oxide 134. The sacrificial layers 136 may be formed of similar materials and with similar sizing as the sacrificial layers 108. The nanosheet channel layers 138 may be formed of similar materials and with similar sizing as the nanosheet channel layers 110.

Figure 11B:
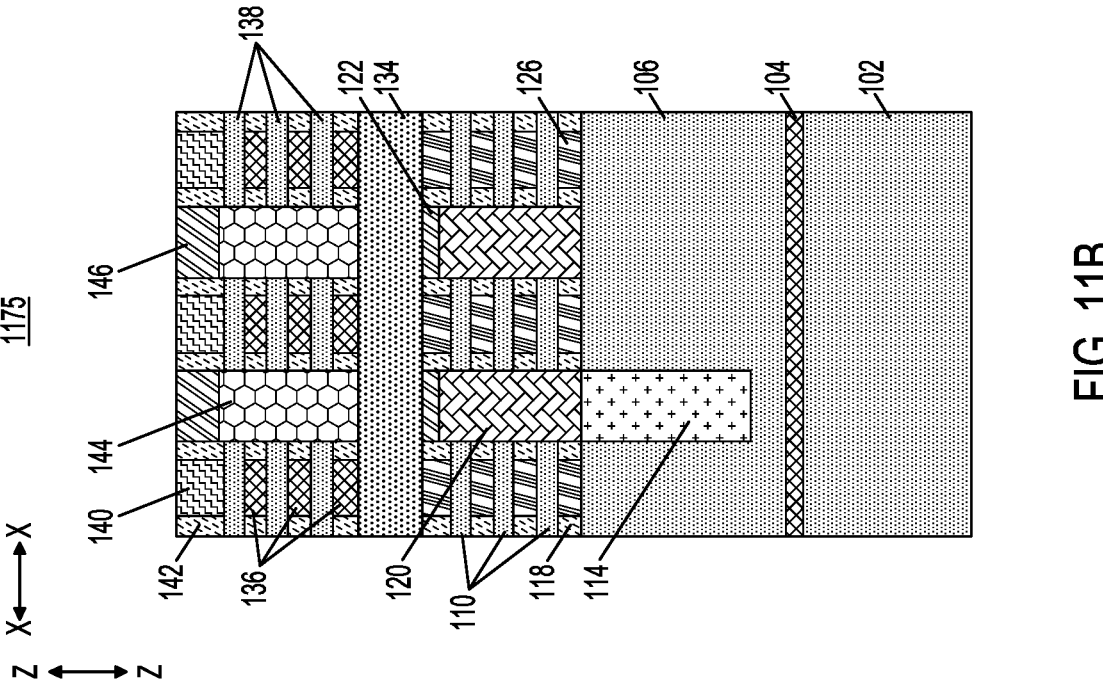
FIG. 11B depicts a second cross-sectional view of the structure of FIGS. 10A-10D following the formation of the top dummy gate layer, the spacer layer, the source/drain regions for the top transistors of the stacked transistor structure, and the interlayer dielectric layer, according to an embodiment of the invention.
Figure 11A:
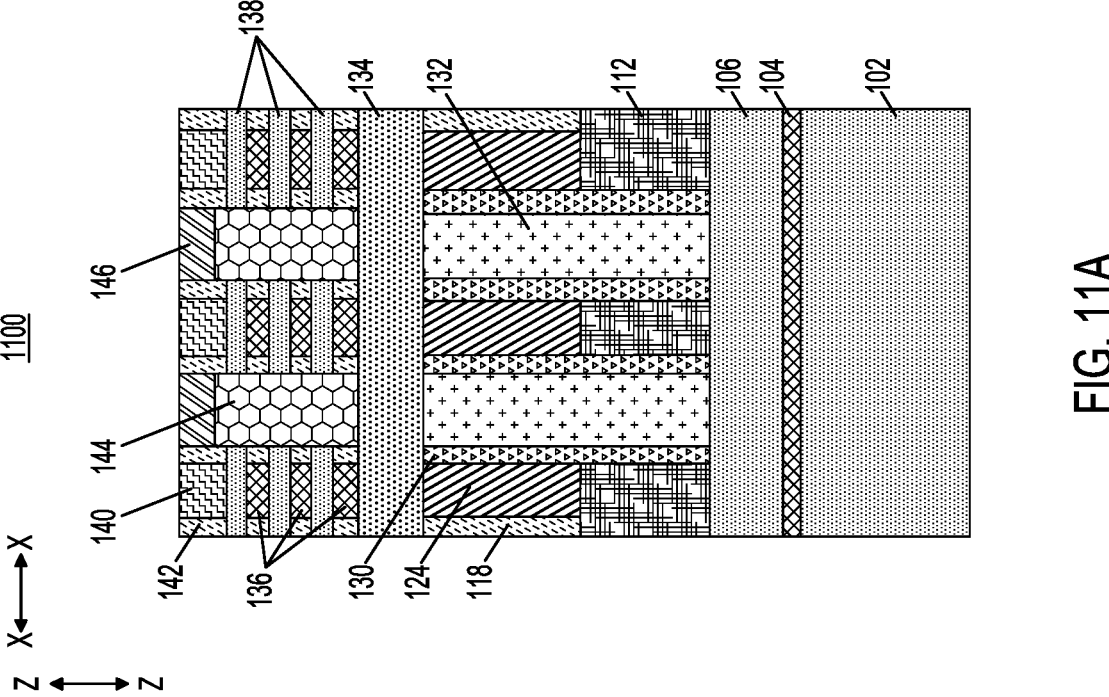
FIG. 11A depicts a first cross-sectional view of the structure of FIGS. 10A-10D following formation of a top dummy gate layer, a spacer layer, source/drain regions for the top transistors of the stacked transistor structure, and an interlayer dielectric layer, according to an embodiment of the invention.
Figures 11C, 11D:
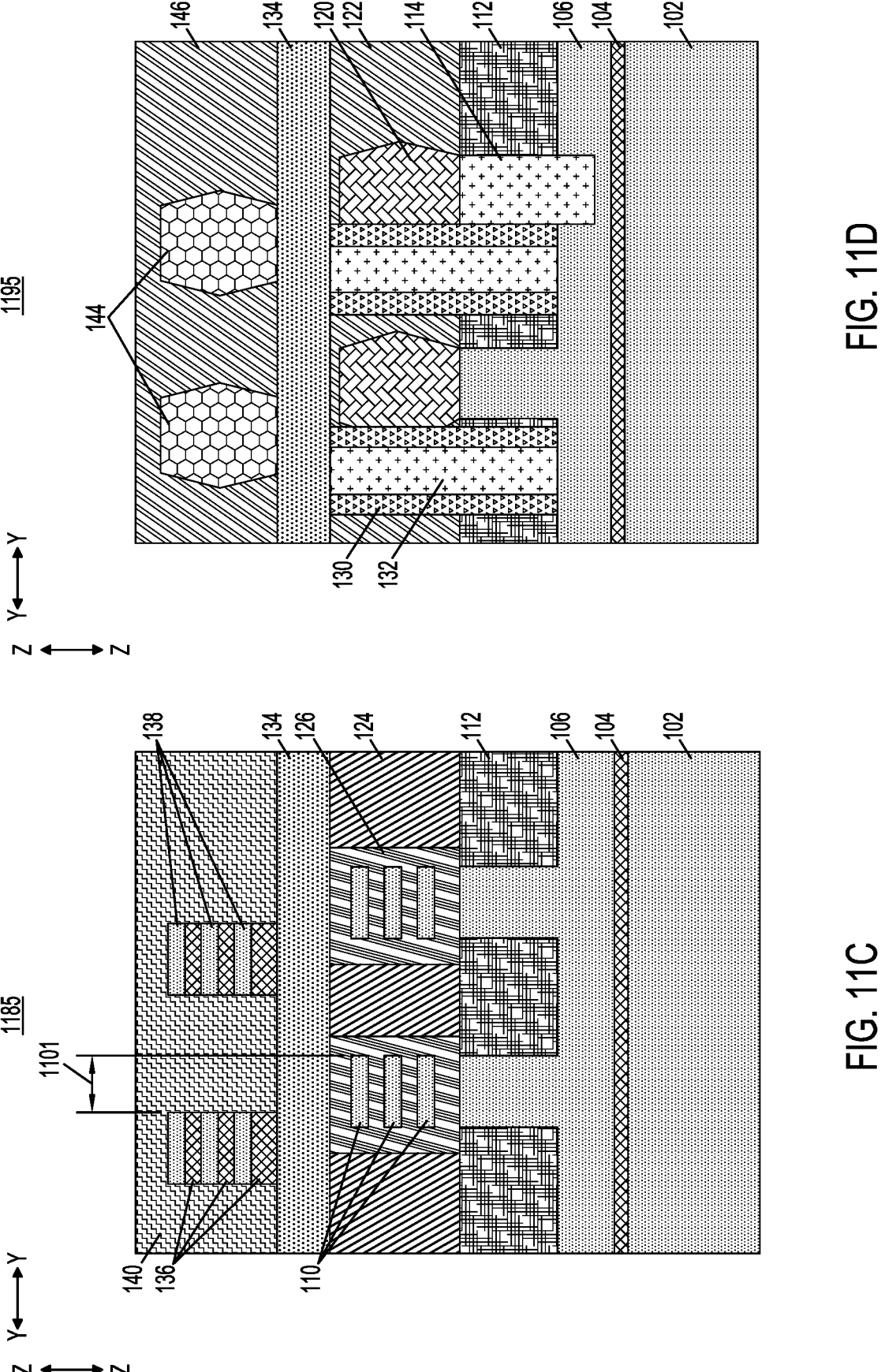
FIG. 11C depicts a third cross-sectional view of the structure of FIGS. 10A-10D following the formation of the top dummy gate layer, the spacer layer, the source/drain regions for the top transistors of the stacked transistor structure, and the interlayer dielectric layer, according to an embodiment of the invention.
FIG. 11D depicts a fourth cross-sectional view of the structure of FIGS. 10A-10D following the formation of the top dummy gate layer, the spacer layer, the source/drain regions for the top transistors of the stacked transistor structure, and the interlayer dielectric layer, according to an embodiment of the invention.

FIGS. 11A-11D show different views of the structure of FIGS. 10A-10D following formation of a top dummy gate layer 140, a spacer layer 142, source/drain regions 144 for the top transistors of the stacked transistor structure, and ILD layer 146. The cross-sectional view 1100 of FIG. 11A is taken along the line A-A shown in the top-down view 199 of FIG. 1E. The cross-sectional view 1175 of FIG. 11B is taken along the line B-B shown in the top-down view 199 of FIG. 1E. The cross-sectional view 1185 of FIG. 11C is taken along the line C-C shown in the top-down view 199 of FIG. 1E. The cross-sectional view 1195 of FIG. 11D is taken along the line D-D shown in the top-down view 199 of FIG. 1E.

The top dummy gate layer 140, spacer layer 142, source/drain regions 144 and ILD layer 146 may be formed using similar processing and with similar sizing and materials as the bottom dummy gate layer 116, the spacer layer 118, the source/drain regions 120 and the ILD layer 122, respectively. It should be noted that, in some embodiments, the top and bottom transistors of the staked transistor structure have different polarities (e.g., the top transistors are n-type and the bottom transistors are p-type, or vice versa) and thus the source/drain regions 120 and source/drain regions 144 may utilize different dopants corresponding to such different polarities. As illustrated in the cross-sectional view 1185 of FIG. 11C, the nanosheet channel layers 138 for the top transistors of the stacked transistor structure are horizontally offset a lateral distance 1101 from the nanosheet channel layers 110 for the bottom transistors of the stacked transistor structure.

Figure 12B:
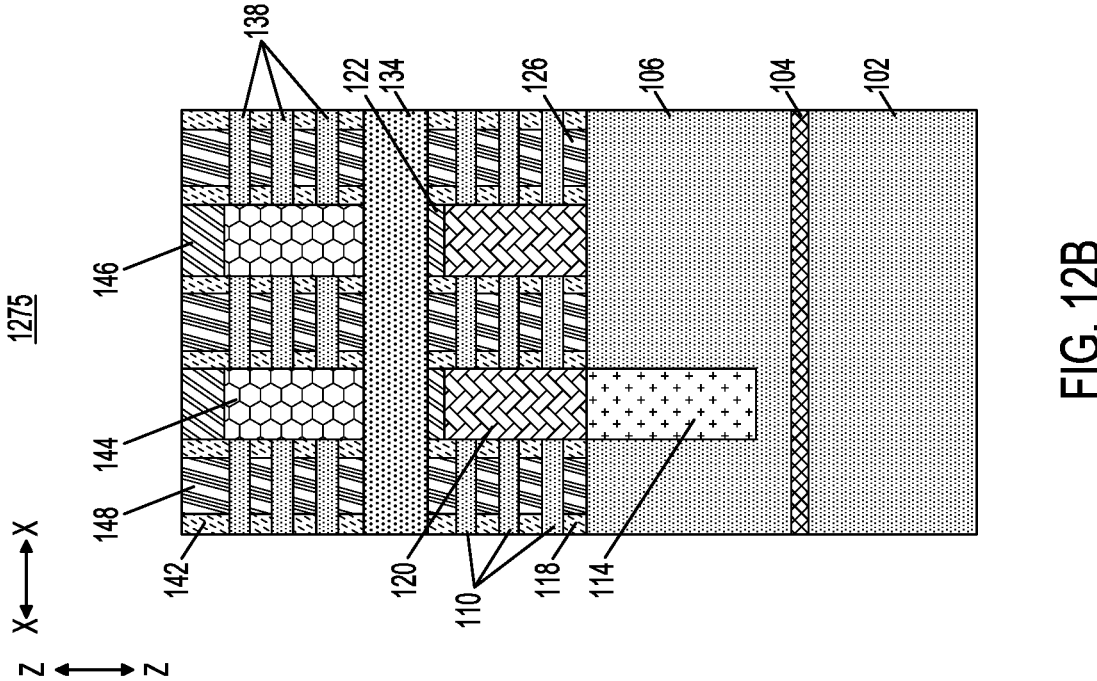
FIG. 12B depicts a second cross-sectional view of the structure of FIGS. 11A-11D following the formation of the gate stack for the top transistors of the stacked transistor structure, according to an embodiment of the invention.
Figure 12A:
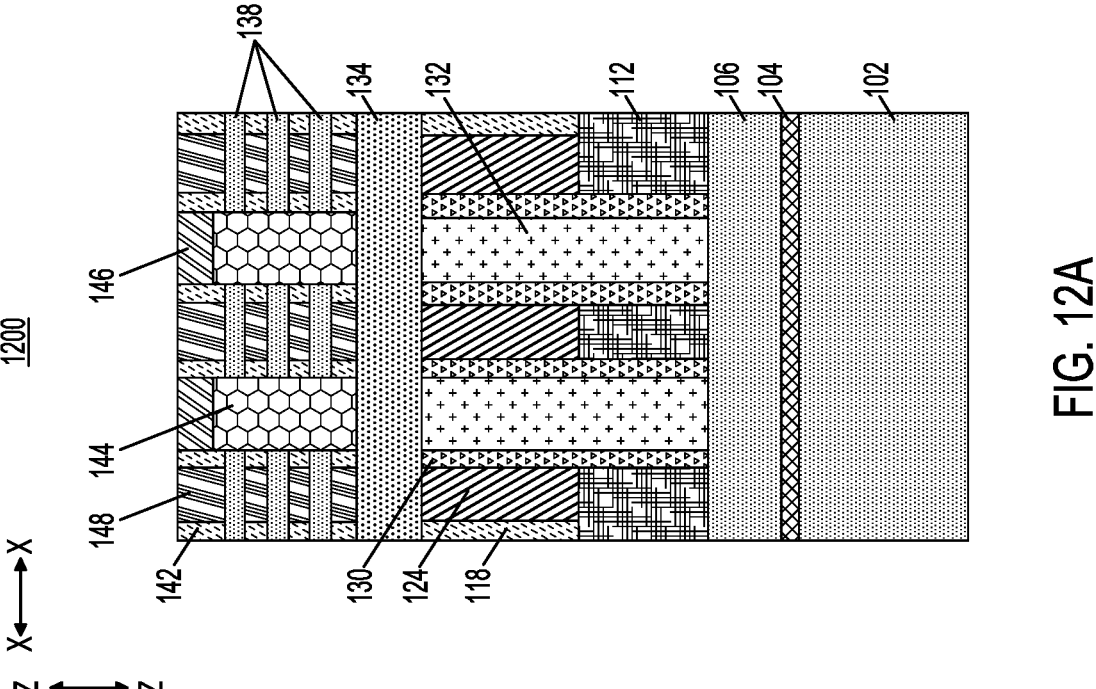
FIG. 12A depicts a first cross-sectional view of the structure of FIGS. 11A-11D following formation of a gate stack for the top transistors of the stacked transistor structure, according to an embodiment of the invention.
Figures 12C, 12D:
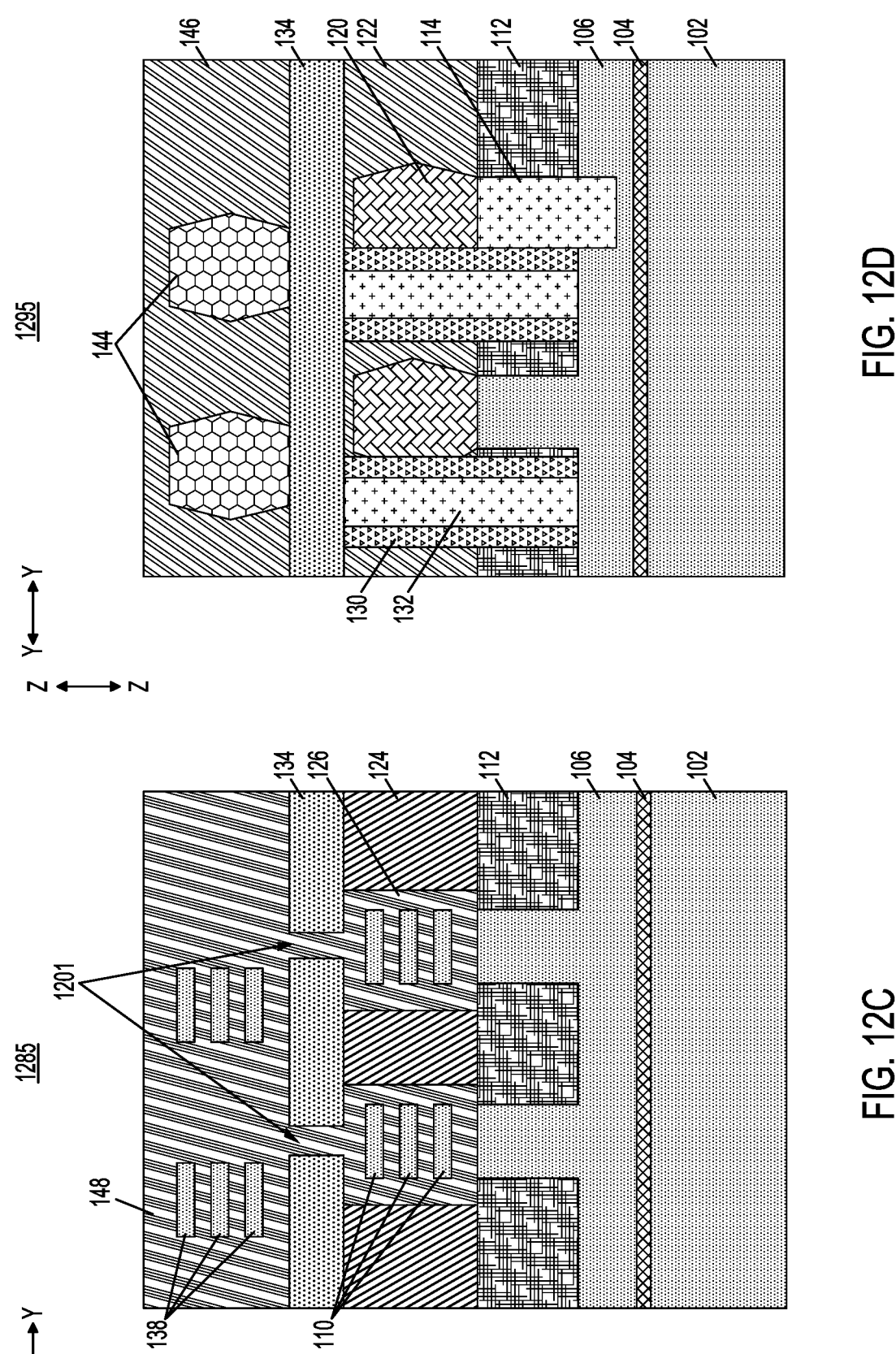
FIG. 12C depicts a third cross-sectional view of the structure of FIGS. 11A-11D following the formation of the gate stack for the top transistors of the stacked transistor structure, according to an embodiment of the invention.
FIG. 12D depicts a fourth cross-sectional view of the structure of FIGS. 11A-11D following the formation of the gate stack for the top transistors of the stacked transistor structure, according to an embodiment of the invention.

FIGS. 12A-12D show different views of the structure of FIGS. 11A-11D following formation of a gate stack 148 for the top transistors of the stacked transistor structure. The cross-sectional view 1200 of FIG. 12A is taken along the line A-A shown in the top-down view 199 of FIG. 1E. The cross-sectional view 1275 of FIG. 12B is taken along the line B-B shown in the top-down view 199 of FIG. 1E. The cross-sectional view 1285 of FIG. 12C is taken along the line C-C shown in the top-down view 199 of FIG. 1E. The cross-sectional view 1295 of FIG. 12D is taken along the line D-D shown in the top-down view 199 of FIG. 1E.

The gate stack 148 may be formed of similar materials and with similar processing as the gate stack 126. The top dummy gate layer 140 is removed, followed by removal of the sacrificial layers 136, deposition of a gate dielectric layer of the gate stack 148, a reliability anneal, patterning of shared gate openings 1201 in the bonding oxide 134, and formation of the gate conductor of the gate stack 148 (e.g., a gate WFM layer and a gate metal layer).

Figure 13B:
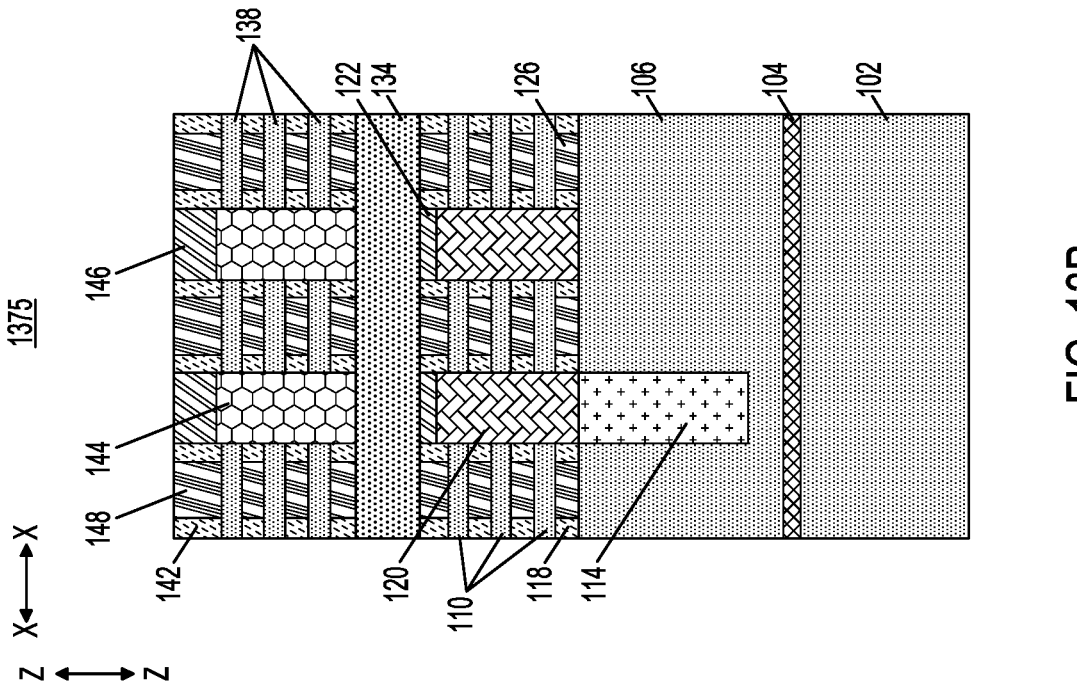
FIG. 13B depicts a second cross-sectional view of the structure of FIGS. 12A-12D following the gate cut for the top transistors of the stacked transistor structure and the formation of the dielectric spacer layers and the frontside contact placeholder layers, according to an embodiment of the invention.
Figure 13A:
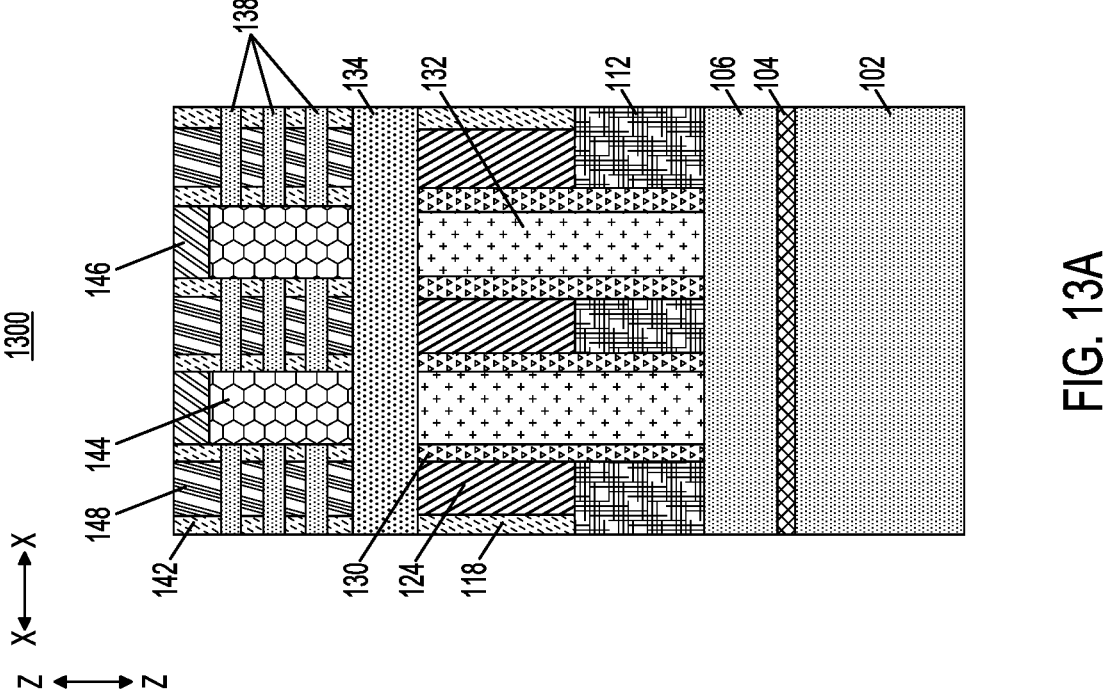
FIG. 13A depicts a first cross-sectional view of the structure of FIGS. 12A-12D following a gate cut for the top transistors of the stacked transistor structure and formation of dielectric spacer layers and frontside contact placeholder layers, according to an embodiment of the invention.
Figure 13D:
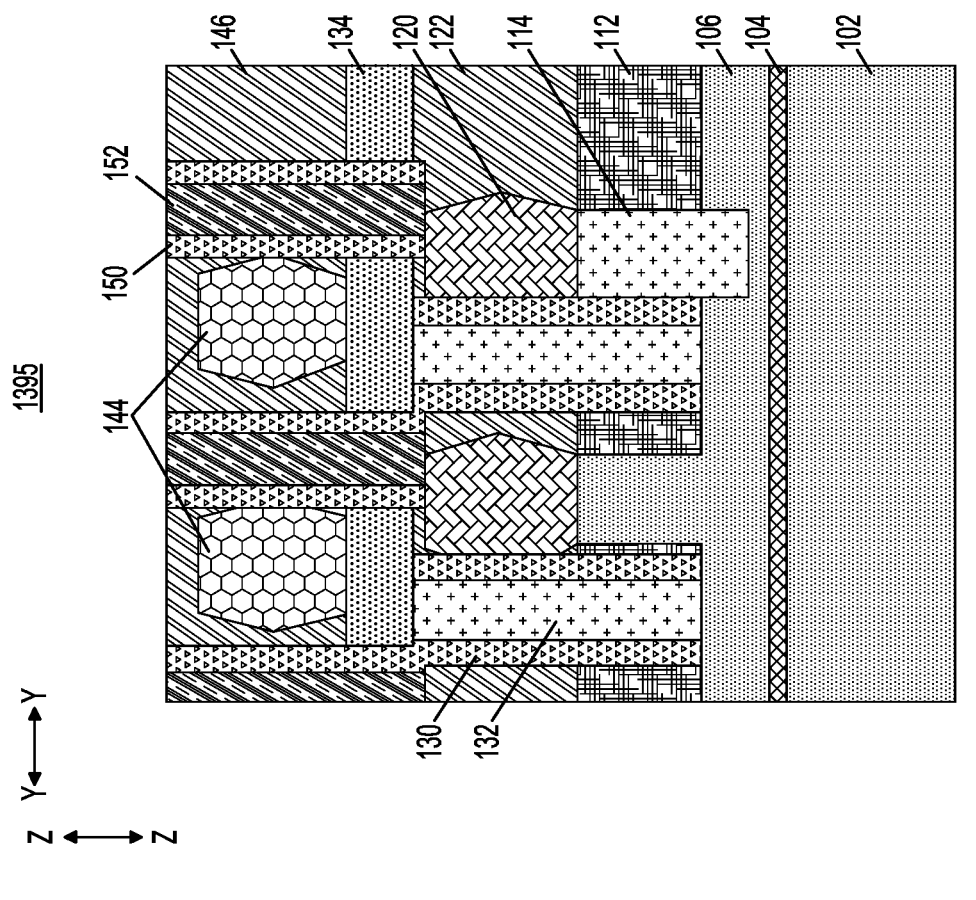
FIG. 13D depicts a fourth cross-sectional view of the structure of FIGS. 12A-12D following the gate cut for the top transistors of the stacked transistor structure and the formation of the dielectric spacer layers and the frontside contact placeholder layers, according to an embodiment of the invention.
Figure 13C:
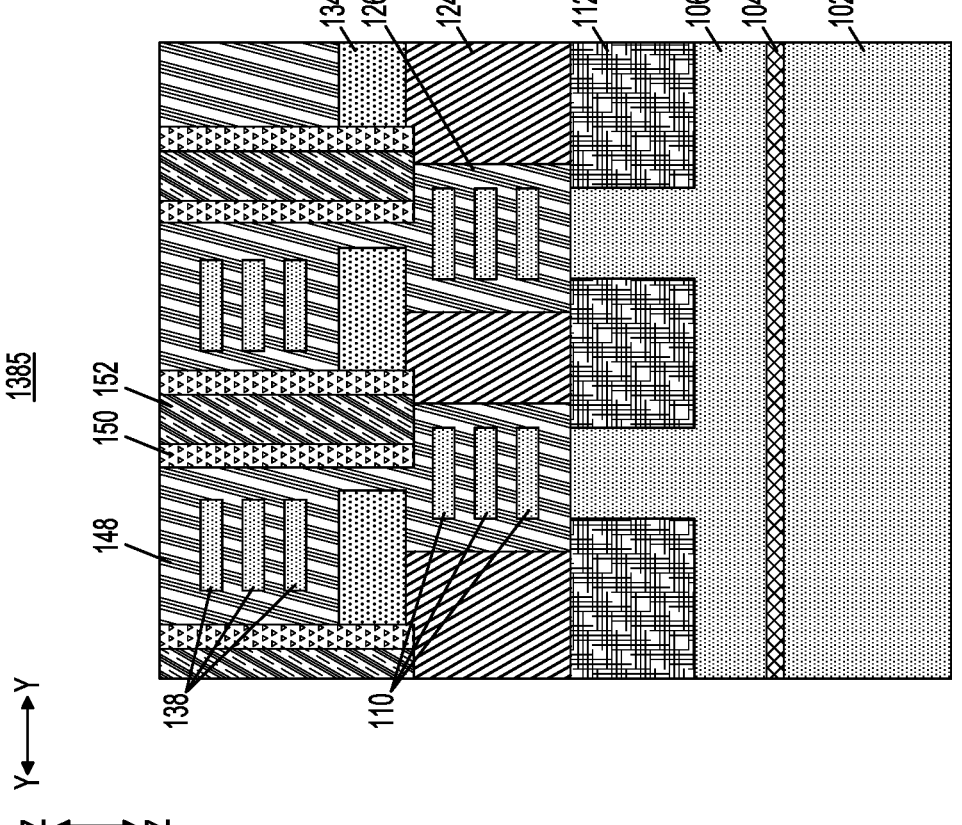
FIG. 13C depicts a third cross-sectional view of the structure of FIGS. 12A-12D following the gate cut for the top transistors of the stacked transistor structure and the formation of the dielectric spacer layers and the frontside contact placeholder layers, according to an embodiment of the invention.

FIGS. 13A-13D show different views of the structure of FIGS. 12A-12D following a gate cut for the top transistors of the stacked transistor structure and formation of dielectric spacer layers 150 and frontside contact placeholder layers 152. The cross-sectional view 1300 of FIG. 13A is taken along the line A-A shown in the top-down view 199 of FIG. 1E. The cross-sectional view 1375 of FIG. 13B is taken along the line B-B shown in the top-down view 199 of FIG. 1E. The cross-sectional view 1385 of FIG. 13C is taken along the line C-C shown in the top-down view 199 of FIG. 1E. The cross-sectional view 1395 of FIG. 13D is taken along the line D-D shown in the top-down view 199 of FIG. 1E.

The gate cut for the top transistors may be performed by patterning a mask over the structure, and then etching through exposed portions of the gate stack 148 and the bonding oxide 134 down to top surfaces of the source/drain regions 120. The dielectric spacer layers 150 are then formed using similar processing and with similar materials and sizing as that described above with respect to the dielectric spacer layers 130. The frontside contact place-holder layers 152 may be formed using similar processing as that described above with respect to the backside contact placeholder layers 132. The frontside contact placeholder layers 152 may be formed of a dielectric material such as SiO₂ or a low-k oxide.

Figure 14B:
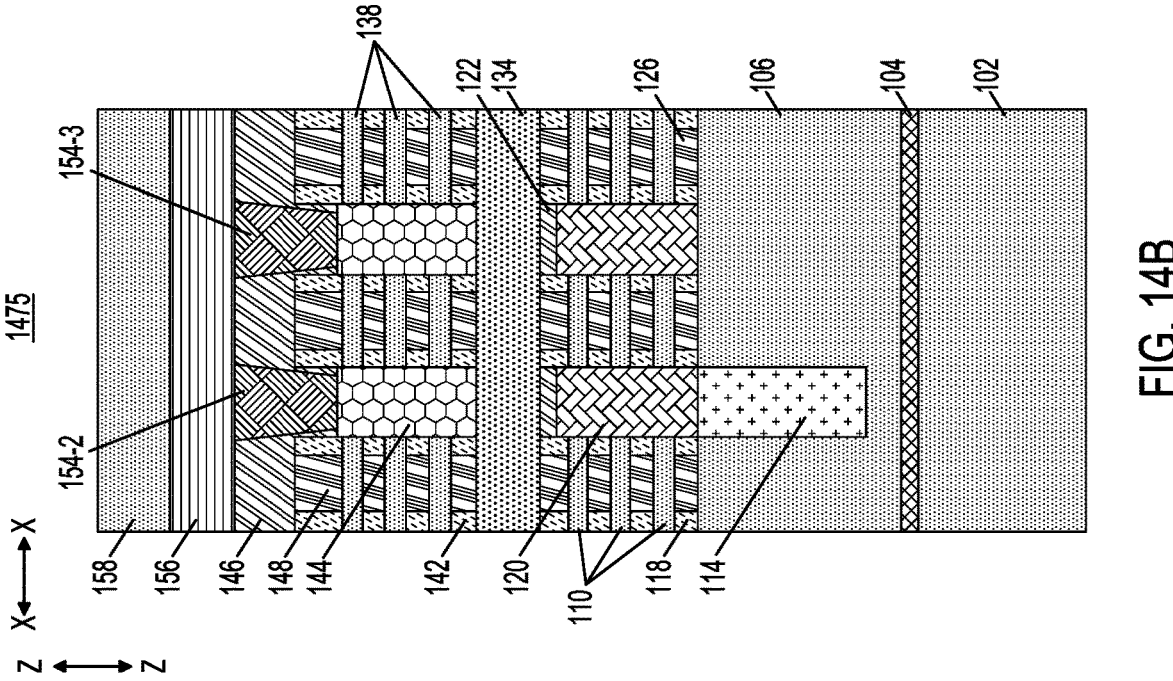
FIG. 14B depicts a second cross-sectional view of the structure of FIGS. 13A-13D following the formation of the frontside interconnects and the back-end-of-line regions, and following the bonding to the carrier wafer, according to an embodiment of the invention.
Figure 14A:
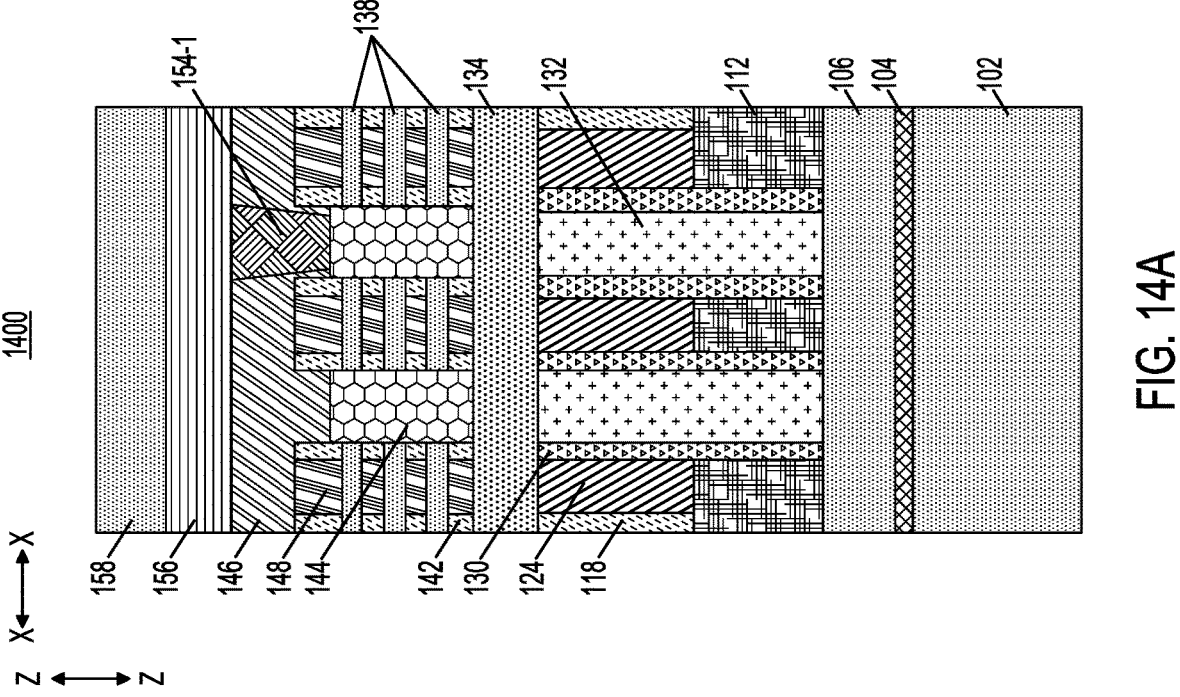
FIG. 14A depicts a first cross-sectional view of the structure of FIGS. 13A-13D following formation of frontside interconnects and back-end-of-line regions, and following bonding to a carrier wafer, according to an embodiment of the invention.
Figure 14D:
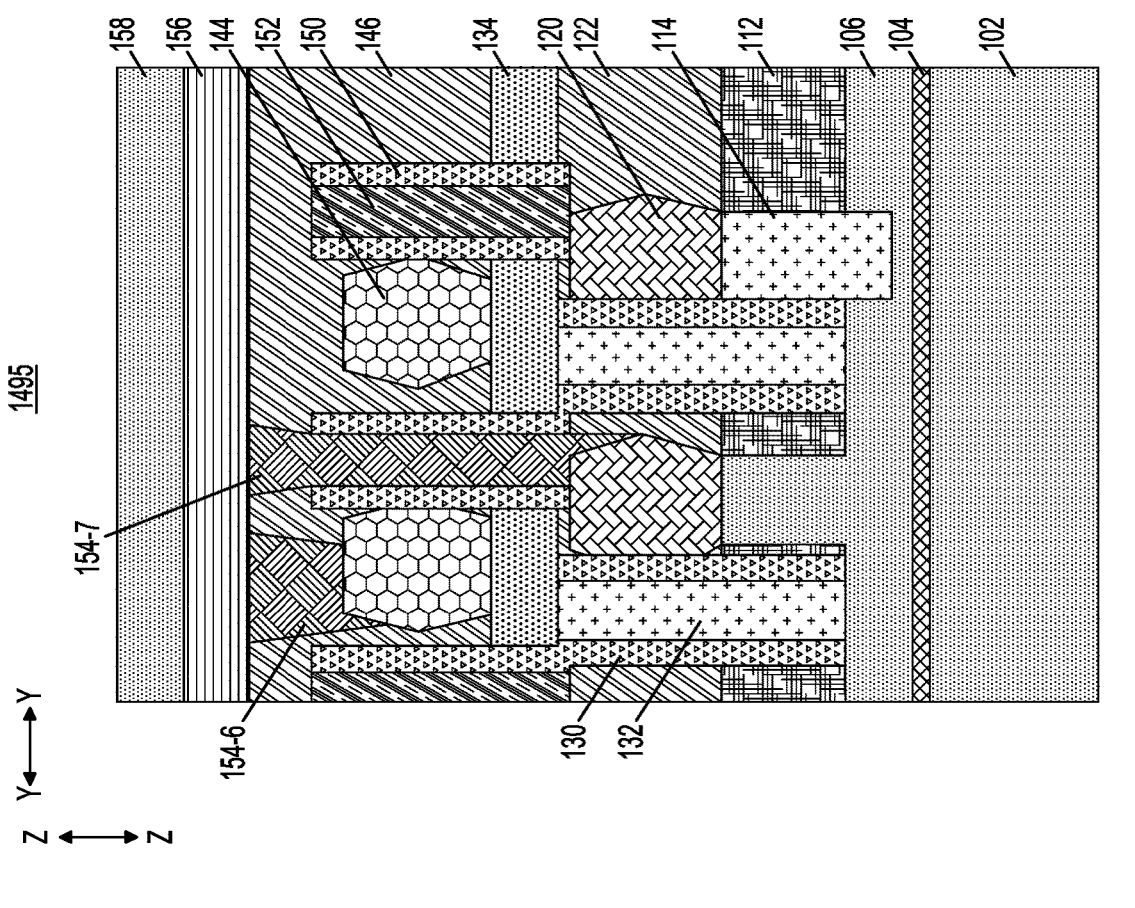
FIG. 14D depicts a fourth cross-sectional view of the structure of FIGS. 13A-13D following the formation of the frontside interconnects and the back-end-of-line regions, and following the bonding to the carrier wafer, according to an embodiment of the invention.
Figure 14C:
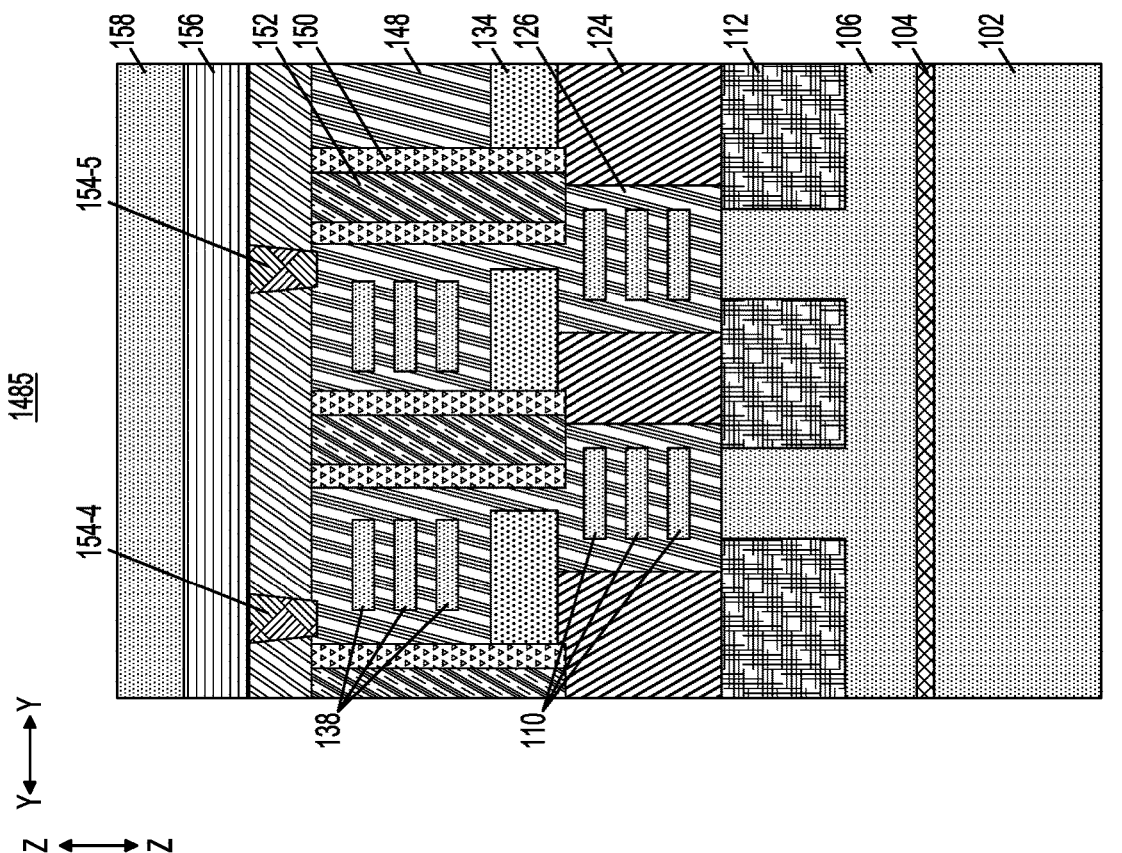
FIG. 14C depicts a third cross-sectional view of the structure of FIGS. 13A-13D following the formation of the frontside interconnects and the back-end-of-line regions, and following the bonding to the carrier wafer, according to an embodiment of the invention.

FIGS. 14A-14D show different views of the structure of FIGS. 13A-13D following formation of frontside interconnects 154-1, 154-2, 154-3, 154-4, 154-5, 154-6 and 154-7, and following formation of a back-end-of-line (BEOL) region 156 and bonding to a carrier wafer 158. The cross-sectional view 1400 of FIG. 14A is taken along the line A-A shown in the top-down view 199 of FIG. 1E. The cross-sectional view 1475 of FIG. 14B is taken along the line B-B shown in the top-down view 199 of FIG. 1E. The cross-sectional view 1485 of FIG. 14C is taken along the line C-C shown in the top-down view 199 of FIG. 1E. The cross-sectional view 1495 of FIG. 14D is taken along the line D-D shown in the top-down view 199 of FIG. 1E.

The frontside interconnects 154-1 through 154-7 are formed by patterning a mask layer over the structure, and then etching exposed portions of the structure to form frontside interconnect trenches. Material (e.g., a conducting metal) for the frontside interconnects 154-1 through 154-7 is then deposited in the frontside interconnect trenches. The frontside interconnects 154-1, 154-2, 154-3 and 154-4 are connected to the source/drain regions 144 for the top transistors of the stacked transistor structure. The frontside interconnects 154-5 and 154-6 are connected to the gate stack 148 (which is electrically connected to the gate stack 126 via the above-described trenches formed through the bonding oxide 134). The frontside interconnect 154-7 is connected to the source/drain regions 120 of the bottom transistors of the stacked transistor structure. The frontside interconnect 154-7 provides for a self-aligned contact that partially wraps around the source/drain regions 120. The BEOL region 156 is then formed over the structure, followed by bonding to the carrier wafer 158. The carrier wafer 158 may be formed of Si or another suitable material.

Figure 15A:
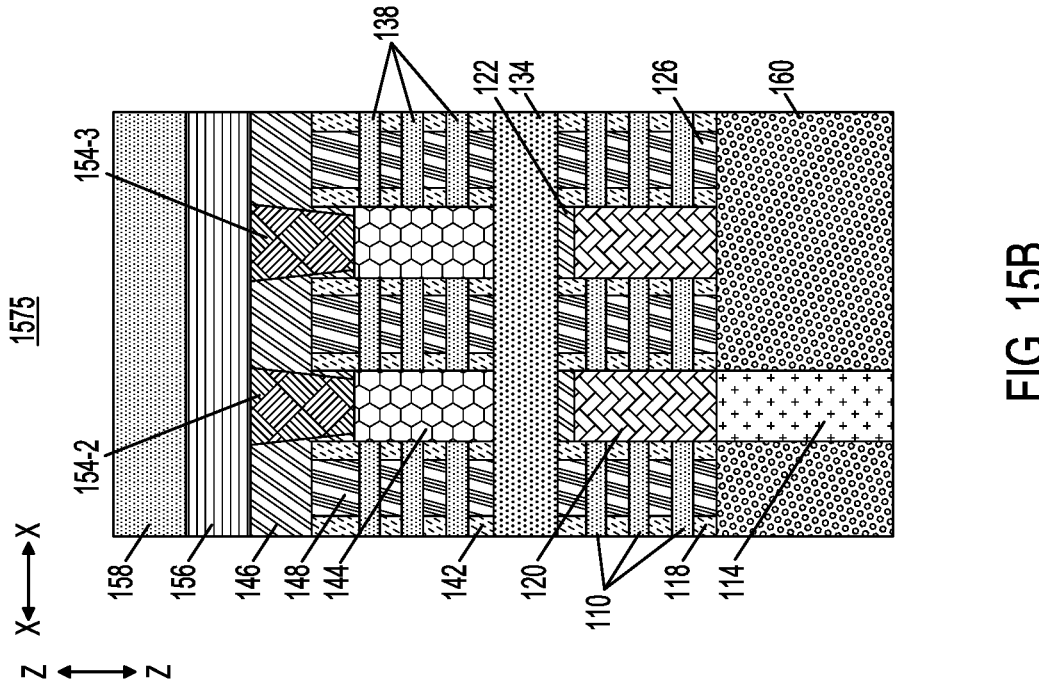
FIG. 15A depicts a first cross-sectional view of the structure of FIGS. 14A-14D following removal of the substrates and etch stop layer from the backside, and following formation of a backside interlayer dielectric layer, according to an embodiment of the invention.
Figure 15B:
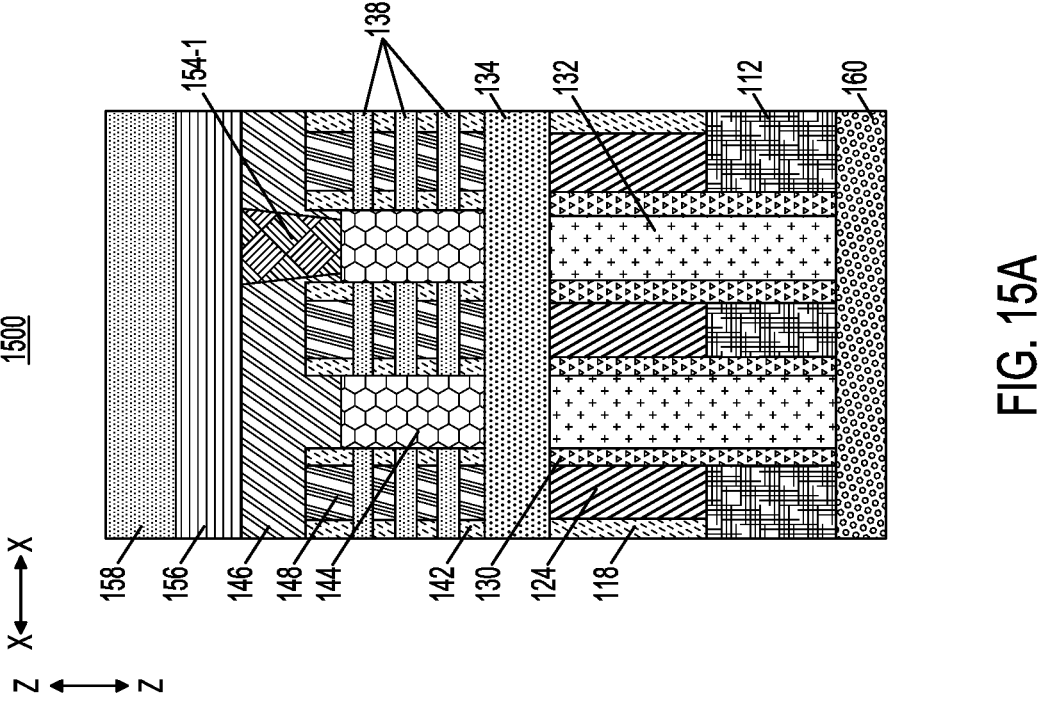
FIG. 15B depicts a second cross-sectional view of the structure of FIGS. 14A-14D following the removal of the substrates and the etch stop layer from the backside, and following the formation of the backside interlayer dielectric layer, according to an embodiment of the invention.
Figures 15C, 15D:
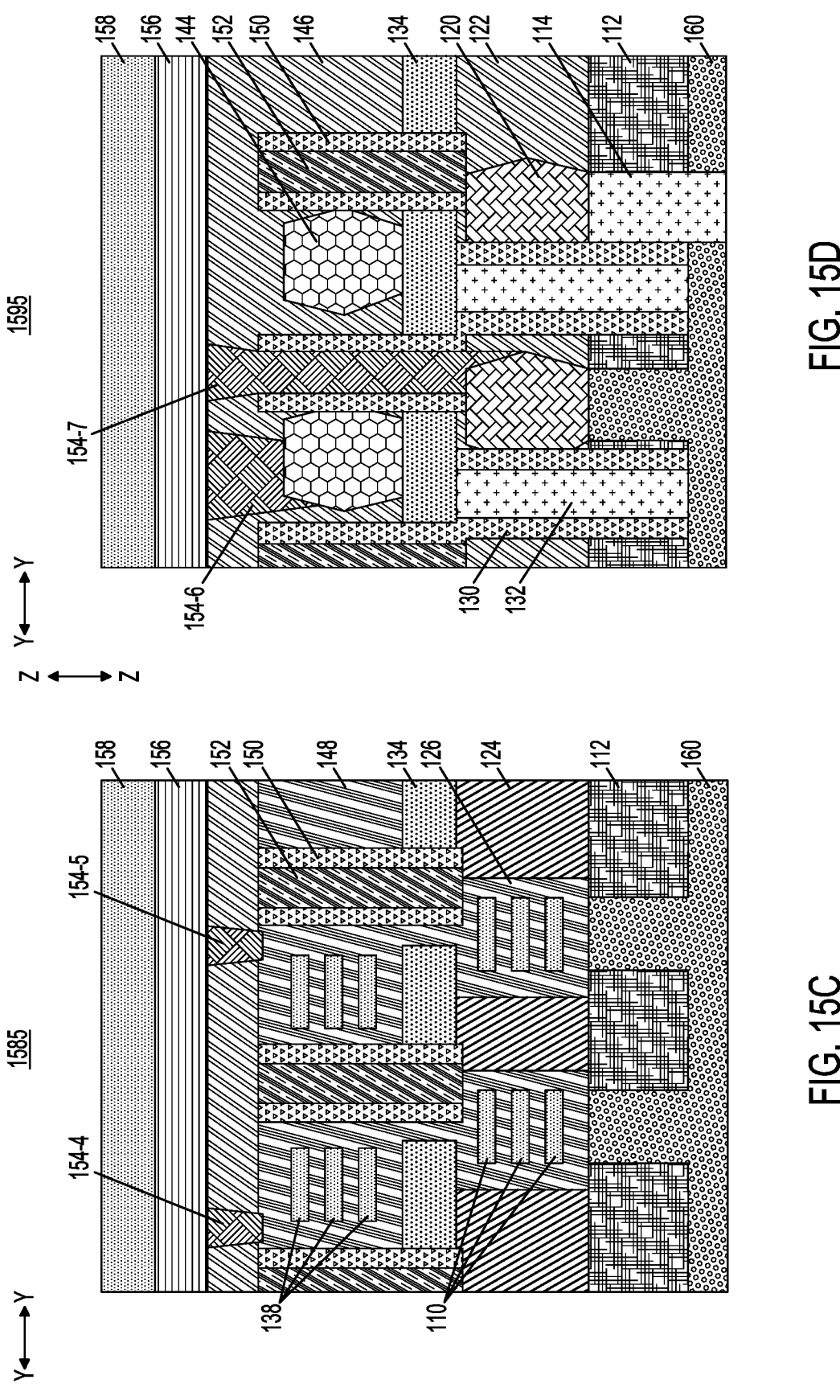
FIG. 15C depicts a third cross-sectional view of the structure of FIGS. 14A-14D following the removal of the substrates and the etch stop layer from the backside, and following the formation of the backside interlayer dielectric layer, according to an embodiment of the invention.
FIG. 15D depicts a fourth cross-sectional view of the structure of FIGS. 14A-14D following the removal of the substrates and the etch stop layer from the backside, and following the formation of the backside interlayer dielectric layer, according to an embodiment of the invention.

FIGS. 15A-15D show different views of the structure of FIGS. 14A-14D following wafer flip, removal of the substrate 102, the etch stop layer 104 and the substrate 106, and following formation of backside ILD layer 160. The cross-sectional view 1500 of FIG. 15A is taken along the line A-A shown in the top-down view 199 of FIG. 1E. The cross-sectional view 1575 of FIG. 15B is taken along the line B-B shown in the top-down view 199 of FIG. 1E. The cross-sectional view 1585 of FIG. 15C is taken along the line C-C shown in the top-down view 199 of FIG. 1E. The cross-sectional view 1595 of FIG. 15D is taken along the line D-D shown in the top-down view 199 of FIG. 1E.

A wafer flip may be performed using the carrier wafer 158, followed by etching to remove the substrate 102, the etch stop layer 104 and the substrate 106. The substrate 102, the etch stop layer 104 and the substrate 106 may be removed using any suitable etch processing. For example, a first RIE may be used to remove the substrate 102 (e.g., formed of Si), a second RIE may be used to remove the etch stop layer 104 (e.g., formed of SiGe), and a third RIE may be used to remove the substrate 106 (e.g., formed of Si). The backside contact placeholder layer 114, which may be formed of SiGe, remains as only the Si of the substrate 106 is removed by the third RIE. Material for the backside ILD layer 160 is then deposited and planarized (e.g., using CMP) to result in the backside ILD layer 160 as shown in FIGS. 15A-15D. The backside ILD layer 160 may be formed of any suitable isolating material, such as SiN, SiO₂, SiC, etc.

Figure 16A:
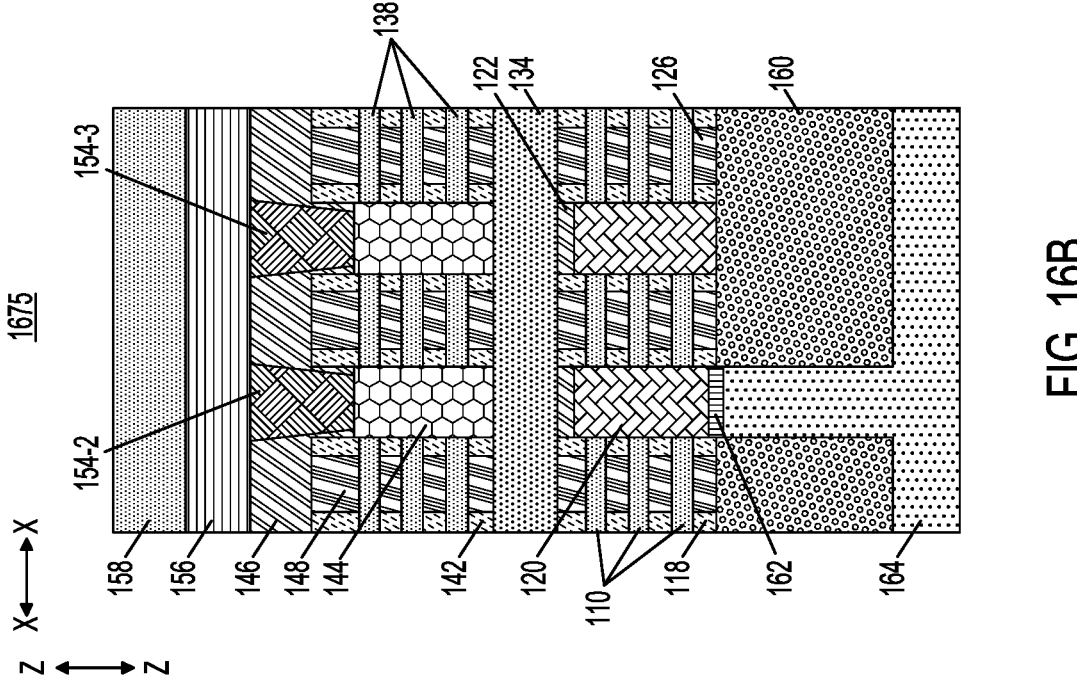
FIG. 16A depicts a first cross-sectional view of the structure of FIGS. 15A-15D following removal of the backside contact placeholder layer and formation of a silicide liner and a backside contact and power plane, according to an embodiment of the invention.
Figure 16B:
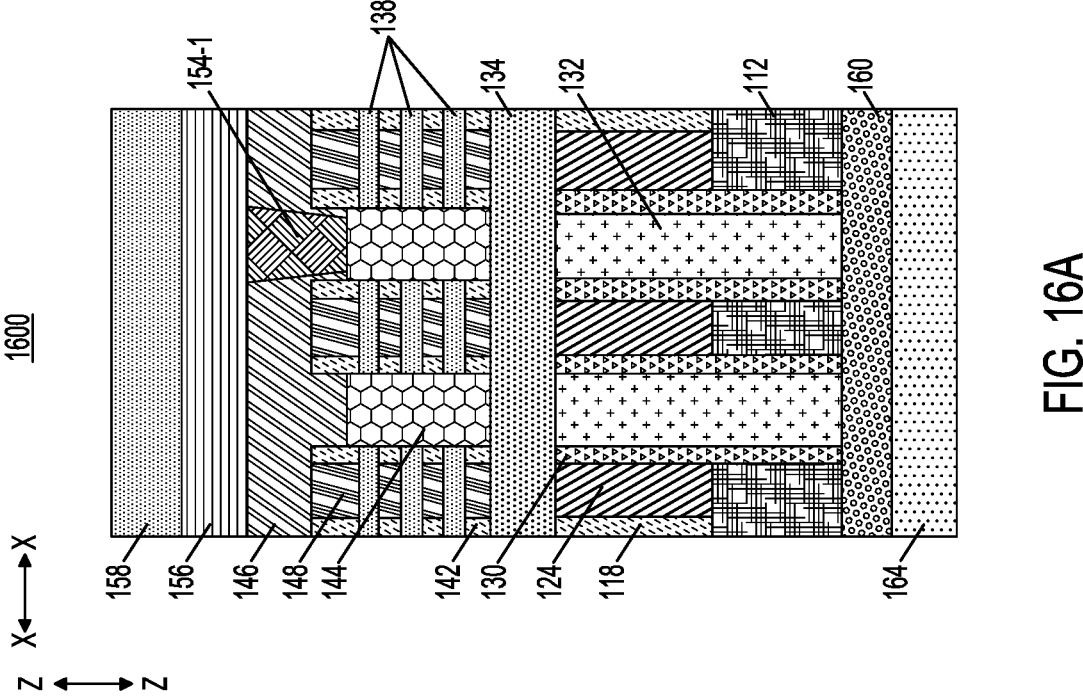
FIG. 16B depicts a second cross-sectional view of the structure of FIGS. 15A-15D following the removal of the backside contact placeholder layer and the formation of the silicide liner and the backside contact and power plane, according to an embodiment of the invention.
Figures 16C, 16D:
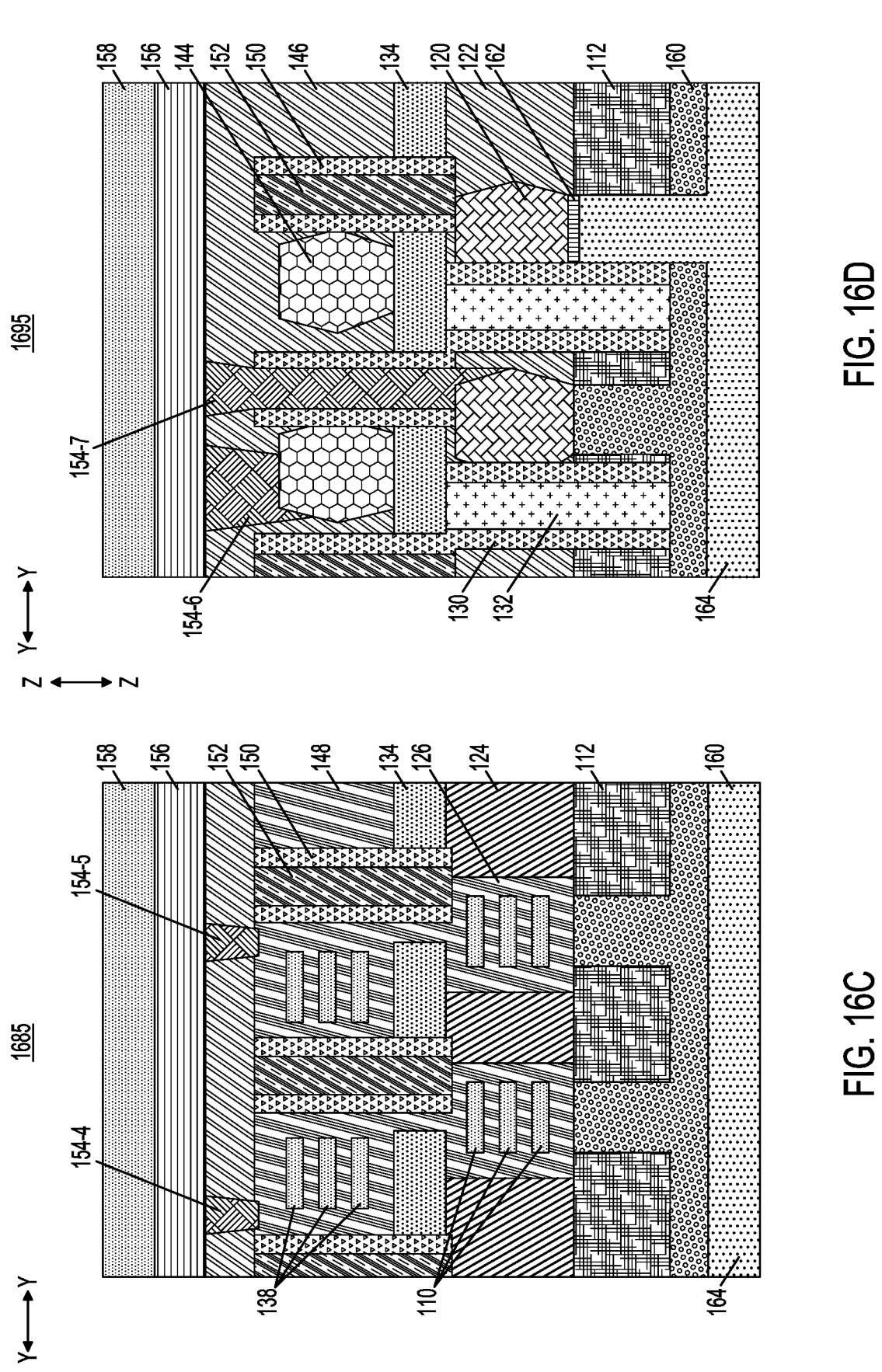
FIG. 16C depicts a third cross-sectional view of the structure of FIGS. 15A-15D following the removal of the backside contact placeholder layer and the formation of the silicide liner and the backside contact and power plane, according to an embodiment of the invention.
FIG. 16D depicts a fourth cross-sectional view of the structure of FIGS. 15A-15D following the removal of the backside contact placeholder layer and the formation of the silicide liner and the backside contact and power plane, according to an embodiment of the invention.

FIGS. 16A-16D show different views of the structure of FIGS. 15A-15D following removal of the backside contact placeholder layer 114 and formation of a silicide liner 162 and a backside contact and power plane 164. The cross-sectional view 1600 of FIG. 16A is taken along the line A-A shown in the top-down view 199 of FIG. 1E. The cross-sectional view 1675 of FIG. 16B is taken along the line B-B shown in the top-down view 199 of FIG. 1E. The cross-sectional view 1685 of FIG. 16C is taken along the line C-C shown in the top-down view 199 of FIG. 1E. The cross-sectional view 1695 of FIG. 16D is taken along the line D-D shown in the top-down view 199 of FIG. 1E.

The backside contact placeholder layer 114 is removed using any suitable etch processing. The silicide liner 162 is then formed (e.g., on the exposed portions of the bottom surface of the source/drain regions 120). The silicide liner 162 may be formed of nickel (Ni), titanium (Ti), a nickel-platinum alloy (NiPt), etc., and may have a height (in direction Z) in the range of 1 to 10 nm. The backside contact and power plane 164 is then patterned and formed as shown. The backside contact and power plane 164 includes a vertical portion providing a backside contact, and a horizontal portion on the backside of the structure providing a backside power plane (e.g., a Vss power plane).

Figure 17B:
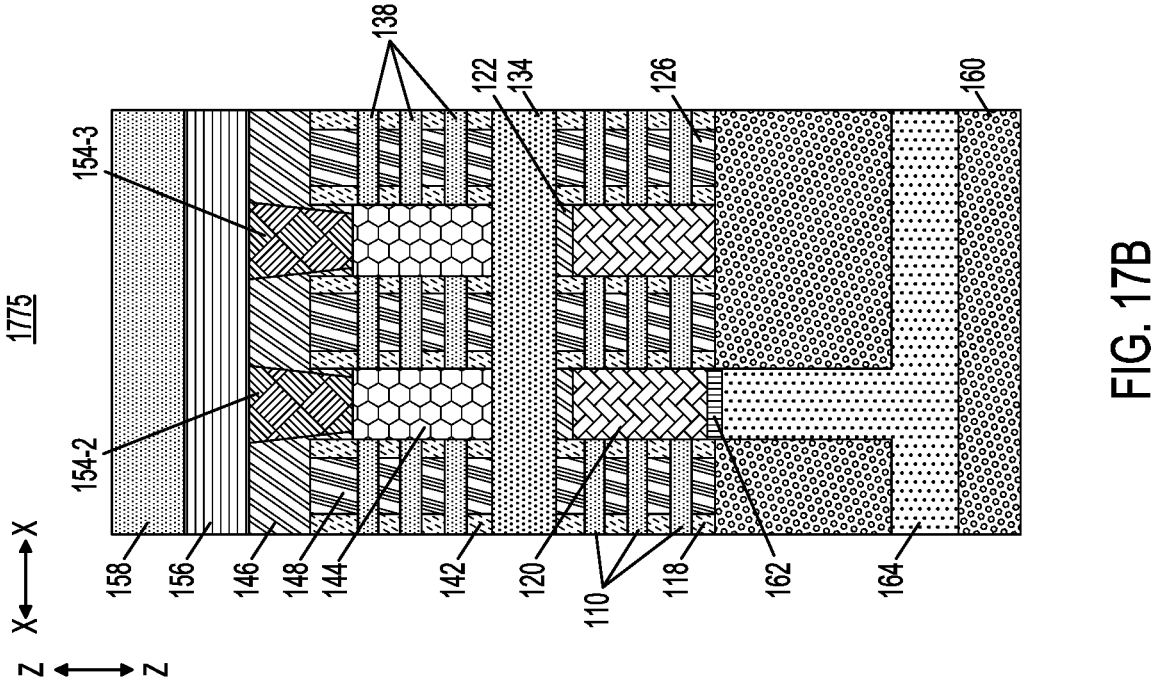
FIG. 17B depicts a second cross-sectional view of the structure of FIGS. 16A-16D following the formation of the additional material for the backside interlayer dielectric layer and following the patterning of the vias through the backside interlayer dielectric layer, according to an embodiment of the invention.
Figure 17A:
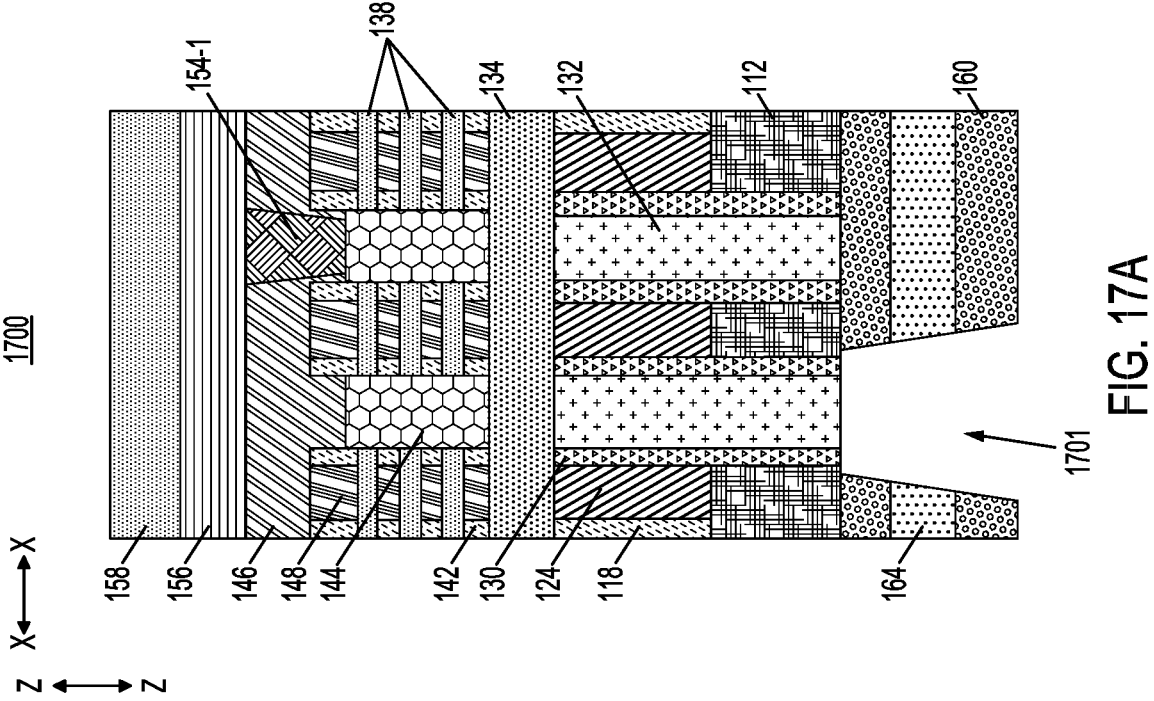
FIG. 17A depicts a first cross-sectional view of the structure of FIGS. 16A-16D following formation of additional material for the backside interlayer dielectric layer and following patterning of vias through the backside interlayer dielectric layer, according to an embodiment of the invention.
Figure 17D:
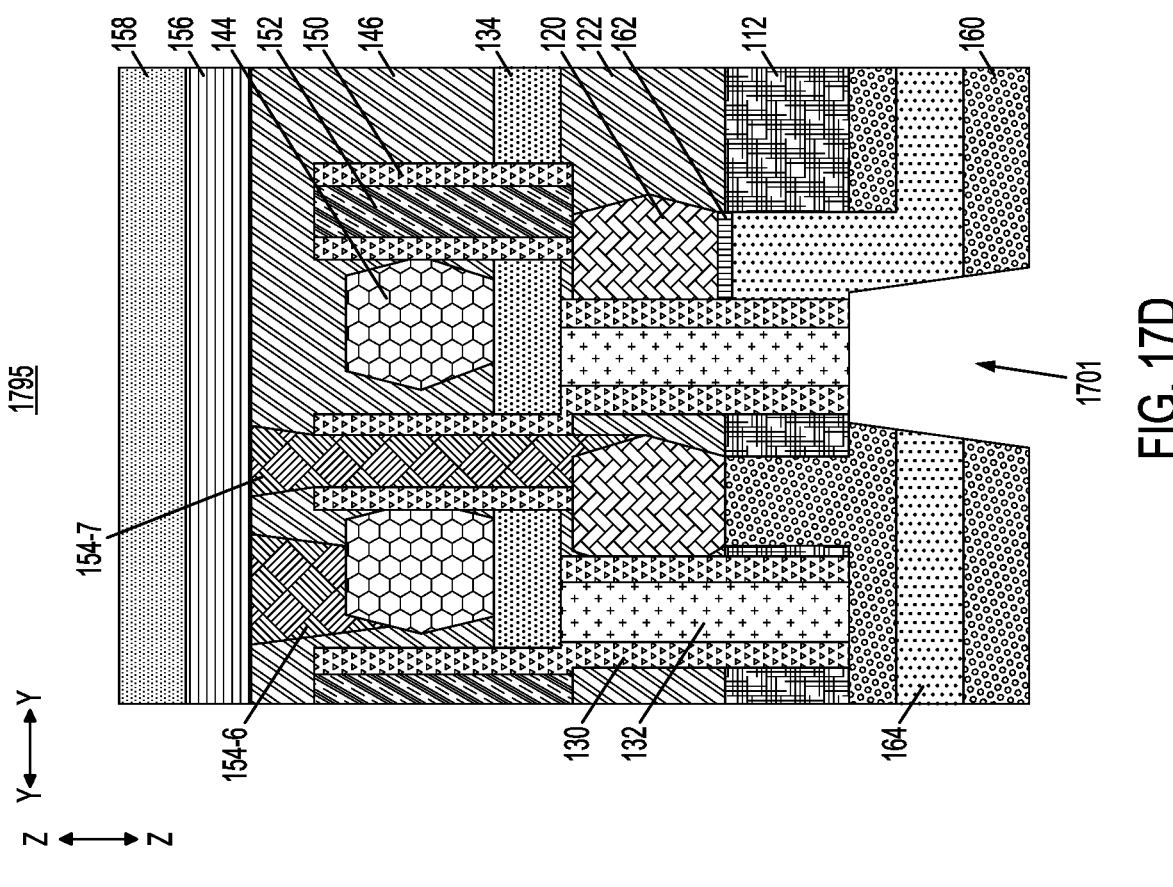
FIG. 17D depicts a fourth cross-sectional view of the structure of FIGS. 16A-16D following the formation of the additional material for the backside interlayer dielectric layer and following the patterning of the vias through the backside interlayer dielectric layer, according to an embodiment of the invention.
Figure 17C:
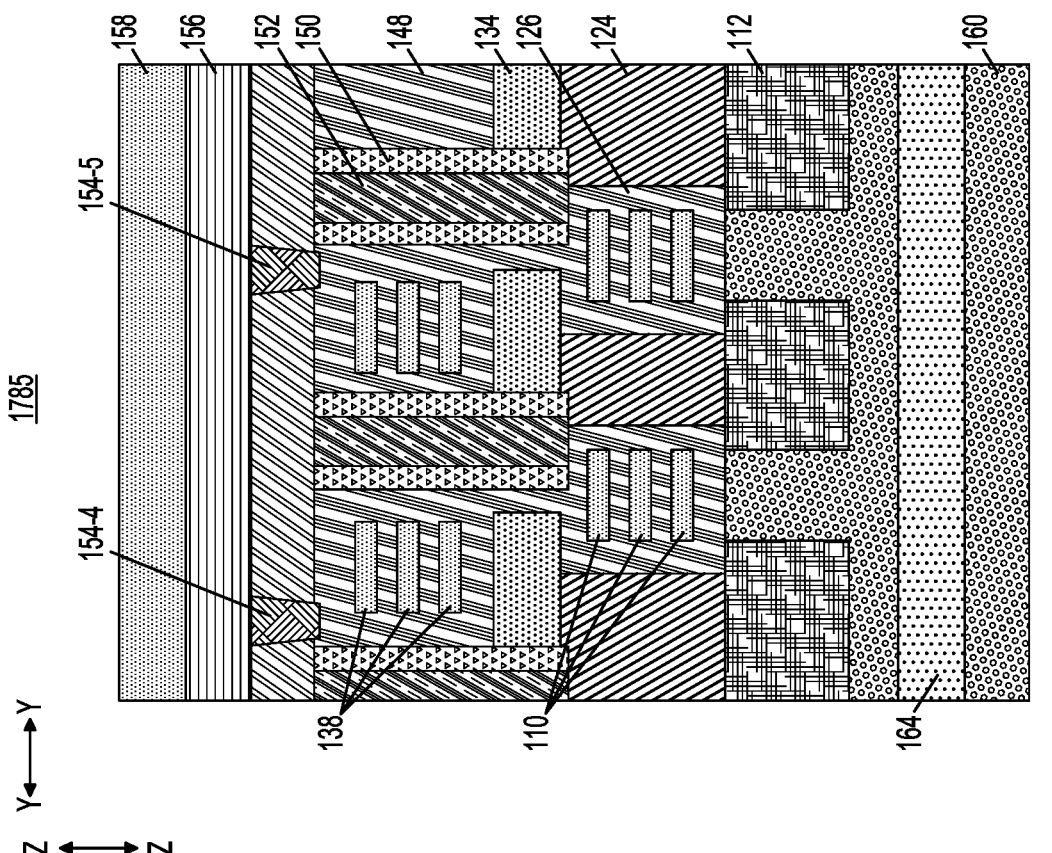
FIG. 17C depicts a third cross-sectional view of the structure of FIGS. 16A-16D following the formation of the additional material for the backside interlayer dielectric layer and following the patterning of the vias through the backside interlayer dielectric layer, according to an embodiment of the invention.

FIGS. 17A-17D show different views of the structure of FIGS. 16A-16D following formation of additional material for the backside ILD layer 160 and following patterning of vias 1701 through the backside ILD layer 160 and the backside contact and power plane 164. The cross-sectional view 1700 of FIG. 17A is taken along the line A-A shown in the top-down view 199 of FIG. 1E. The cross-sectional view 1775 of FIG. 17B is taken along the line B-B shown in the top-down view 199 of FIG. 1E. The cross-sectional view 1785 of FIG. 17C is taken along the line C-C shown in the top-down view 199 of FIG. 1E. The cross-sectional view 1795 of FIG. 17D is taken along the line D-D shown in the top-down view 199 of FIG. 1E.

Additional material for the backside ILD layer 160 may be deposited, followed by formation of the vias 1701 through the backside ILD layer 160 and the backside contact and power plane 164. The vias 1701 expose ones of the backside contact placeholder layers 132.

FIGS. 18A-18D show different views of the structure of FIGS. 17A-17D following formation of inner spacers 166 on sidewalls of the vias 1701, removal of the exposed backside contact placeholder layers 132, and etching through the bonding oxide 134 to expose bottom surfaces of ones of the source/drain regions 144. The cross-sectional view 1800 of FIG. 18A is taken along the line A-A shown in the top-down view 199 of FIG. 1E. The cross-sectional view 1875 of FIG. 18B is taken along the line B-B shown in the top-down view 199 of FIG. 1E. The cross-sectional view 1885 of FIG. 18C is taken along the line C-C shown in the top-down view 199 of FIG. 1E. The cross-sectional view 1895 of FIG. 18D is taken along the line D-D shown in the top-down view 199 of FIG. 1E.

The inner spacers 166 are formed on sidewalls of the vias 1701, such as by conformal deposition and etch-back processing. The inner spacers 166 may be formed of SiN, SiBCN, SiOCN, SiOC, SiC, $AlN_x$, $AlO_x$, etc., and may have a thickness (in direction X) in the range of 4 to 10 nm. The exposed backside contact placeholder layers 132 are then removed using any suitable etch processing, followed by etching (e.g., using RIE) through the exposed portion of the bonding oxide to the bottom surfaces of ones of the source/drain regions 144 as shown, forming vias 1801. The vias 1801 advantageously enable backside contact formation for the source/drain regions 144 of the top transistors of the stacked transistor structure, where the backside contacts are self-aligned to: (1) the backside contacts for the source/drain regions 120 of the bottom transistors of the stacked transistor structure; (2) the source/drain regions 120 of the bottom transistors of the stacked transistor structure; and (3) the gates of the stacked transistor structure. The backside contact for the source/drain regions 144 also advantageously partially wraps around the source/drain regions 144 as illustrated in the cross-sectional view 1895 of FIG. 18D.

FIGS. 19A-19D show different views of the structure of FIGS. 18A-18D following formation of a silicide liner 168 on the exposed bottom surfaces of the source/drain regions 144 of the top transistors of the stacked transistor structure, and following formation of backside contacts 170 to the source/drain regions 144 of the top transistors of the stacked transistor structure. The cross-sectional view 1900 of FIG. 19A is taken along the line A-A shown in the top-down view 199 of FIG. 1E. The cross-sectional view 1975 of FIG. 19B is taken along the line B-B shown in the top-down view 199 of FIG. 1E. The cross-sectional view 1985 of FIG. 19C is taken along the line C-C shown in the top-down view 199 of FIG. 1E. The cross-sectional view 1995 of FIG. 19D is taken along the line D-D shown in the top-down view 199 of FIG. 1E.

The silicide liner 168 may be formed using similar processing and sizing as the silicide liner 162. The silicide liner 168 may be formed of a different silicide material than the silicide liner 162. For example, the silicide liner 162 may be formed of Ti while the silicide liner 168 is formed of NiPt. The backside contacts 170 are then filled in the vias 1801. The backside contacts 170 may be formed of similar materials as the backside contact and power plane 164.

FIGS. 20A-20D show different views of the structure of FIGS. 19A-19D following formation of power rails 172-1 and 172-2 in a backside power delivery network (BSPDN) and formation of backside interconnects 174. The cross-sectional view 2000 of FIG. 20A is taken along the line A-A shown in the top-down view 199 of FIG. 1E. The cross-sectional view 2075 of FIG. 20B is taken along the line B-B shown in the top-down view 199 of FIG. 1E. The cross-sectional view 2085 of FIG. 20C is taken along the line C-C shown in the top-down view 199 of FIG. 1E. The cross-sectional view 2095 of FIG. 20D is taken along the line D-D shown in the top-down view 199 of FIG. 1E.

The BSPDN includes power rails 172-1 and 172-2. The power rails 172-1 are Vdd power rails, and connect to the source/drain regions 144 of the top transistors of the stacked transistor structure. The power rails 172-2 are Vss power rails, and connect to the source/drain regions 120 of the bottom transistors of the stacked transistor structure.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductor (CMOS) transistors, metal-oxide-semiconductor field-effect transistors (MOSFETs), and/ or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 21 shows an example integrated circuit 2100 which includes one or more stacked transistor structures with shifted channels and backside contacts 2110.

In some embodiments, a semiconductor structure, comprises a first transistor comprising a first set of one or more channels, a second transistor vertically stacked over the first transistor, the second transistor comprising a second set of one or more channels, the second set of channels of the second transistor being horizontally offset from the first set of channels of the first transistor, a power plane at a first side of the semiconductor structure, and a contact extending from the first side of the semiconductor structure, through the power plane, to a source/drain region of the second transistor.

The power plane may be disposed in an ILD layer at the first side of the semiconductor structure, the contact extending through the ILD layer. The contact may further extend through STI regions, another ILD layer surrounding source/drain regions for the first transistor, and a bonding oxide disposed between the first transistor and the second transistor.

The semiconductor structure may further comprise a dielectric liner on at least a portion of sidewalls of the contact, the dielectric liner isolating the contact from the power plane.

The contact may at least partially wrap around the source/drain region of the second transistor.

The contact may abut an additional contact to a source/drain region of the first transistor, and the semiconductor structure may further comprise a dielectric liner isolating the contact from the additional contact. The semiconductor structure may further comprise a first silicide liner disposed between the contact and the source/drain region of the second transistor and a second silicide liner disposed between the additional contact and the source/drain region of the first transistor, the second silicide liner comprising a different silicide material than the first silicide liner.

The semiconductor structure may further comprise a gate isolation layer surrounding a gate stack of the first transistor, the gate isolation layer comprising a different dielectric material than a gate spacer for the gate stack of the first transistor and an interlayer dielectric layer surrounding source/drain regions of the first transistor.

In some embodiments, a semiconductor structure comprises a first transistor comprising a first set of one or more channels, a second transistor vertically stacked over the first transistor, the second transistor comprising a second set of one or more channels, the second set of channels of the second transistor being horizontally offset from the first set of channels of the first transistor, a first backside contact to a source/drain region of the first transistor, a second backside contact to a source/drain region of the second transistor, and a dielectric liner separating the second backside contact from the first backside contact and the source/drain region of the first transistor.

The second backside contact may extend through a backside power plane connected to the first backside contact, the source/drain region of the first transistor, an ILD layer surrounding the source/drain region of the first transistor, and a bonding oxide disposed between the first transistor and the second transistor.

The semiconductor structure may further comprise a first silicide liner disposed between the first backside contact and the source/drain region of the first transistor and a second silicide liner disposed between the second backside contact and the source/drain region of the second transistor, the second silicide liner being a different silicide material than the first silicide liner.

The second backside contact may at least partially wrap around the source/drain region of the second transistor.

The semiconductor structure may further comprise a gate isolation layer surrounding a gate stack of the first transistor, the gate isolation layer comprising a different dielectric material than a gate spacer for the gate stack of the first transistor and an interlayer dielectric layer surrounding the source/drain region of the first transistor.

In some embodiments, a stacked transistor structure comprises a first transistor comprising a first set of one or more channels, a second transistor vertically stacked over the first transistor, the second transistor comprising a second set of one or more channels, the second set of channels of the second transistor being horizontally offset from the first set of channels of the first transistor, a first backside contact to a source/drain region of the first transistor, and a second backside contact to a source/drain region of the second transistor, the second backside contact being self-aligned to the first backside contact and the source/drain region of the first transistor.

The second backside contact may be further self-aligned to a gate region shared by the first transistor and the second transistor.

The second backside contact may at least partially wrap around the source/drain region of the second transistor.

The second backside contact may be disposed through a backside ILD layer, a backside power plane connected to the first backside contact disposed in the backside ILD layer, another ILD layer surrounding the source/drain region of the first transistor, and a bonding oxide disposed between the first transistor and the second transistor.

In some embodiments, a complementary field-effect transistor (CFET) structure comprises a CFET cell comprising a first transistor and a second transistor stacked vertically over the first transistor, wherein a first set of one or more channels of the first transistor are horizontally offset, within the CFET cell, from a second set of one or more channels of the second transistor, a first backside contact to a source/drain region of the first transistor, and a second backside contact to a source/drain region of the second transistor, the second backside contact being self-aligned to the first backside contact and the source/drain region of the first transistor.

The second backside contact may further be self-aligned to a gate region shared by the first transistor and the second transistor.

The second backside contact may at least partially wrap around the source/drain region of the second transistor.

The second backside contact may be disposed through a backside ILD layer, a backside power plane connected to the first backside contact disposed in the backside ILD layer, another ILD layer surrounding the source/drain region of the first transistor, and a bonding oxide disposed between the first transistor and the second transistor.

In some embodiments, an integrated circuit comprises a stacked transistor structure comprising a first transistor comprising a first set of one or more channels, a second transistor vertically stacked over the first transistor, the second transistor comprising a second set of one or more channels, the second set of channels of the second transistor being horizontally offset from the first set of channels of the first transistor, a first backside contact to a source/drain region of the first transistor, and a second backside contact to a source/drain region of the second transistor, the second backside contact being self-aligned to the first backside contact and the source/drain region of the first transistor.

The second backside contact may further be self-aligned to a gate region shared by the first transistor and the second transistor.

The second backside contact may at least partially wrap around the source/drain region of the second transistor.

The second backside contact may be disposed through a backside ILD layer, a backside power plane connected to the first backside contact disposed in the backside ILD layer, another ILD layer surrounding the source/drain region of the first transistor, and a bonding oxide disposed between the first transistor and the second transistor.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a first transistor comprising a first set of one or more channels;
   a second transistor vertically stacked over the first transistor, the second transistor comprising a second set of one or more channels, the second set of channels of the second transistor being horizontally offset from the first set of channels of the first transistor;
   a power plane at a first side of the semiconductor structure; and
   a contact extending from the first side of the semiconductor structure, through the power plane, to a source/drain region of the second transistor.

2. The semiconductor structure of claim 1, wherein the power plane is disposed in an interlayer dielectric layer at the first side of the semiconductor structure, the contact extending through the interlayer dielectric layer.

3. The semiconductor structure of claim 2, wherein the contact further extends through shallow trench isolation regions, another interlayer dielectric layer surrounding source/drain regions for the first transistor, and a bonding oxide disposed between the first transistor and the second transistor.

4. The semiconductor structure of claim 1, further comprising a dielectric liner on at least a portion of sidewalls of the contact, the dielectric liner isolating the contact from the power plane.

5. The semiconductor structure of claim 1, wherein the contact at least partially wraps around the source/drain region of the second transistor.

6. The semiconductor structure of claim 1, wherein the contact abuts an additional contact to a source/drain region of the first transistor, and further comprising a dielectric liner isolating the contact from the additional contact.

7. The semiconductor structure of claim 6, further comprising a first silicide liner disposed between the contact and the source/drain region of the second transistor and a second silicide liner disposed between the additional contact and the source/drain region of the first transistor, the second silicide liner comprising a different silicide material than the first silicide liner.

8. The semiconductor structure of claim 1, further comprising a gate isolation layer surrounding a gate stack of the first transistor, the gate isolation layer comprising a different dielectric material than a gate spacer for the gate stack of the first transistor and an interlayer dielectric layer surrounding source/drain regions of the first transistor.

9. A semiconductor structure, comprising:
a first transistor comprising a first set of one or more channels;
a second transistor vertically stacked over the first transistor, the second transistor comprising a second set of one or more channels, the second set of channels of the second transistor being horizontally offset from the first set of channels of the first transistor;
a first backside contact to a source/drain region of the first transistor;
a second backside contact to a source/drain region of the second transistor; and
a dielectric liner separating the second backside contact from the first backside contact and the source/drain region of the first transistor.

10. The semiconductor structure of claim 9, wherein the second backside contact extends through a backside power plane connected to the first backside contact, the source/drain region of the first transistor, an interlayer dielectric layer surrounding the source/drain region of the first transistor, and a bonding oxide disposed between the first transistor and the second transistor.

11. The semiconductor structure of claim 9, further comprising a first silicide liner disposed between the first backside contact and the source/drain region of the first transistor and a second silicide liner disposed between the second backside contact and the source/drain region of the second transistor, the second silicide liner being a different silicide material than the first silicide liner.

12. The semiconductor structure of claim 9, wherein the second backside contact at least partially wraps around the source/drain region of the second transistor.

13. The semiconductor structure of claim 9, further comprising a gate isolation layer surrounding a gate stack of the first transistor, the gate isolation layer comprising a different dielectric material than a gate spacer for the gate stack of the first transistor and an interlayer dielectric layer surrounding the source/drain region of the first transistor.

14. A stacked transistor structure comprising:
a first transistor comprising a first set of one or more channels;
a second transistor vertically stacked over the first transistor, the second transistor comprising a second set of one or more channels, the second set of channels of the second transistor being horizontally offset from the first set of channels of the first transistor;
a first backside contact to a source/drain region of the first transistor; and
a second backside contact to a source/drain region of the second transistor, the second backside contact being self-aligned to the first backside contact and the source/drain region of the first transistor.

15. The stacked transistor structure of claim 14, wherein the second backside contact is further self-aligned to a gate region shared by the first transistor and the second transistor.

16. The stacked transistor structure of claim 14, wherein the second backside contact at least partially wraps around the source/drain region of the second transistor.

17. The stacked transistor structure of claim 14, wherein the second backside contact is disposed through a backside interlayer dielectric layer, a backside power plane connected to the first backside contact disposed in the backside interlayer dielectric layer, another interlayer dielectric layer surrounding the source/drain region of the first transistor, and a bonding oxide disposed between the first transistor and the second transistor.

18. A complementary field-effect transistor structure comprising:
a complementary field-effect transistor cell comprising a first transistor and a second transistor stacked vertically over the first transistor, wherein a first set of one or more channels of the first transistor are horizontally offset, within the complementary field-effect transistor cell, from a second set of one or more channels of the second transistor;
a first backside contact to a source/drain region of the first transistor; and
a second backside contact to a source/drain region of the second transistor, the second backside contact being self-aligned to the first backside contact and the source/drain region of the first transistor.

19. The complementary field-effect transistor structure of claim 18, wherein the second backside contact is further self-aligned to a gate region shared by the first transistor and the second transistor.

20. The complementary field-effect transistor structure of claim 18, wherein the second backside contact at least partially wraps around the source/drain region of the second transistor.

21. The complementary field-effect transistor structure of claim 18, wherein the second backside contact is disposed through a backside interlayer dielectric layer, a backside power plane connected to the first backside contact disposed in the backside interlayer dielectric layer, another interlayer dielectric layer surrounding the source/drain region of the first transistor, and a bonding oxide disposed between the first transistor and the second transistor.

22. An integrated circuit comprising:
a stacked transistor structure comprising:
a first transistor comprising a first set of one or more channels;
a second transistor vertically stacked over the first transistor, the second transistor comprising a second set of one or more channels, the second set of channels of the second transistor being horizontally offset from the first set of channels of the first transistor;
a first backside contact to a source/drain region of the first transistor; and
a second backside contact to a source/drain region of the second transistor, the second backside contact being self-aligned to the first backside contact and the source/drain region of the first transistor.

23. The integrated circuit of claim 22, wherein the second backside contact is further self-aligned to a gate region shared by the first transistor and the second transistor.

24. The integrated circuit of claim 22, wherein the second backside contact at least partially wraps around the source/drain region of the second transistor.

25. The integrated circuit of claim 22, wherein the second backside contact is disposed through a backside interlayer dielectric layer, a backside power plane connected to the first backside contact disposed in the backside interlayer dielectric layer, another interlayer dielectric layer surrounding the source/drain region of the first transistor, and a bonding oxide disposed between the first transistor and the second transistor.

* * * * *